(12) United States Patent
Hoshino et al.

(10) Patent No.: US 7,906,846 B2
(45) Date of Patent: Mar. 15, 2011

(54) SEMICONDUCTOR DEVICE FOR IMPLEMENTING SIGNAL TRANSMISSION AND/OR POWER SUPPLY BY MEANS OF THE INDUCTION OF A COIL

(75) Inventors: Shigeki Hoshino, Minato-ku (JP); Michinobu Tanioka, Minato-ku (JP); Toru Taura, Minato-ku (JP)

(73) Assignee: NEC Corporation, Tokyo (JP)

( * ) Notice: Subject to any disclaimer, the term of this patent is extended or adjusted under 35 U.S.C. 154(b) by 478 days.

(21) Appl. No.: 12/065,427

(22) PCT Filed: May 31, 2006

(86) PCT No.: PCT/JP2006/310928
§ 371 (c)(1),
(2), (4) Date: Feb. 29, 2008

(87) PCT Pub. No.: WO2007/029384
PCT Pub. Date: Mar. 15, 2007

(65) Prior Publication Data
US 2009/0278246 A1    Nov. 12, 2009

(30) Foreign Application Priority Data
Sep. 6, 2005 (JP) .............................. 2005-257322

(51) Int. Cl.
H01L 23/34 (2006.01)
(52) U.S. Cl. .. 257/724; 257/723; 257/725; 257/E23.079
(58) Field of Classification Search ............. 257/723, 257/724, 725, E23.079
See application file for complete search history.

(56) References Cited

U.S. PATENT DOCUMENTS

| 6,081,030 A | 6/2000 | Jaouen et al. |
| 6,104,632 A * | 8/2000 | Nishimura .................... 365/158 |
| 2008/0234144 A1* | 9/2008 | Ho et al. ......................... 506/39 |

FOREIGN PATENT DOCUMENTS

| JP | 62-145760 A | 6/1987 |
| JP | 5-183019 A | 7/1993 |
| JP | 5-243495 A | 9/1993 |
| JP | 8-236696 A | 9/1996 |
| JP | 8-241961 A | 9/1996 |

(Continued)

OTHER PUBLICATIONS

4 Gbps High-Density AC Coupled Interconnection Stephen Mick, John Wilson, Paul Franzon. Department of Electrical and Computer Engineering North Carolina State University, Raleigh, NC.

(Continued)

*Primary Examiner* — Ngan Ngo
(74) *Attorney, Agent, or Firm* — Sughrue Mion, PLLC

(57) ABSTRACT

A plurality of LSI chips (1) are stacked on an interposer (2). Signal coils (1b) for signal transmission are formed on the circuit formation surfaces of LSI chips (1) that are formed using silicon substrates (1a). The signal coils (1b) connect to circuits formed in the LAI chips (1). Through-holes (1d) are formed in the centers of the signal coils (1b) of the silicon substrate (1a). Signal coils (2c) connected to solder balls (5) by way of through-conductors (2d) are formed on the interposer (2). Magnetic pins (3) that are composed of a magnetic material are inserted in the centers of the signal coils (1b and 2c).

19 Claims, 54 Drawing Sheets

FOREIGN PATENT DOCUMENTS

| | | |
|---|---|---|
| JP | 11-154726 A | 6/1999 |
| JP | 2002-305282 A | 10/2002 |
| JP | 2002-314040 A | 10/2002 |
| JP | 2003-46057 A | 2/2003 |
| JP | 2004-22906 A | 1/2004 |
| JP | 2004-228598 A | 8/2004 |
| JP | 2004-327474 A | 11/2004 |
| JP | 2004-356119 A | 12/2004 |

OTHER PUBLICATIONS 7.6. A 1.2Gb/s/pin Wireless Superconnect Based on Inductive Inter-Chip Signaling (IIS) Daisuke Mizoguchi, et al. Keio University.

* cited by examiner

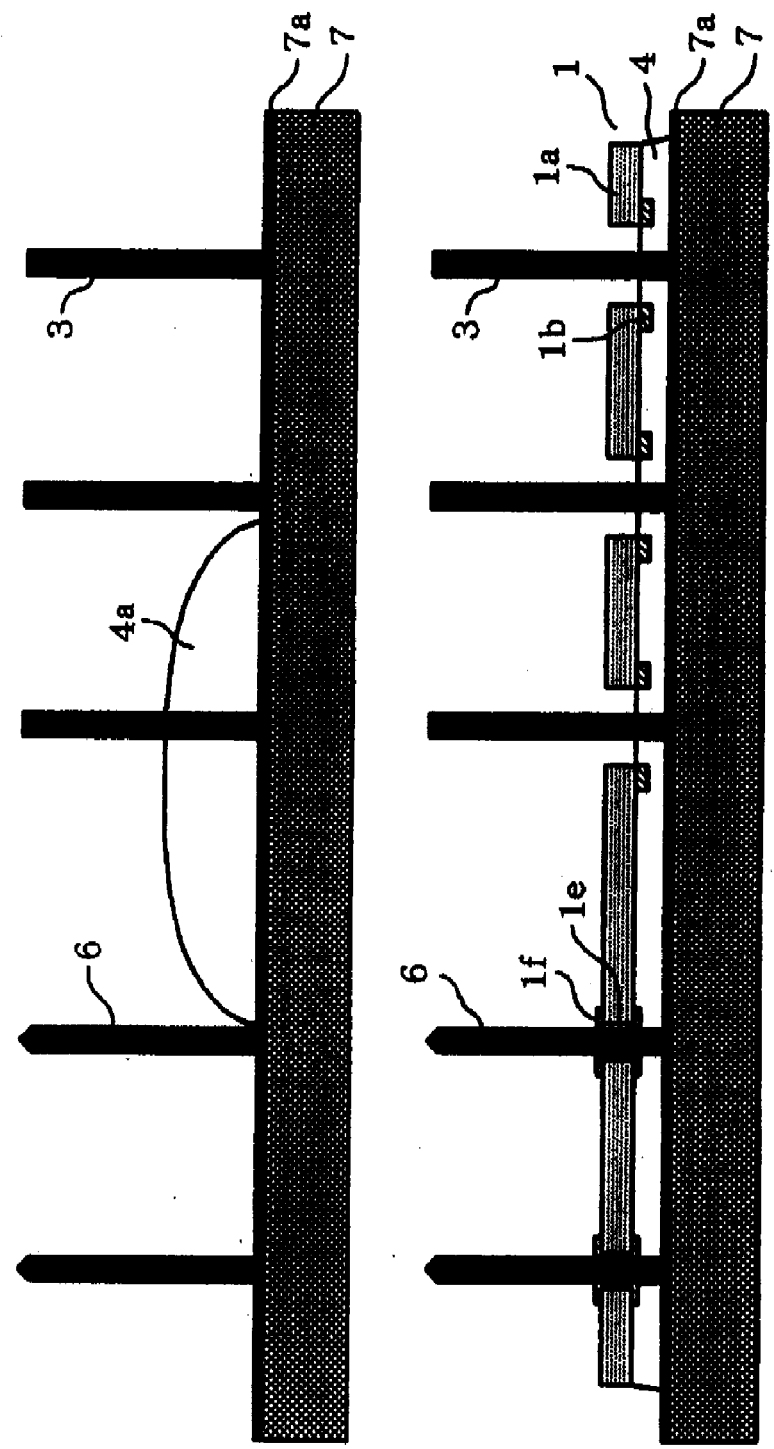
Fgi. 14B

SEMICONDUCTOR DEVICE FOR IMPLEMENTING SIGNAL TRANSMISSION AND/OR POWER SUPPLY BY MEANS OF THE INDUCTION OF A COIL

TECHNICAL FIELD

The present invention relates to a semiconductor device realized by stacking LSI chips, and more particularly, to a semiconductor device for implementing signal transmission and/or power supply by means of the induction of a coil (inductance).

BACKGROUND ART

Current integrated circuits are chiefly fabricated by planar techniques and the degree of circuit integration that can be achieved on an individual semiconductor chip is reaching saturation. In recent years, a plurality of layers of semiconductor chips are being integrated in a vertical direction in the interest of raising integration efficiency, i.e., semiconductor chips are being stacked one above another and then electrically connected.

In the case of circuits that are integrated vertically, each three-dimensional circuit structure is made up from a stacked unit of individual chip layers (typically joined by layers for adhesive bonding) that have been independently processed and fabricated. To improve the electrical characteristics of connectors in the vertical direction and raise connection density, each individual chip layer is usually produced as a thin film to be of a suitable thickness before assembly.

For example, as the connection construction of circuits that are integrated in the vertical direction, configurations for direct connections between each chip layer are known from publications such as JP-A-2002-305282 (hereinbelow referred to as the "first example of the related art"). FIG. 1 shows a sectional view of a semiconductor device disclosed in the first example of the related art.

As shown in FIG. 1, in this first example of the related art, aluminum pads 103 are provided on semiconductor elements 101 having circuit surfaces 102, and via-holes 110 are provided that pass through these parts. The inner wall surfaces of via-holes 110 are covered by conductive film 112, and gold bumps 104 are arranged on aluminum pads 103. Connections are achieved between semiconductor elements by placing gold bumps 104 of a particular semiconductor element in contact with via-holes 110 on the reverse surface of another semiconductor element.

When a multiplicity of micro-electrodes are connected together in this construction, positioning must be carried out with extreme accuracy at the time of producing the stacked configuration to enable connections at each electrode simultaneously. In addition, problems are encountered that reduce yield such as the difficulty of direct connections caused by the occurrence of a large degree of warping in chips due to thinning or the occurrence of connection defects between electrodes at the time of assembly in this construction. Accordingly, such a construction suffers from the serious drawback of increased fabrication costs due to the reduction of yield and the need for high-accuracy positioning devices.

A non-contact signal transmission method is one method of ameliorating this drawback, an example being disclosed in, for example, JP-A-H08-236696 (hereinbelow referred to as the "second example of the related art"). FIG. 2 shows the configuration of the stacked semiconductor device disclosed in the second example of the related art.

As shown in FIG. 2, transmitter S, and transmission coil SPS connected to this transmitter S are provided on chip layer Ln. Receiver E and reception coil SPE connected to this receiver E are provided on chip layer Ln+x. Transmission coil SPS and reception coil SPE are linked by coupling inductance M. Each chip layer is supplied by power supply devices VSS and VDD. When voltage U1 is received as input from the input side of transmitter S in this semiconductor device, voltage U2 is supplied from the output side, this voltage U2 being applied as input to transmission coil SPS. Voltage U3 is thus induced on the output side of reception coil SPE and voltage U4 is supplied from the output side of receiver E.

In this configuration, a coil is provided that is connected to circuits within one chip layer, another coil is provided connected to the circuits within the other chip layer, and the electromagnetic coupling between the two coils relaxes the conditions regarding positioning (adjustment) between chip layers and the degree of flatness of the surfaces of each of the chip layers compared to the first example of the related art shown in FIG. 1.

DISCLOSURE OF THE INVENTION

When forming signal connection paths in the vertical direction between each of the chip layers in the second example of the related art, coils must be placed in proximity in a limited region to form signal transmission paths when implementing transmission for a multiplicity of signals, and such a configuration has the drawback of an increased potential for reduced signal quality due to the occurrence of interference between coils or considerable influence upon adjacent coils.

Although signal transmission is realized without contact in the second example of the related art, direct-connection power supply paths must be provided for power supply that are of a configuration entirely distinct from that of the signal transmission paths and these supply paths therefore necessitate wire bonding or the use of the method of the first example of the related art. A configuration for supplying power to each LSI chip by means of wire bonding connections requires space on each LSI chip for arranging wires. This configuration therefore entails the problems of not only compelling an increase of the surface area of each LSI chip but of reducing yield due to the difficulties of stacking LSI chips, as well as the problem of the increased thickness of the entire semiconductor device when stacked.

In addition, when a form is adopted for supplying power by the first example of the related art, problems occur when making contact with the above-described micro-electrodes.

In response to these problems, the present invention has a first object of providing a semiconductor device that, in an inter-LSI mutual signal transmission mode in which signal transmission is realized by coils between a plurality of LSI chips, can prevent decrease in the signal transmission efficiency between LSI chips that results from the divergence of mutual coil positions and can prevent reductions of signal transmission quality that result from increase in noise leakage between signal transmission paths when attempting higher density.

The present invention further has a second object of enabling a non-contacting mode of supplying power to LSI chips, and further, has a third object of providing a semiconductor device that enables signal transmission paths and power supply paths by similar means to achieve both a simplification of configuration and a reduction of fabrication costs.

According to the semiconductor device according to the present invention for achieving the above-described objects, a semiconductor device in which a plurality of LSI chips are stacked and in which the transmission of signals between LSI chips is realized by way of coils, through-holes are formed that pass through the LSI chips inside the coils of the LSI chips, and magnetic pins that contain a magnetic material are inserted into these through-holes.

Another semiconductor device according to the present invention is a semiconductor device in which one or a plurality of stacked LSI chips are mounted on an interposer on which magnetic pins that contain a magnetic material are established perpendicular to the surface and on which coils are formed on the surface around these magnetic pins; and on at least one LSI chip, coils are formed that are electromagnetically coupled with the coils that are formed on the interposer; wherein: in the centers of the coils of the LSI chip, through-holes are formed that pass through this LSI chip; and the magnetic pins are inserted in these through-holes.

In addition, in the semiconductor device of the present invention that is of the above-described configuration, signals are exchanged between the coils of stacked LSI chips or between the coil of an LSI chip and the coil on the interposer. In addition, in the semiconductor device of the present invention, power is supplied from the coil on the interposer to circuits formed on LSI chips by way of coils formed on the LSI chips.

In addition, another semiconductor device according to the present invention is a semiconductor device in which one or a plurality of stacked LSI chips are mounted on an interposer in which coils are formed on the surface, and in which coils that are electromagnetically coupled to the coils formed on the interposer are formed on LSI chips, wherein power is supplied from the coils formed on the interposer to circuits formed on the LSI chips by way of coils formed on the LSI chips.

As described hereinabove, the insertion of magnetic pins into the coils of each LSI chip in the present invention enables an improvement of the signal efficiency between coils for which signal transmission is desired and a reduction of signal leakage to other coils for which signal transmission is not desired. In addition, the supply of power to each LSI chip can be achieved by way of coils. The use of coils to implement non-contact signal/power transmission eliminates the need for the high-accuracy conditions in pattern formation when fabricating LSI chips and in positioning when stacking the LSI chips, and moreover, allows a mitigation of the demand for flatness of LSI chip surfaces and enables a reduction of LSI chip fabrication costs and assembly costs.

In the present invention, "power supply lines" also refers to grounding lines.

BRIEF DESCRIPTION OF THE DRAWINGS

FIG. 14B is a sectional view showing the fabrication method of working example 1;

BEST MODE FOR CARRYING OUT THE INVENTION

Explanation next regards the details of embodiments of the present invention with reference to the accompanying figures.

Figure 1:
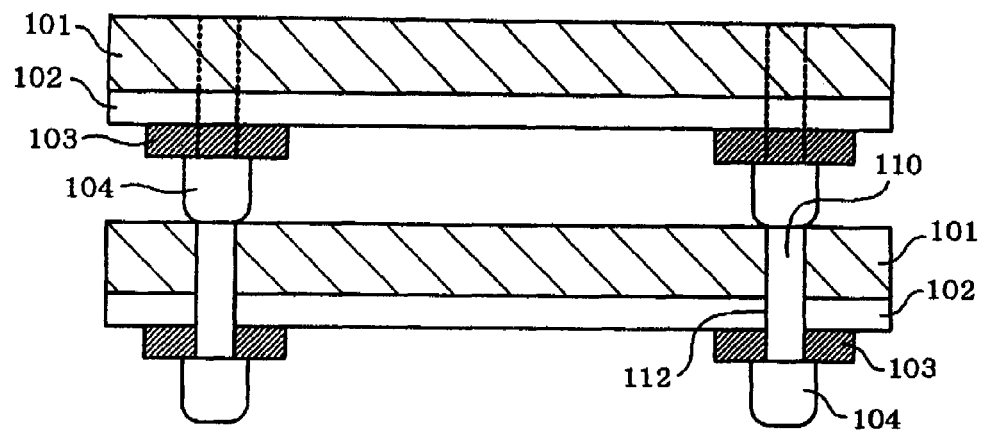
FIG. 1 is a sectional view showing the first example of the related art.
Figure 2:
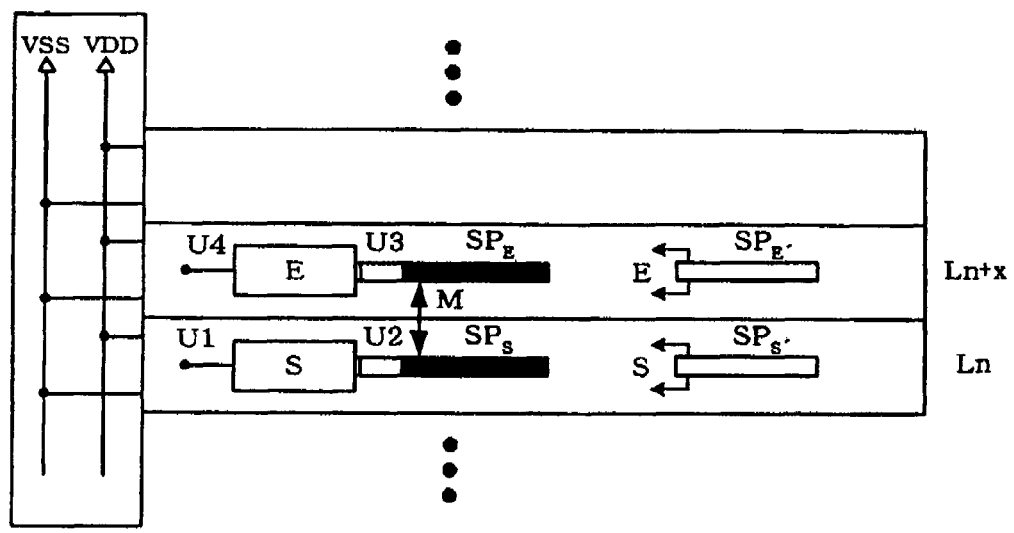
FIG. 2 is a schematic view showing the stacked form of a plurality of chips of the second example of the related art.
Figure 3:
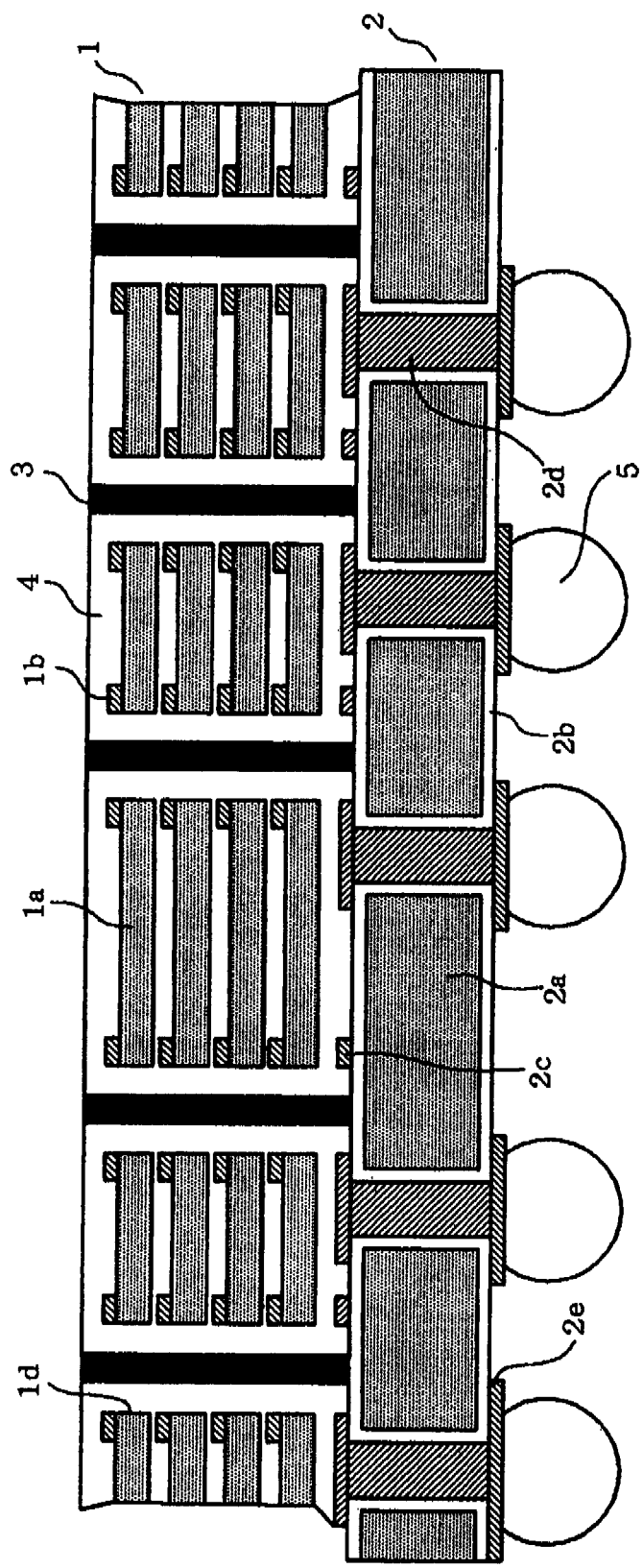
FIG. 3 is a schematic sectional view showing the first embodiment.
Figure 4A:
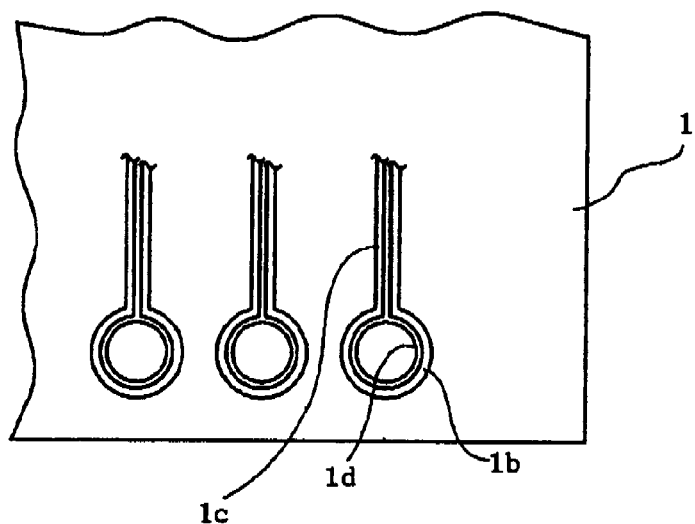
FIG. 4A is a schematic plan view showing coil units of the LSI chip surface and interposer surface of the first embodiment.
Figure 4B:
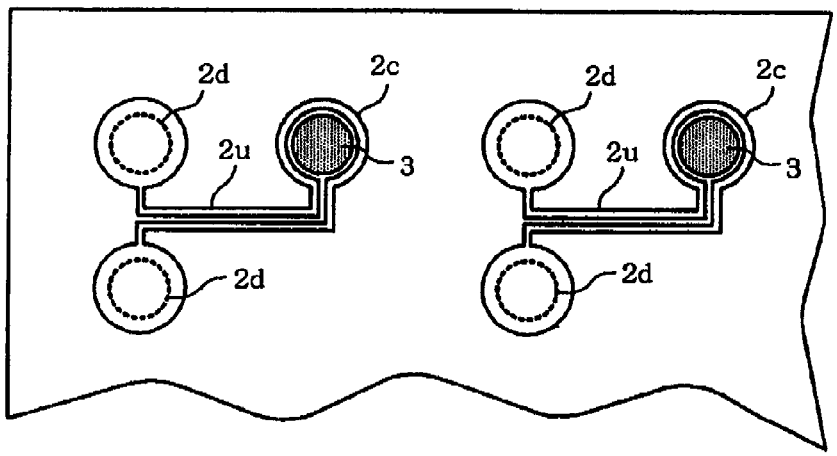
FIG. 4B is a schematic plan view showing coil units of the LSI chip surface and interposer surface of the first embodiment.
Figure 4C:
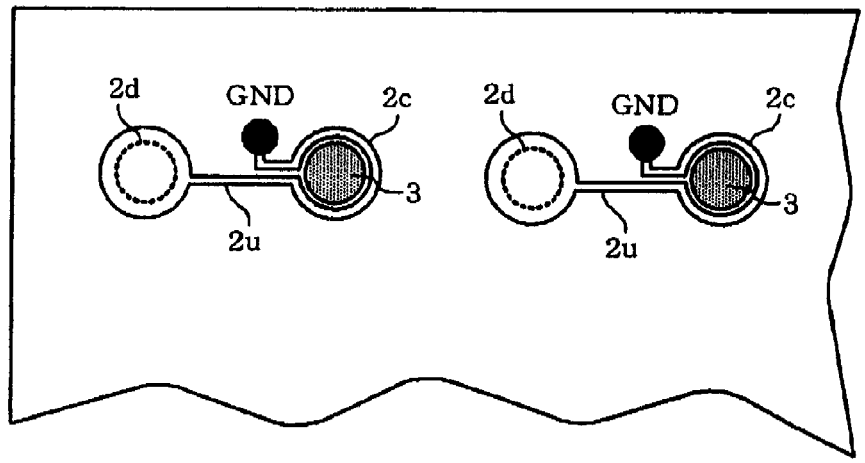
FIG. 4C is a schematic plan view showing the coil units of the LSI chip surface and interposer surface of the first embodiment.

FIG. 3 is a schematic sectional view showing the semiconductor device that represents the first embodiment, FIG. 4A is a schematic plan view showing the area in the vicinity of a coil formed in the signal input/output portion of each LSI chip, and FIGS. 4B and 4C are schematic plan views showing the areas in the vicinities of coils of the interposer.

LSI (Large-Scale Integration) chip 1 is formed using silicon substrates 1a with signal coils 1b used for signal transmission formed in the circuit formation surface of the chip. Signal coil 1b is electrically connected to circuits formed within LSI chip 1 by way of lead-out interconnects 1c (see FIG. 4A). Through-hole 1d is formed in the center of each signal coil 1b of silicon substrate 1a.

Interposer 2 is formed using substrate 2a that is composed of, for example, silicon, and the reverse and obverse surfaces of substrate 2a and the inner wall surfaces of through-holes are covered by insulating film 2b. Signal coils 2c for signal transmission with LSI chips 1 that are stacked above are formed on insulating film 2b of the obverse side of the substrate, and these signal coils 2c extend to through-holes of the substrate by way of lead-out interconnects 2u (see FIG. 4B) and are connected to electrode pads 2e formed on the reverse surface of the substrate by way of through-conductors 2d that fill the through-holes. Solder balls 5 that serve as the outside connection terminals are formed on the lower surface of electrode pads 2e. In these interconnects, the interconnect length between a coil and a through-conductor is preferably made as short as possible to decrease loss caused by the interconnect length and the interconnect width is preferably increased to decrease impedance.

A plurality (four in the example shown in the figure) of LSI chips 1 are stacked on interposer 2, and magnetic pins 3 composed of a magnetic material are inserted in the centers of each of signal coils 1b and 2c.

Resin film 4 is then formed between interposer 2 and LSI chip 1, between LSI chips 1, over LSI chip 1 of the uppermost layer, and inside through-holes 1d of the LSI chips 1 to seal the LSI chips with the resin material.

As one example of the configuration of FIG. 3, a stacked model was produced by forming coil interconnects each having a width of 10 µm and an inside diameter of 100 µm on two silicon chip surfaces each having a thickness of 100 µm and on which a SiO2 thin-films having a thickness of 0.2 µm were formed, forming through-holes having an inside diameter of 80 µm within these coil interconnects, and then adhering together the silicon substrates while aligning the through-holes with a distance of 10 µm between each silicon substrate. A model was produced of a configuration in which pins of a magnetic material having relative permeability 20 and relative permittivity 20 were inserted in the through-holes of each chip and in which signals were transmitted between the coil interconnects formed on each substrate surface, and a three-dimensional electromagnetic field analysis was carried out. The result of the analysis showed that when magnetic pins are present in the through-holes within the coil interconnects as in the configuration of the present invention, signal transmission is improved by 15 dB or more and signal leakage between adjacent interconnects is reduced by approximately 5 dB compared with a case in which the magnetic pins are not present (i.e., when only coils are present).

According to the present invention, the positioning between LSI chips is determined by the relative size of through-holes 1d of LSI chips 1 and magnetic pins 3, whereby the positioning accuracy may be lower than for a case of direct connections. On the other hand, inserting magnetic pins in the through-holes enables a reduction of divergence of positions between signal coils compared to a case in which positioning is not effected. Together, the use of magnetic pins improves the signal transmission efficiency in signal transmission between coils and further reduces interference between adjacent coils. In addition, the margin in the distances between coils is greater than in the related art due to the configuration by which magnetic pins are inserted in coils.

The present embodiment shown in FIG. 3 describes a case of one-turn coils, but coils of multiple turns can be used depending on the required performance. In addition, the return interconnects of the coils shown in FIGS. 4A and 4B can be of a different structure, a configuration in which one interconnect is connected to ground also being possible. FIG. 4C shows an example in which one end of the coil in the interposer is grounded. Still further, the same effect can be obtained if the magnetic pins are entirely of a magnetic material of metal or ceramic, or are pins with surfaces covered by a magnetic material.

Although silicon is effectively employed as the material of the interposer in the present invention, an inorganic material such as a ceramic or an organic material such as a resin laminated board can also be used.

Figure 5:
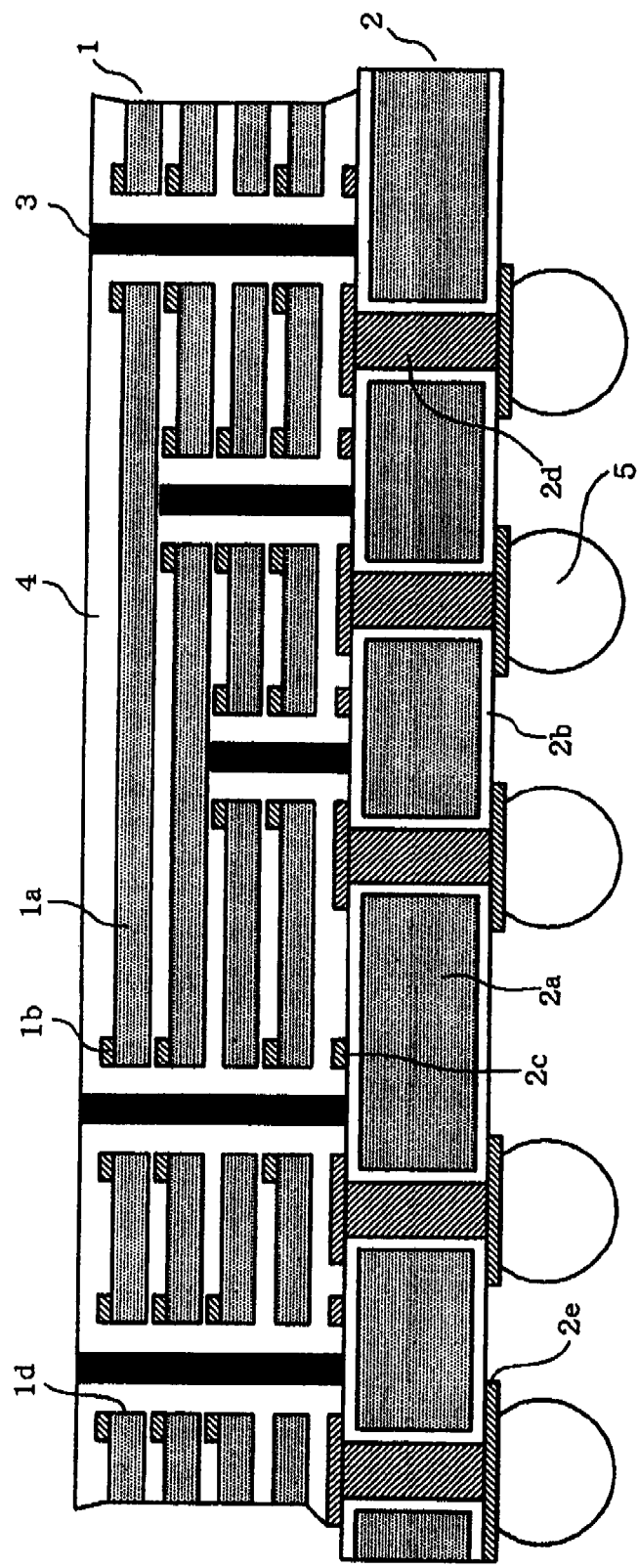
FIG. 5 is a schematic sectional view showing the second embodiment.

FIG. 5 is a schematic sectional view showing the semiconductor device of the second embodiment. In FIG. 5, parts equivalent to those of the first embodiment shown in FIG. 3 are given the same reference numbers. As shown in FIG. 5, in the second embodiment, the configuration in which signal coils $1b$ formed on LSI chip 1 or interposer 2 is substantially identical to the configuration shown in FIG. 3, but magnetic pins 3 are provided on interposer 2 in lengths that correspond only to the parts required for signal transmission. In addition, when there is no need to transmit a particular signal in a chip that is provided with through-holes, providing only through-holes without providing coils in the portion of the LSI chip 1 through which magnetic pin 3 passes enables a limitation of the signal transmission between LSI chips to only intended signals. Adopting this configuration also enables a reduction of the leakage between unintended signals.

Figure 6:
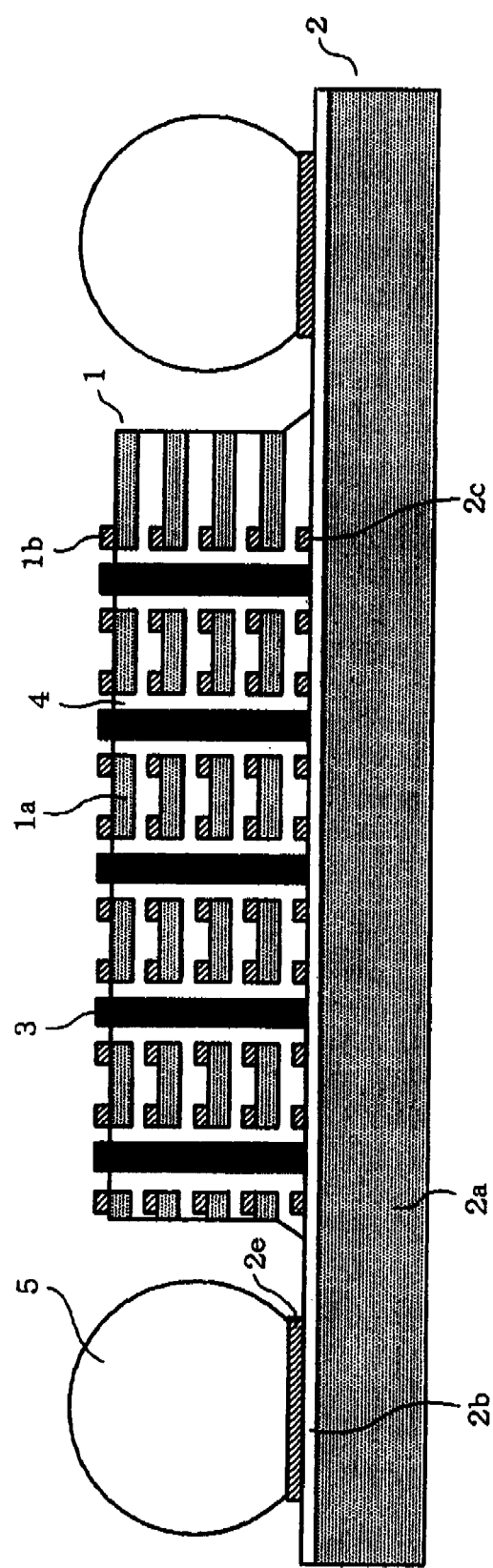
FIG. 6 is a schematic sectional view showing the third embodiment.

FIG. 6 is a schematic sectional view showing the semiconductor device of the third embodiment. In FIG. 6, parts equivalent to the first embodiment shown in FIG. 3 are given the same reference numbers. As shown in FIG. 6, the configuration of LSI chip 1 that has been thinned in the third embodiment is similar to the configuration shown in FIG. 3. In interposer 2 of this embodiment, portions in which magnetic pins 3 are provided are similar to the configuration shown in FIG. 3, but external terminal electrode pads $2e$ are formed on the same surface as the stacked LSI chips and outside the stacked LSI chips, and solder balls 5 are arranged on these electrode pads $2e$. Various methods are possible as the method of stacking each LSI chip; for example, a method in which magnetic pins are progressively inserted in through-holes, or a method in which only a portion of the pins are inserted in through-holes, the LSI chips stacked, and magnetic pins formed on a dummy substrate then inserted from above into the remaining through-holes (wherein the dummy substrate is not necessarily removed).

Figure 7:
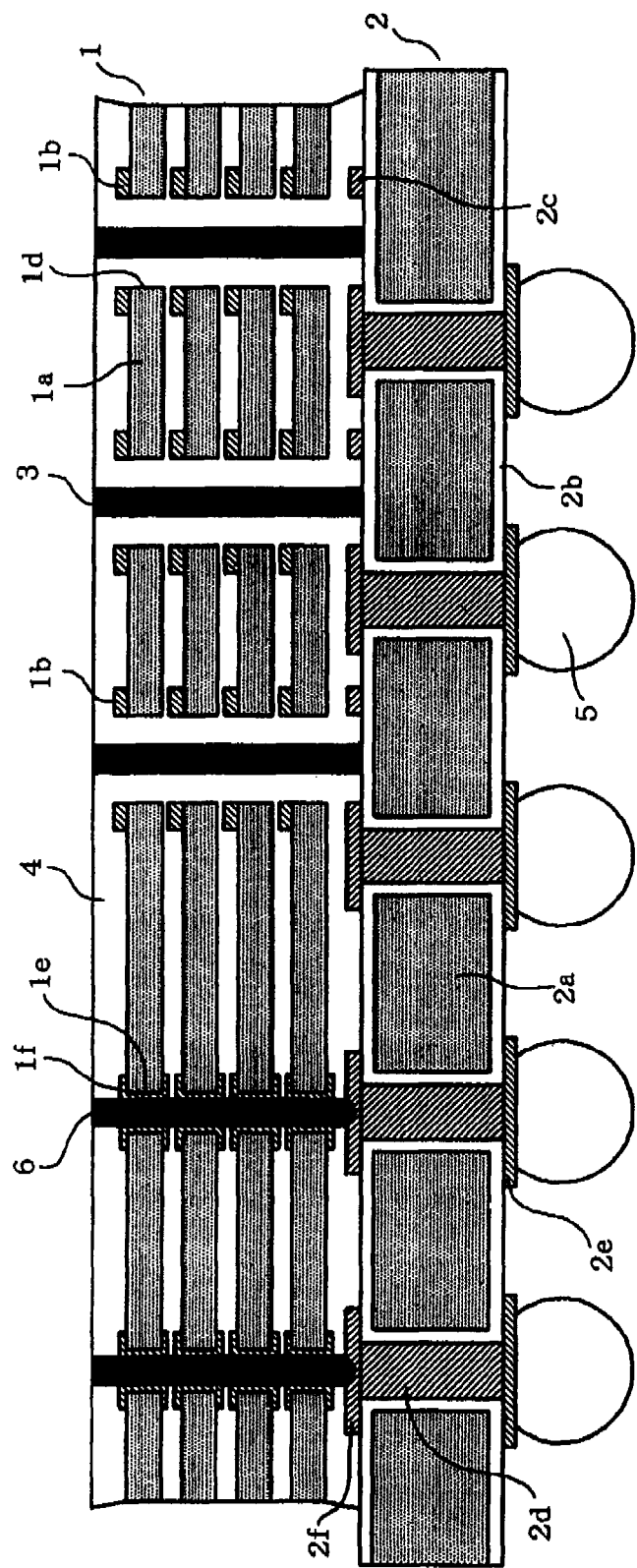
FIG. 7 is a schematic sectional view showing the fourth embodiment.

FIG. 7 is a schematic sectional view showing the semiconductor device of the fourth embodiment. In FIG. 7, parts that are equivalent to the first embodiment shown in FIG. 3 are given the same reference numbers. As shown in FIG. 7, in the fourth embodiment, connection structures relating to power supply and grounding are provided in addition to the signal transmitters of the semiconductor device shown in FIG. 3. In the present embodiment, parts relating to signal transmission are equivalent to the case of the first embodiment shown in FIG. 3.

As shown in FIG. 7, through-holes in which conductive pins 6 are to be inserted that connect to power supply and ground are formed in each LSI chip 1. Wall-surface conductive films $1e$ are formed on the inner wall surfaces of the through-holes into which conductive pins 6 are inserted. In addition, lands $1f$ are formed that are connected to wall-surface conductive film $1e$ around each through-hole of the substrate surface. These lands $1f$ are connected to the power supply lines or ground lines of LSI chip 1, and wall-surface conductive films $1e$ contact conductive pins 6. Conductive pins 6 contact the conductive film formed on through-conductors $2d$ of interposer 2, and these through-conductors $2d$ are connected to solder balls 5 by way of electrode pads $2e$. When magnetic pins 3 are parts having conductivity, conductive pins 6 may be of the same construction as magnetic pins 3, or may be realized by applying a conductive film such as gold plating to magnetic pins 3.

When assembling, conductive pins 6 are first aligned with the through-holes of the power supply and grounds of LSI chips and then inserted into the through-holes for power supply and grounding of the LSI chips to make contact with wall-surface conductive films $1e$. The same steps are repeated to stack the desired number of LSI chips, following which conductive pins 6 are placed in contact with the conductive film on through-conductors $2d$ of interposer 2. Alternatively, in place of this method, a stacking method is also possible in which conductive pins 6 are established in advance at the positions of the power supply and ground electrodes of interposer 2 and the through-holes for the power supply and grounding of the LSI chips then placed over these conductive pins.

The present embodiment eliminates the need for interconnection by way of wire bonding and bumps to LSI chips for the purpose of power supply. In addition, positioning between LSI chips is achieved automatically by means of the conductive pins and magnetic pins, thus eliminating the need for high positioning accuracy at the time of chip fabrication or chip stacking.

Figure 8:
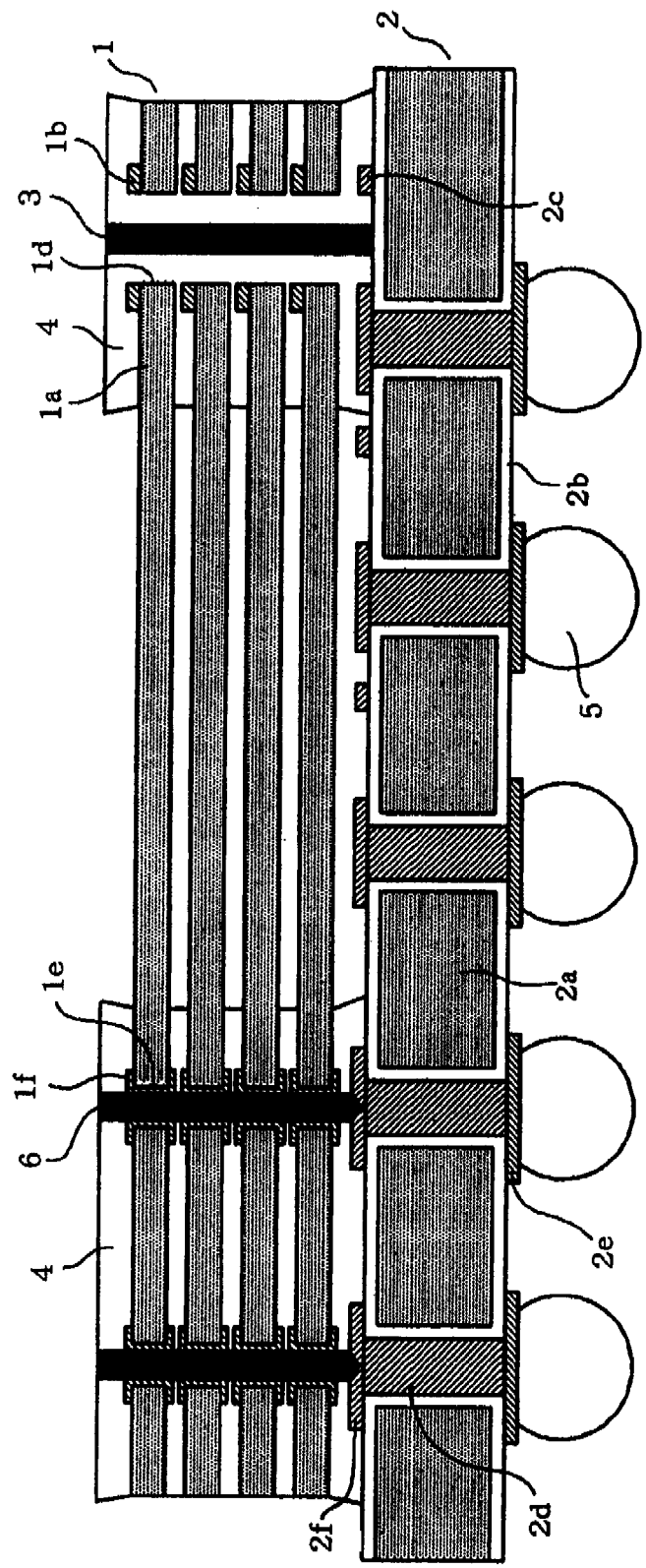
FIG. 8 is a schematic sectional view showing the fifth embodiment.

FIG. 8 is a schematic sectional view showing the semiconductor device of the fifth embodiment. In FIG. 8, parts equivalent to the fourth embodiment shown in FIG. 7 are given the same reference numbers. As shown in FIG. 8, in the fifth embodiment, resin film 4 is excluded from the center of each LSI chip 1. In the present embodiment, when through-holes for signal coils $1b$ and the power supply or grounding of LSI chips are arranged only around the periphery, a microgap cooling method can be adopted in which the resin material is used to seal only those areas in which conductors are present in the vicinities of pins, whereby gaps are provided between LSI chips in the central portions and a coolant fluid is then caused to pass through these gaps to effect parallel cooling of the highest temperature spots of the center of each LSI chip and thereby enable an extremely effective heat radiation construction.

Figure 9:
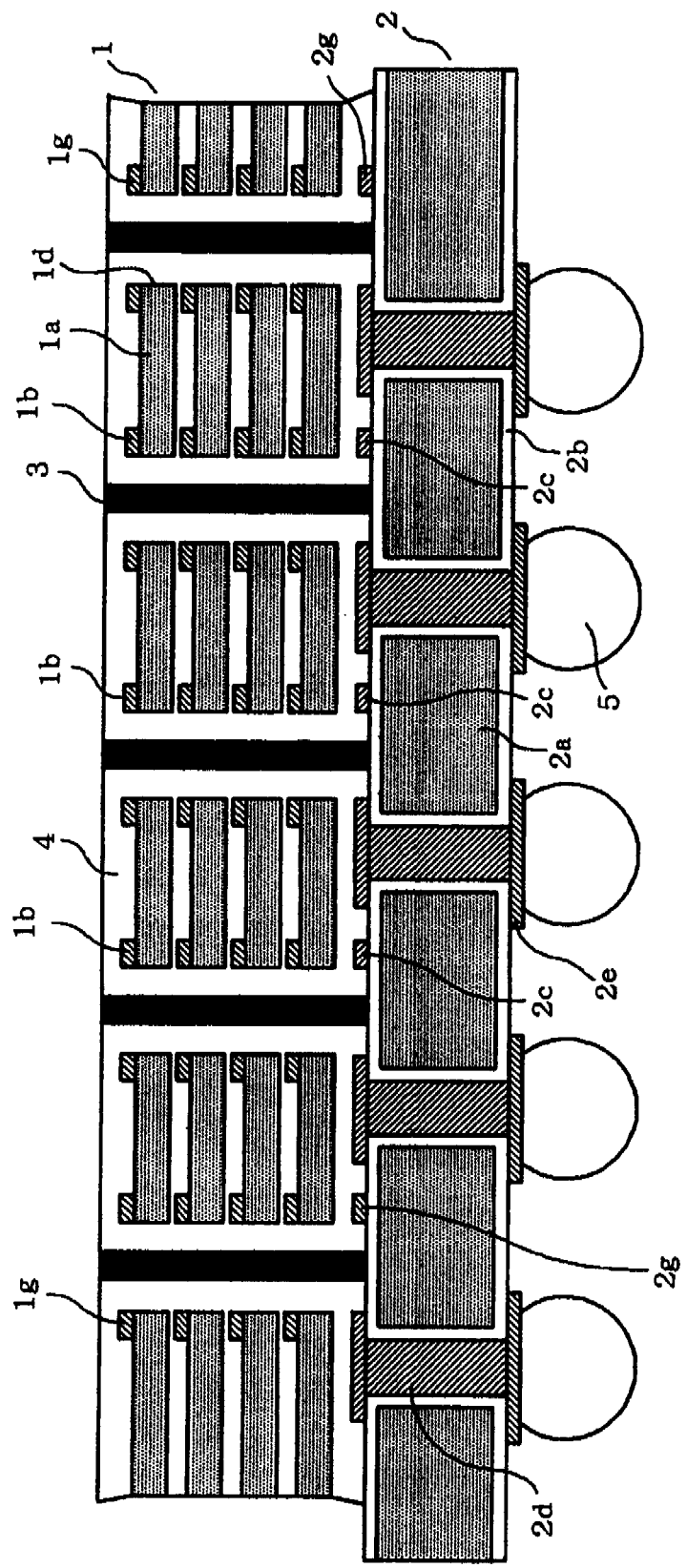
FIG. 9 is a schematic sectional view showing the sixth embodiment.

FIG. 9 is a schematic sectional view showing the semiconductor device of the sixth embodiment. In FIG. 9, parts equivalent to the first embodiment shown in FIG. 3 are given the same reference numbers. As shown in FIG. 9, in the sixth embodiment, a configuration is adopted in which signal coils $1b$ and $2c$ are provided for each LSI chip 1 and interposer 2, respectively, and signal transmission is realized by way of these signal coils $1b$ and $2c$. In addition, the sixth embodiment is of a configuration in which power-supply coils $1g$ and $2g$ are provided on LSI chips 1 and interposer 2, respectively, and the supply of power from interposer 2 to each of LSI chips 1 is realized by way of power-supply coils $2g$, magnetic pins 3, and power-supply coils $1g$. Coils $1g$ for power supply that are provided on LSI chip 1 are connected to a rectifier, and ac power is converted to dc power and supplied to circuits in LSI chip 1. In the sixth embodiment shown in FIG. 9, two sets of power-supply coils $1g$ and power-supply coils $2g$ are provided, but only one set may be provided, or three or more sets may be provided.

In the sixth embodiment shown in FIG. 9, magnetic pins 3 are inserted in both the power-supply coils and the signal coils, but when magnetic pins are difficult to arrange due to, for example, the circuit arrangement, a configuration may be adopted in which magnetic pins are not inserted for, for example, the power-supply coils.

Figure 10:
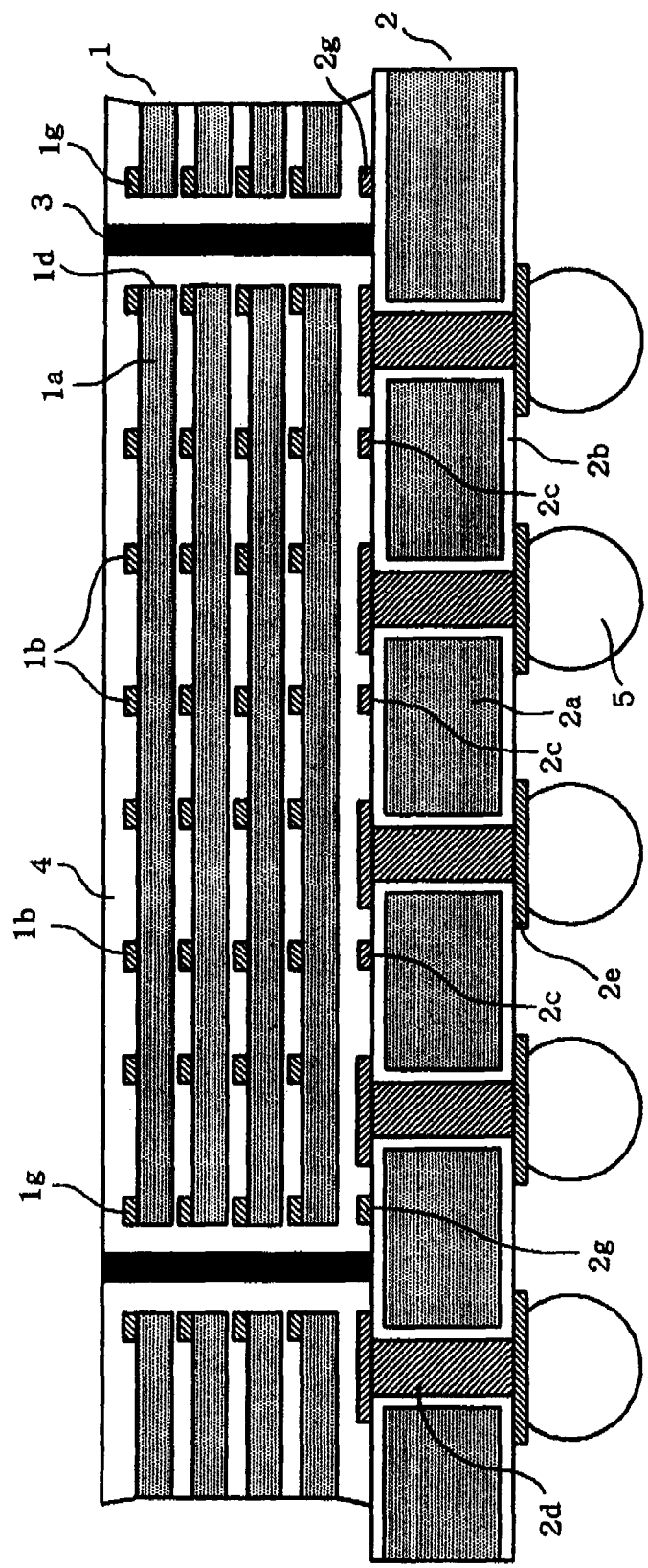
FIG. 10 is a schematic sectional view showing the seventh embodiment.

FIG. 10 is a schematic sectional view showing the semiconductor device of the seventh embodiment. In FIG. 10, parts equivalent to the sixth embodiment shown in FIG. 9 are given the same reference numbers. As shown in FIG. 10, in the seventh embodiment, magnetic pins 3 are provided to pass through the cores of power-supply coils 1g and power-supply coils 2g, but magnetic pins 3 are not provided for signal coils 1b and 2c. Even though of a configuration not provided with magnetic pins, the present embodiment is effective when signal transmission is implemented with little noise or interference and with high quality. From the standpoint of power transmission efficiency, the provision of magnetic pins is preferable for power-supply coils 1g and power-supply coils 2g. However, when power is supplied to the center of a chip, through-holes through which the magnetic pins pass cannot be provided when a circuit is arranged directly below a power-supply coil. In such cases, a construction is effective in which power transmission is implemented by way of only power-supply coils without providing magnetic pins.

Figure 11:
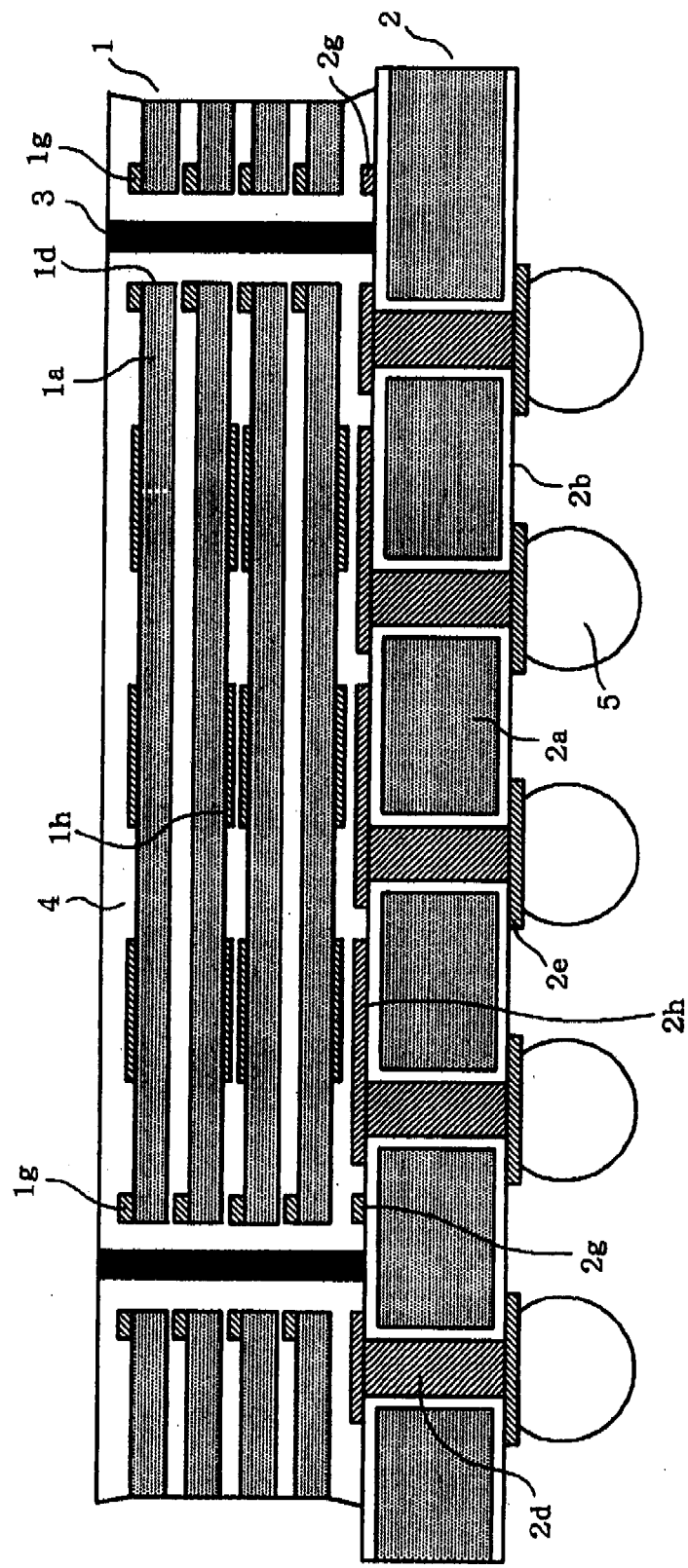
FIG. 11 is a schematic sectional view showing the eighth embodiment.

FIG. 11 is a schematic sectional view showing the semiconductor device of the eighth embodiment. In FIG. 11, parts that are equivalent to the seventh embodiment shown in FIG. 10 are given the same reference numbers. As shown in FIG. 11, in the eighth embodiment, a configuration is adopted in which power-supply coils 1g and power-supply coils 2g are provided for each of LSI chips 1 and interposer 2 and power is supplied from interposer 2 to LSI chips 1 by way of power-supply coils 2g, magnetic pins 3, and power-supply coils 1g but in which signal coils are omitted. Instead, signal capacitance electrodes 1h are provided on the obverse surface and reverse surfaces of LSI chips 1, and signal capacitance electrodes 2h are provided on the surface of interposer 2. This embodiment is of a configuration in which the exchange of signals between LSI chips or between the interposer and an LSI chip is implemented by capacitive coupling between these capacitance electrodes. The eighth embodiment is an effective configuration for realizing signal transmission that uses capacitive coupling between an interposer and the plurality of chips that are stacked on this interposer.

WORKING EXAMPLE 1

Figure 12:
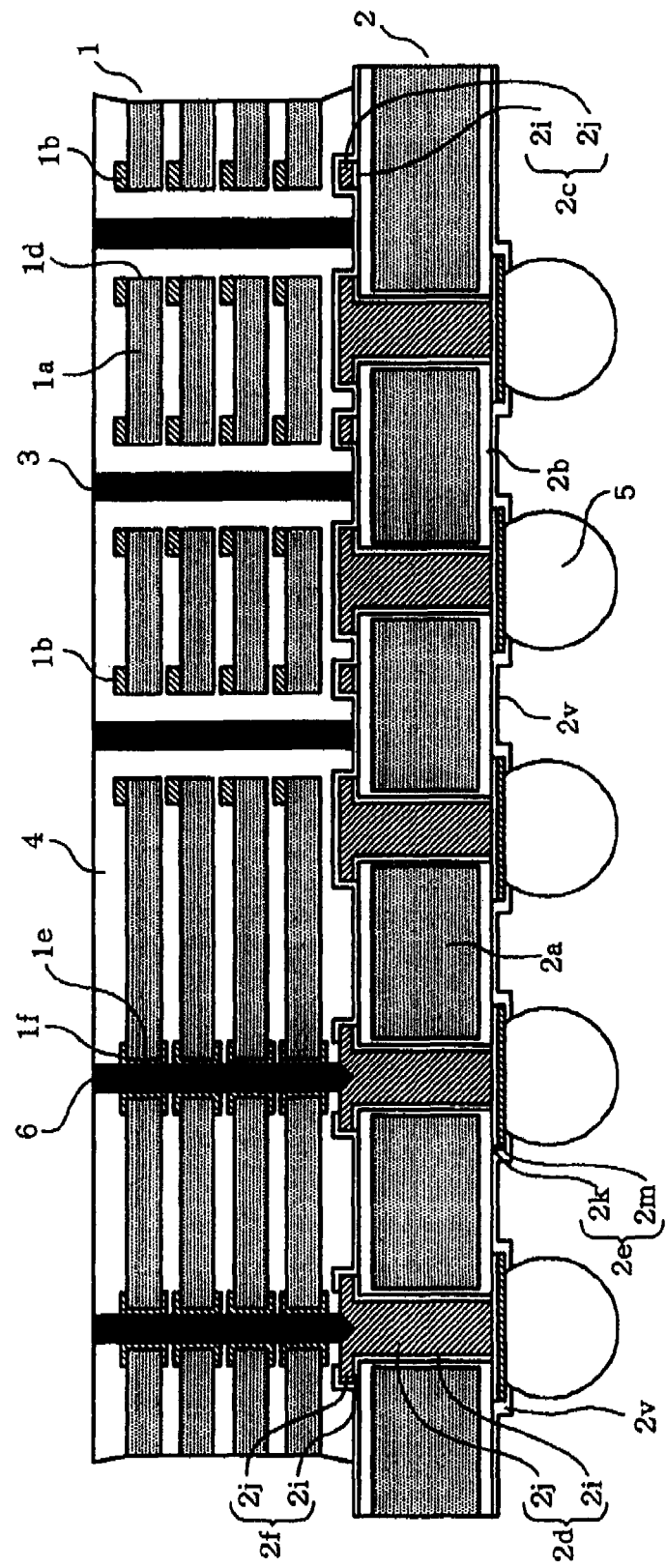
FIG. 12 is a sectional view showing working example 1.

FIG. 12 is a sectional view showing the semiconductor device of working example 1. In the present working example, four LSI chips 1 having a thickness no greater than 100 µm are stacked on interposer 2. LSI chips 1 are formed using silicon substrates 1a, and signal coils 1b used for signal transmission are formed on the circuit formation surfaces of these chips, these signal coils 1b being connected to internal circuits. Signal coils 1b are connected to circuits formed within LSI chips 1 by way of lead-out interconnects. Through-holes 1d are formed in the centers of signal coils 1b of silicon substrates 1a, and magnetic pins 3 are inserted in these through-holes 1d.

In addition, through-holes are formed in each LSI chip 1 and conductive pins 6 that are connected to the power supply and ground are inserted in these through-holes, and wall-surface conductive films 1e that are formed on the inner wall surfaces of these through-holes make contact with conductive pins 6. Lands 1f are then formed on the substrate surfaces in the vicinities of through-holes through which conductive pins 6 are inserted, these lands 1f being connected to wall-surface conductive films 1e. These lands 1f are connected to power supply lines or ground lines within LSI chips 1. In the present working example, magnetic pins 3 are formed from a Ni—Fe alloy (permalloy), and conductive pins 6 are formed from the same material.

Interposer 2 is formed using substrate 2a that is composed of silicon, and the obverse and reverse surfaces of substrate 2a and the inner wall surfaces of through-holes are covered by insulating film 2b. Signal coils 2c for signal transmission with LSI chips 1 that are stacked over interposer 2 are formed on insulating film 2b on the obverse surface side of substrate 2a, and magnetic pins 3 are established in the centers of these signal coils 2c.

In addition, electrode pads 2f are formed on insulating film 2b on the obverse surface side of interposer 2, and conductive pins 6 contact these electrode pads 2f. Electrode pads 2f are formed on through-conductors 2d of interposer 2 and are directly connected to these through-conductors 2d, and in addition, signal coils 2c extend as far as through-conductors 2d and connect to these through-conductors 2d.

These signal coils 2c, electrode pads 2f, and through-conductors 2d are formed by the laminated films of barrier/seed layer 2i formed on insulating film 2b and copper-plate layer 2j that is formed on barrier/seed layer 2i. Through-conductors 2d electrically connect to electrode pads 2e formed by the laminated films of barrier/seed layer 2k and copper-plate layer 2m on the substrate reverse surface. Solder balls 5 that serve as external connection terminals are formed on the bottom surfaces of electrode pads 2e.

Solder material such as Sn-37Pb or Sn-3Ag-0.5Cu and Sn-8Zn-3Bi that are lead-free compositions are used as the solder balls. The pitch depends on the number and size of the pins but is formed at no greater than 0.5 mm, i.e., the same level as for current CSP external terminal electrodes. The obverse and reverse surfaces of interposer 2 are covered by protective film 2v with the exception of the contact points of conductive pins 6 and the formation sites of solder balls 5.

In this configuration, signal coils that are formed on LSI chips can be formed on either the same surface as the circuit surface or the reverse surface if connected by interconnects to the circuit portions of the LSI chips. In addition, conductive pins that are used for power supply and grounding are formed from a magnetic material, but the surfaces of these conductive pins can be covered by Ni/Au plating. For the purpose of reducing mutual interference between LSI chips, a construction can be adopted in which an insulation-covered metal or an electromagnetic absorbing material is inserted between LSI chips. Keeping the gaps between LSI chips as small as possible or on the order of 50 µm or less is preferable for maintaining signal transmission quality. In addition, the radiation of heat can also be promoted by applying thermal grease, which is a high thermal conductor, between LSI chips or by inserting a high-heat conduction sheet.

Explanation next regards a modification of the connection structure between conductive pins 6 and LSI chips with reference to FIGS. 13A-13F. Internal interconnects 1k that are connected to internal circuits are formed on insulating film 1j of the circuit formation surface of LSI chips 1. These internal interconnects 1k are connected to wall-surface conductive films 1e of the inner surfaces of through-holes by way of lands 1f of the surfaces of LSI chips 1.

Figure 13A:
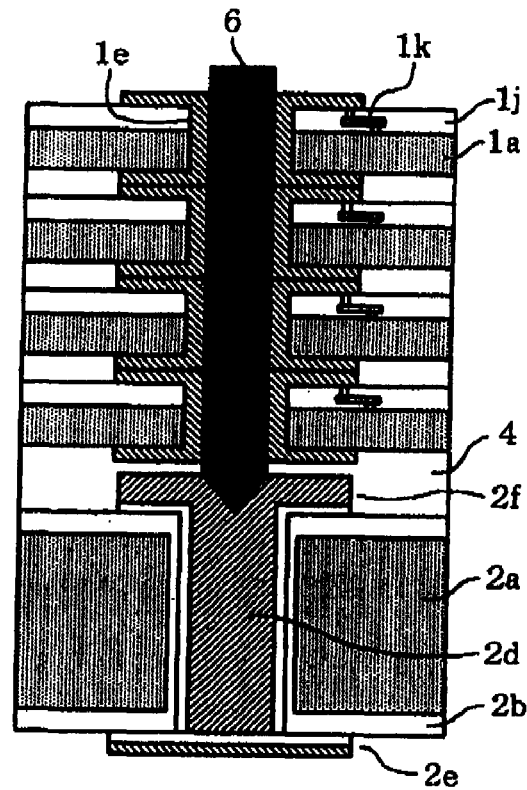
FIG. 13A is a sectional view showing an example of the connection structure realized by conductive pins of working example 1.

FIG. 13A is an example in which through-holes are formed perpendicularly as shown in FIG. 12 and in which wall-surface conductive films 1e, in which the outermost surface is a gold-plate layer, are formed on the inner surfaces of these through-holes. The outer circumferences of the conductive pins rub against the gold-plate layers of wall-surface conductive films 1e of the LSI chips, and the gold-plate layers, which are superior in ductility and malleability, undergo plastic deformation to obtain conductive contacts.

Figure 13B:
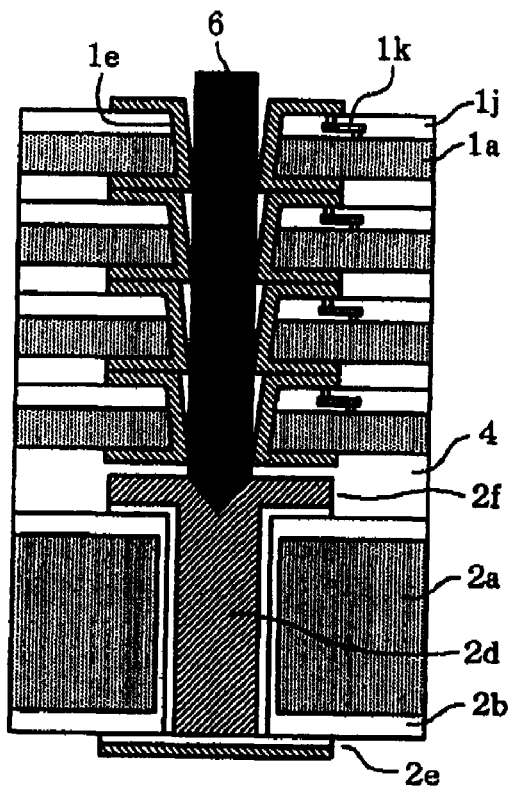
FIG. 13B is a sectional view showing an example of the connection structure realized by a conductive pin of working example 1.

The construction shown in FIG. 13B has through-holes of a tapered shape in which the diameter of the ends on the side from which pins are inserted is larger than the diameter on the other ends. This construction allows a greater tolerance limit for positional divergence between a pin and a through-hole, decreases the area of rubbing between the two metal layers, and enables easily insertion of a pin into a through-hole.

Figure 13C:
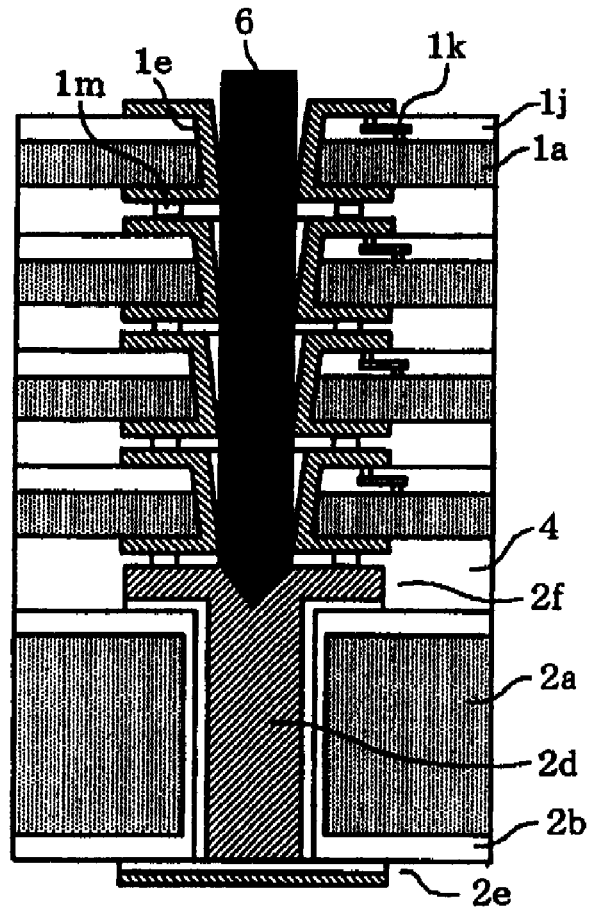
FIG. 13C is a sectional view showing an example of the connection structure realized by a conductive pin of working example 1.

The construction shown in FIG. 13C is an example in which bumps 1m made of metal are formed on lands on the side opposite the circuit formation surface of an LSI chip. The bumps are formed as a construction with a core of nickel alloy and a surface that is gold-coated and have a diameter of 3 µm and a height of 3 µm when the hole diameter is set to 46 µm and the land diameter is set to 60 µm. This construction enables the formation of metal bonding between bumps 1m and lands of the LSI chip surfaces in the step of stacking LSI chips, and can maintain reliability of conductive contact that equals or surpasses surface contacts due to the plastic deformation of the gold-plate layers. This construction may be formed with through-holes having a tapered shape as shown in FIG. 13C, or may be formed with through-holes having a straight shape.

Figure 13D:
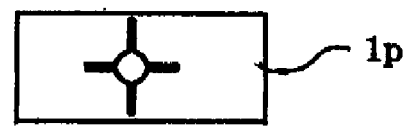
FIG. 13D is a plan view showing an example of the connection structure realized by a conductive pin of working example 1.
Figure 13E:
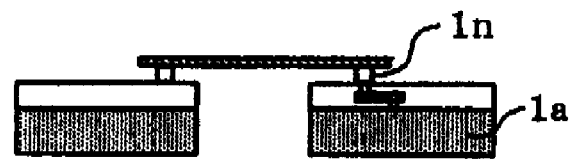
FIG. 13E is a sectional view showing an example of the connection structure realized by a conductive pin of working example 1.
Figure 13F:
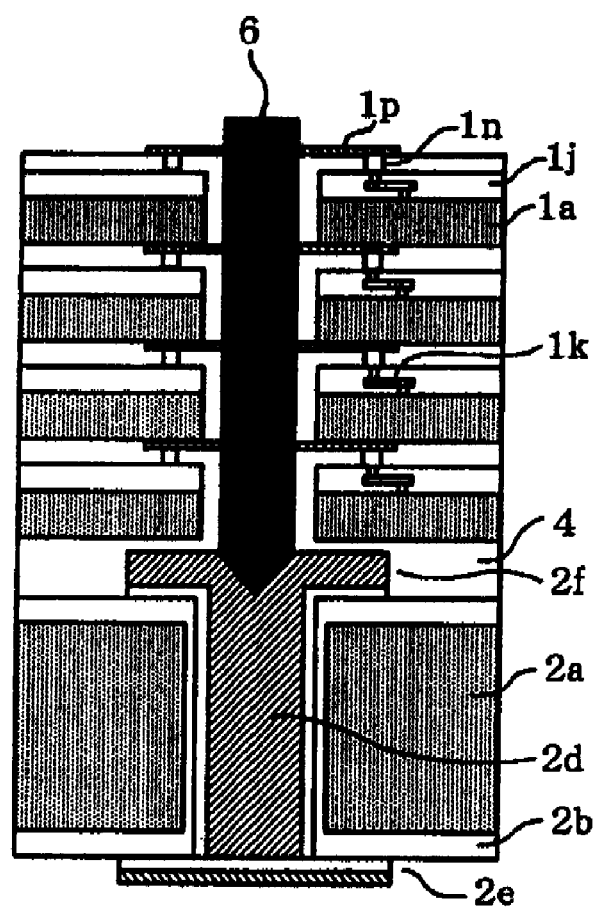
FIG. 13F is a sectional view showing an example of the connection structure realized by a conductive pin of working example 1.

In the constructions shown in FIGS. 13D, 13E, and 13F, contact is achieved by, instead of forming a plated layer in the through-hole (forming a plated through-hole) of an LSI chip, forming electrode 1n that is connected to internal interconnect 1k on the LSI chip surface, connecting this electrode 1n with conductive plate 1p, and inserting conductive pin 6 into conductive plate 1p. Conductive plate 1p is of a construction formed by passing a round center hole through the center of a square-shaped core material composed of an elastic material, cutting slits that radiate from this center hole in a cross shape, and applying gold plating to the surface of the core material.

The construction of the present working example eliminates the need for forming plated through-holes and therefore can reduce fabrication costs. In addition, tapering the tip portion of a conductive pin to a sharp point enables the easy insertion of a conductive pin into the conductive plate. In this construction, inserting a conductive pin into the center hole in the center of the conductive plate causes rubbing between the plated layer of the conductive plate and the outer circumference of the conductive pin to obtain a conductive contact.

Fabrication Method of the Semiconductor Device

Figure 14A:
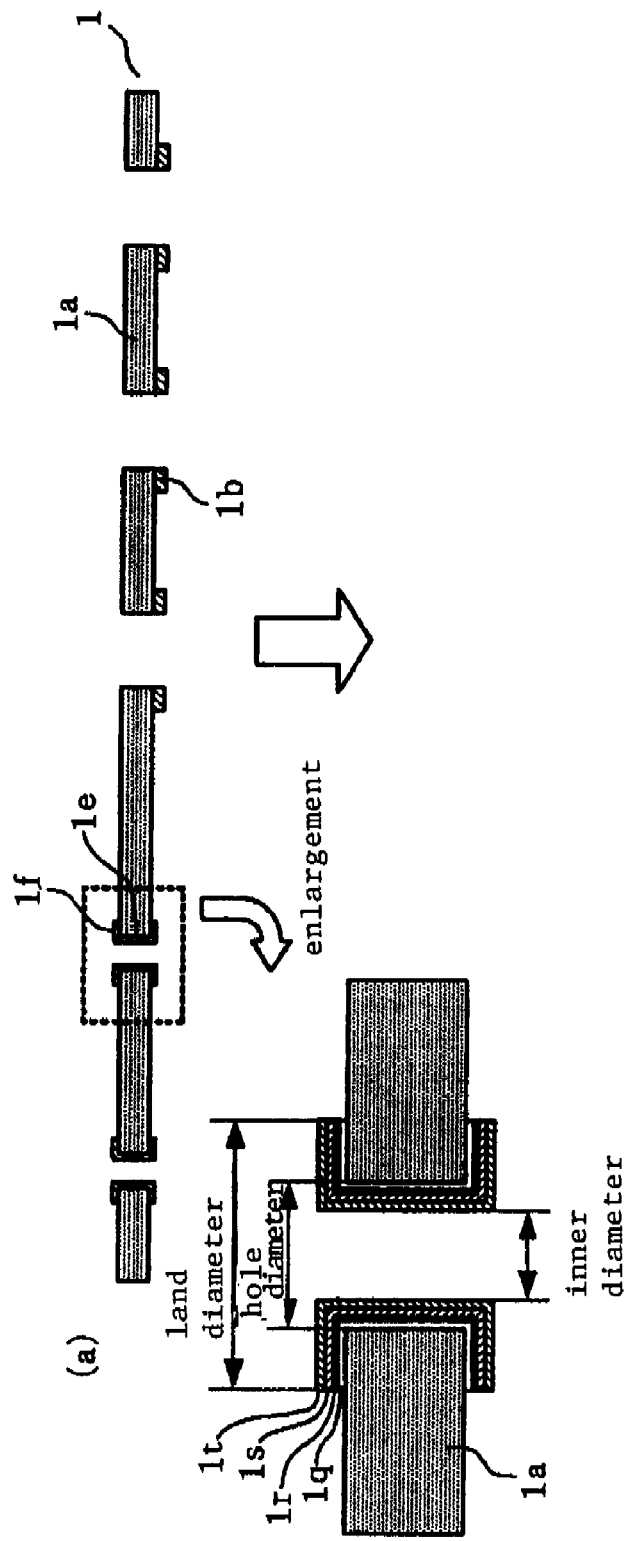
FIG. 14A is a sectional view showing the fabrication method of working example 1.

Explanation next regards the fabrication method (assembly steps) of the semiconductor device of the present working example with reference to the procedures shown in order in FIGS. 14A-14F. Before assembly, LSI chip 1 is prepared in which signal coils 1b are formed around through-holes and wall-surface conductive films 1e and lands 1f are formed on the other through-holes as shown in FIG. 14A, and a part is further prepared in which magnetic pins 3 and conductive pins 6 are formed on temporary substrate 7 with seed layer 7a interposed.

Explanation here regards the dimensional relations between the conductive pins and wall-surface conductive films 1e and lands 1f. As shown in the enlargement, wall-surface conductive film 1e and land 1f are realized by forming SiO2 film 1q on silicon substrate 1a in which a through-hole is provided, and then successively forming on this SiO2 film 1q: TiN film 1r as a barrier metal layer, copper film 1s that is a seed layer and plated layer, and gold film 1t that is a plated layer. The shapes of wall-surface conductive films 1e and lands 1f of LSI chips 1 (land diameter, hole diameter, thickness of metal layer) and the shape of the conductive pins (diameter and length) depend on the electrode pitch and number of stacked layers of the employed LSI chips.

As one example, explanation next regards a case in which the electrode pitch of LSI chips 1 is 100 µm and four LSI chips 1 are stacked. The land diameter of power-supply/ground through-holes of LSI chips 1 is set to 60 µm to prevent the occurrence of shorts, and moreover, to obtain reliable adhesion with the base material, the hole diameter is set to 46 µm, and the thicknesses of the constituent materials of the hole inner walls are 0.2 µm for the insulating film (SiO2), 10 nm for the barrier metal layer (TiN), 0.15 µm for the seed layer (copper), and 2 µm for the gold-plate layer.

The resulting inner diameter of wall-surface conductive film 1e is 37.28 µm. The diameter of the conductive pin that is inserted herein is formed to 38.7 µm-39.2 µm. Adopting these dimensional relations results in an overlap of 0.5 µm-1 µm between the gold-plate layer of wall-surface conductive film 1e and the outer circumference of the conductive pin. By utilizing these portions, when a conductive pin is inserted into a through-hole of LSI chip 1, the gold of the wall surface conductive film rubs against the metal material layer of the conductive pin and undergoes plastic deformation to enable a reliable conductive contact.

Regarding the connection structure of the through-hole part, various configurations can be adopted according to the contact reliability that is required of the product as previously described. Through-holes 1d that are formed in signal coils of LSI chips 1 are formed in a square shape in which one side measures 50 µm or a round shape having an inside diameter of 50 µm. Magnetic pins 3 are formed with a diameter of 38.7 µm-39.2 µm similar to conductive pins 6.

The height of magnetic pins and conductive pins depends on the thickness of each of the LSI chips and the resin layers. Taking an example in which the thickness of one LSI chip 1 is 50 µm and the interlayer thickness of resin films 4 is 10 µm, pins are formed to a height of 250 µm, which is the sum total of 200 µm, which is the thickness of four LSI chips 1, and 50 µm, which is the sum total of five layers of resin film 4.

Figure 14C:
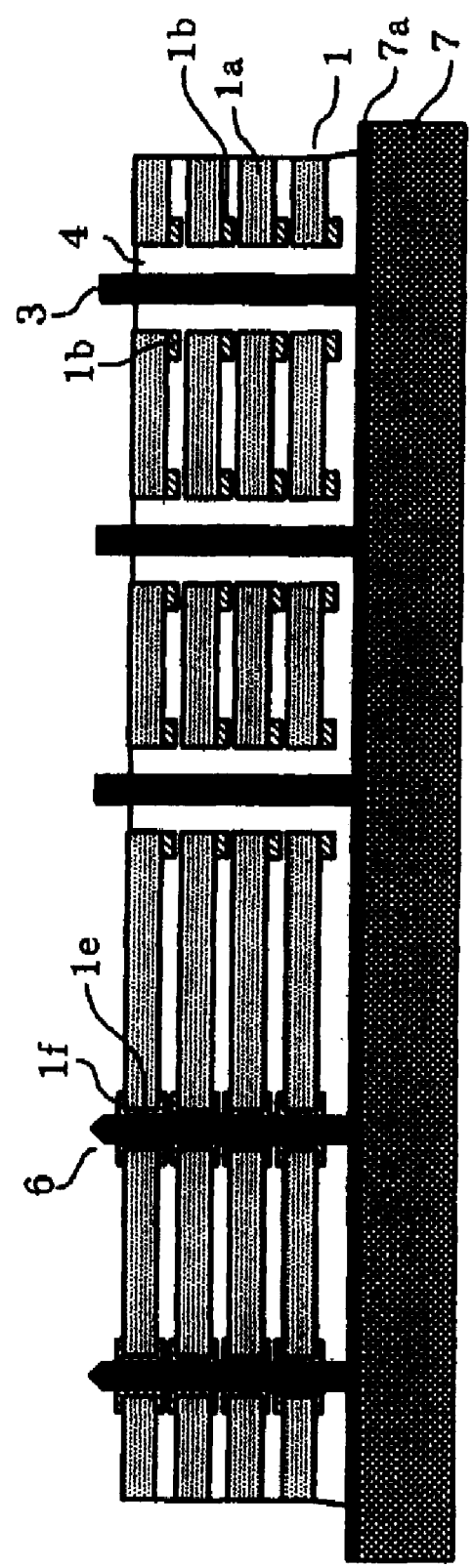
FIG. 14C is a sectional view showing the fabrication method of working example 1.

As shown in FIG. 14A, resin (for example, thermosetting epoxy resin) 4a is applied to the center portion of temporary substrate 7 having magnetic pins 3 and conductive pins 6. In this state, LSI chip 1 is secured by vacuum suction by a tool of a chip-mounting device, images of both the through-holes in LSI chip 1 and magnetic pins 3 and conductive pins 6 are captured by a camera, positional adjustments are carried out, and LSI chip 1 is mounted and secured by heat and pressure (FIG. 14B). This process is repeated to produce a three-dimensional LSI stacked construction on temporary substrate 7 on which magnetic pins 3 and conductive pins 6 have been formed (FIG. 14C).

Figure 14D:
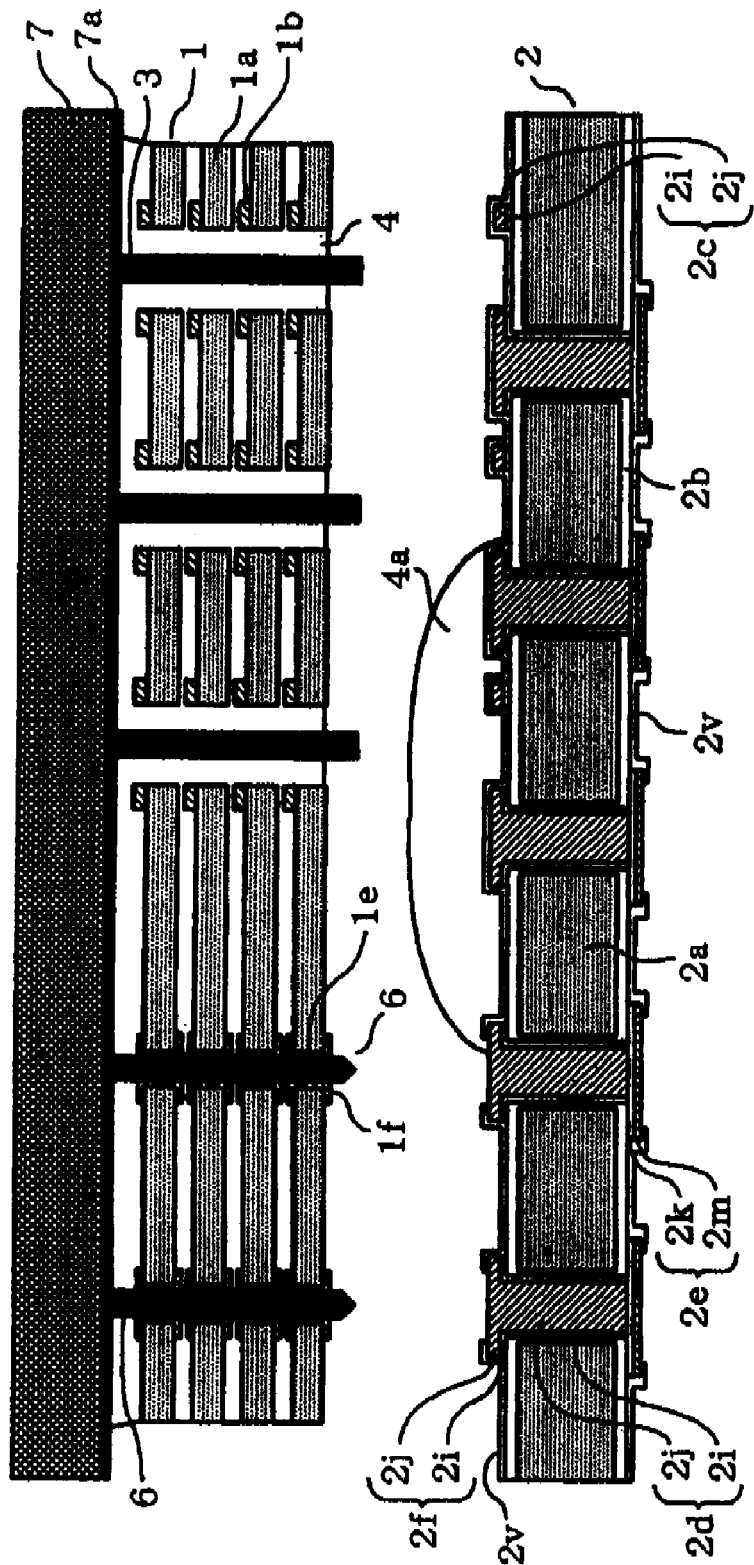
FIG. 14D is a sectional view showing the fabrication method of working example 1.
Figure 14E:
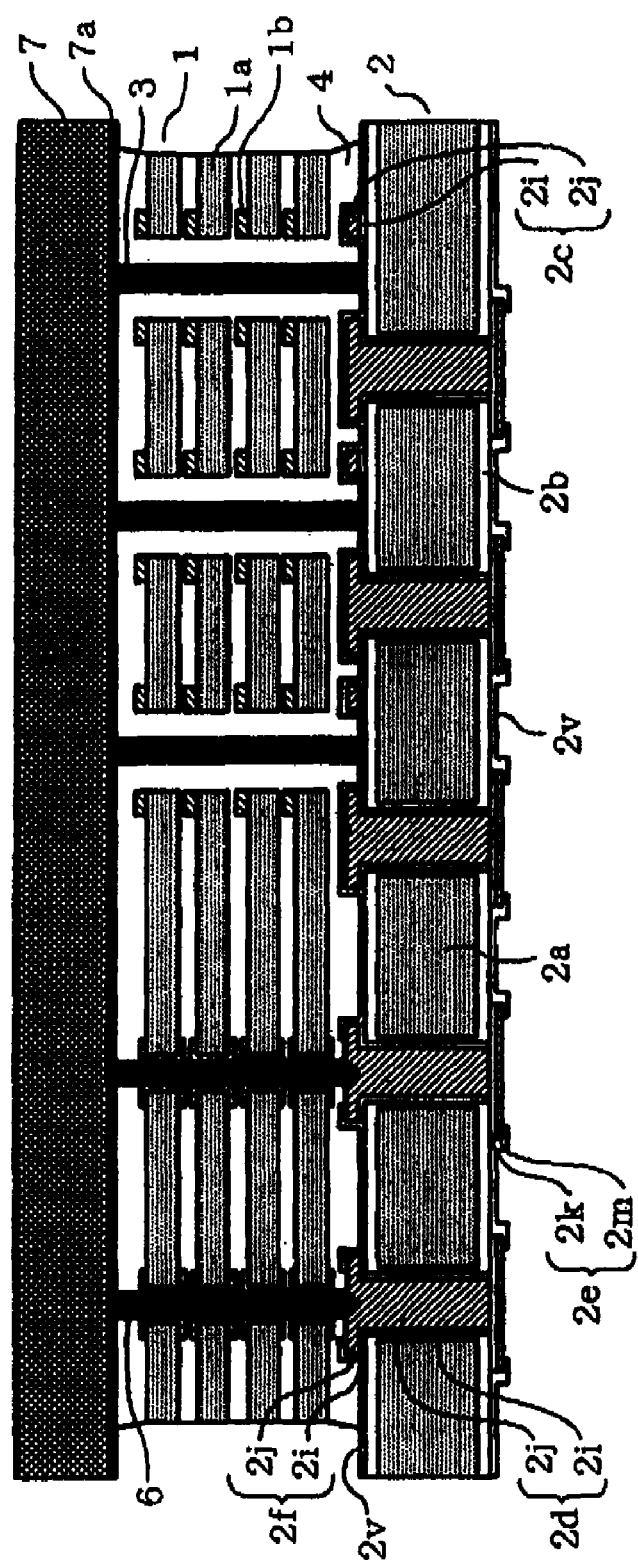
FIG. 14E is a sectional view showing the fabrication method of working example 1.
Figure 14F:
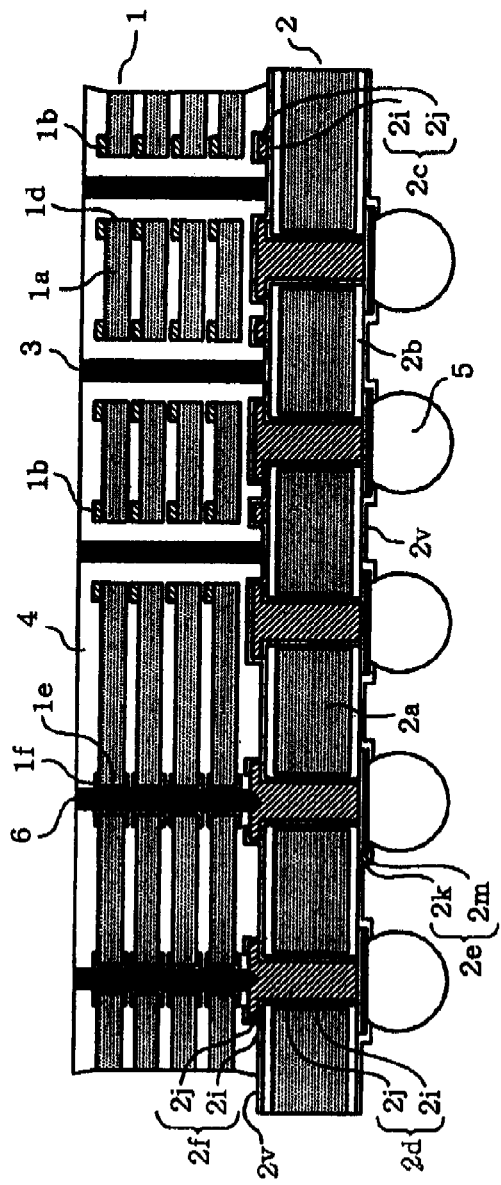
FIG. 14F is a sectional view showing the fabrication method of working example 1.

Resin 4a (for example, a thermosetting epoxy resin) is next applied to the center portion of the upper surface of interposer 2, and the substrate on which LSI chips 1 have been stacked is secured by vacuum suction by a tool of a chip-mounting device to place LSI chips 1 in confrontation with the interposer (FIG. 14D). In this state, images of through-conductors 2d and electrode pads 2f on the interposer, and magnetic pins 3 and conductive pins 6 are captured by a camera, and following positional adjustments, temporary substrate 7 on which the LSI chips have been stacked is mounted on interposer 2 and secured by the application of heat and pressure (FIG. 14E).

Temporary substrate 7, which is the upper surface, is next detached by etching and removed. Finally, flux is supplied to electrode pads 2e on the reverse surfaces of through-conductors, and solder balls 5 mounted and soldered by reflow (FIG.

14F). The semiconductor device of the present invention can thus be fabricated by the processes described above.

Fabrication Method of Magnetic Pins

Figure 15A:
FIG. 15A is a sectional view showing the fabrication method of magnetic pins and conductive pins used in working example 1.
Figure 15B:
FIG. 15B is a sectional view showing the fabrication method of magnetic pins and conductive pins used in working example 1.
Figure 15C:
FIG. 15C is a sectional view showing the fabrication method of magnetic pins and conductive pins used in working example 1.

Explanation next regards the fabrication method of magnetic pins and conductive pins with reference to procedures shown in order in FIGS. 15A-15I. A technique is applied that takes advantage of the x-ray characteristics of high luminance, high permeability (short wavelength), and superior directivity whereby an equal-size transfer-type x-ray mask is used to process a high aspect ratio construction. Temporary substrate 7 is first prepared (FIG. 15A). A material such as silicon, glass, or metal is used as temporary substrate 7. When a silicon substrate or glass substrate is used, copper, titanium, aluminum, or an alloy that uses these metals is sputtered over the entire upper surface of the substrate to form seed layer 7a (FIG. 15B). The material of this substrate preferably uses a silicon or glass substrate having a thermal expansion coefficient that is basically equivalent to that of the LSI chips that are to be stacked. When using devices having comparatively high output and high generated heat, using a metal such as copper on the substrate and leaving the copper to the end without stripping enables use of the copper as a heat radiation plate. However, in the case of this configuration, an insulating film having superior heat conductivity (SiN) and a seed layer must be formed on the substrate, and following the formation of the magnetic pins (conductive pins), unnecessary portions of the seed layer formed on the insulating film surface must be removed to prevent shorts. These processes are added to the fabrication method shown hereinbelow. Resist film 8a is formed on this surface to a thickness that is on the order of 10 µm-50 µm greater than the desired height of the pins (FIG. 15C).

Figure 15D:
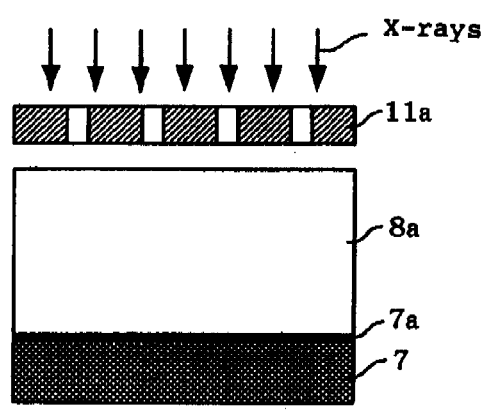
FIG. 15D is a sectional view showing the fabrication method of magnetic pins and conductive pins used in working example 1.
Figure 15E:
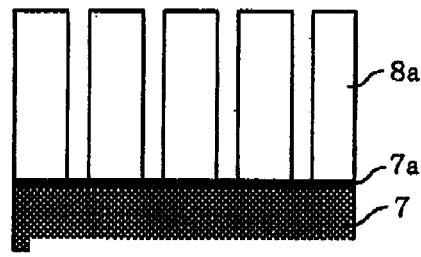
FIG. 15E is a sectional view showing the fabrication method of magnetic pins and conductive pins used in working example 1.
Figure 15F:
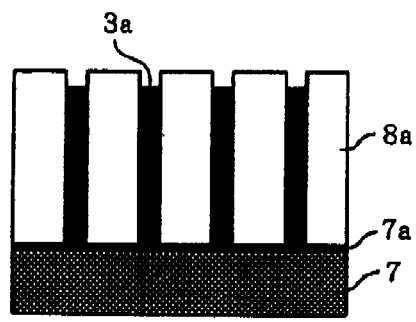
FIG. 15F is a sectional view showing the fabrication method of magnetic pins and conductive pins used in working example 1.

After forming the resist film, x-ray exposure is carried out. Regarding the method of exposure, x-rays generated from a synchrotron radiation facility in which high-energy electrons are subjected to damping of a magnetic field are irradiated onto the surface of resist film 8a by way of mask 11a (FIG. 15D). As the exposure light source, EUV (extreme ultraviolet rays) can also be irradiated instead of x-rays. Development is next carried out to remove the resist film of exposed portions (FIG. 15E). An electroplating method is next used to form magnetic material plated layer 3a on seed layer 7a from which the resist film has been eliminated (FIG. 15F). The material of this metal layer is a magnetic material, and from the standpoint that the metal layer can be formed by plating, a Ni—Fe alloy (permalloy) containing nickel at a 35-80 weight percent, a Fe—Co alloy, or magnetite (Fe3O4) is chiefly used.

Alternatively, as other materials, a ferrite may also be embedded or a formation is possible by the fabrication method shown next. A resist film surface is first subjected to a hydrophilic treatment to form a hydroxyl group, following which the substrate is immersed in a solution containing metal ions to adsorb metal ions. In this state, the introduction of an oxidizing agent such as nitrous acid ions or air causes oxidation of a portion of the ferrous ions (bivalent iron) to tervalent iron. The further adsorption of metal ions in this surface can cause the generation of ferrite having spinel-type crystal structures.

Figure 15G:
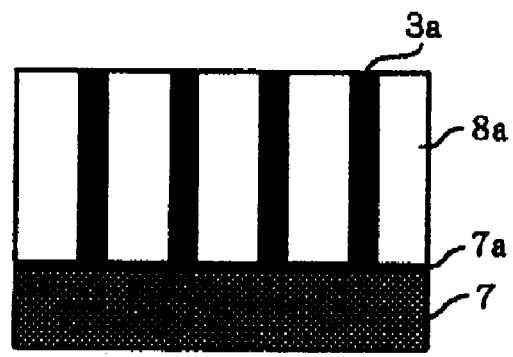
FIG. 15G is a sectional view showing the fabrication method of magnetic pins and conductive pins used in working example 1.
Figure 15H:
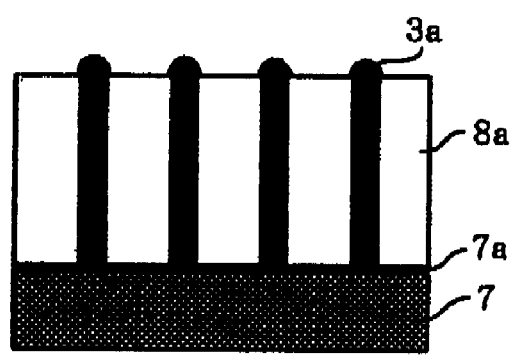
FIG. 15H is a sectional view showing the fabrication method of magnetic pins and conductive pins used in working example 1.
Figure 15I:
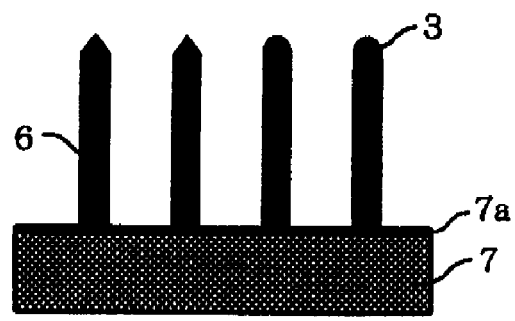
FIG. 15I is a sectional view showing the fabrication method of magnetic pins and conductive pins used in working example 1.

Following the process of FIG. 15F, grinding, polishing, or dry etching is carried out to process to a desired uniform thickness (FIG. 15G). A plated layer is next formed on the leveled surface to form metal bumps only on the upper portions of the pins (FIG. 15H). The formation areas of magnetic pins 3 are next masked by a resist film and wet etching is carried out to sharpen the tip portions of only conductive pins 6. The resist film is then removed (FIG. 15I).

Fabrication Method of the Interposer

Figure 16A:
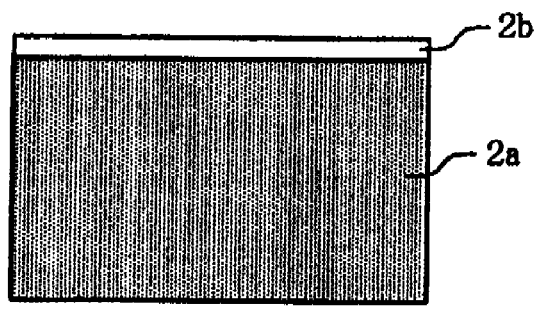
FIG. 16A is a sectional view showing the fabrication method of the interposer used in working example 1.
Figure 16B:
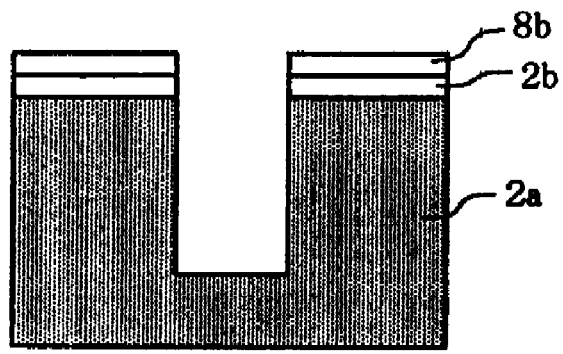
FIG. 16B is a sectional view showing the fabrication method of the interposer used in working example 1.
Figure 16C:
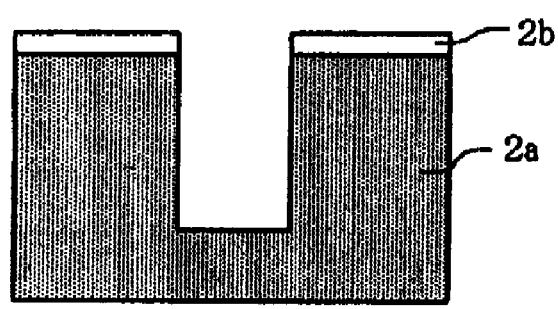
FIG. 16C is a sectional view showing the fabrication method of the interposer used in working example 1.
Figure 16D:
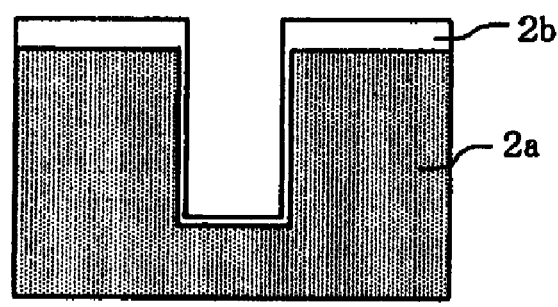
FIG. 16D is a sectional view showing the fabrication method of the interposer used in working example 1.
Figure 16E:
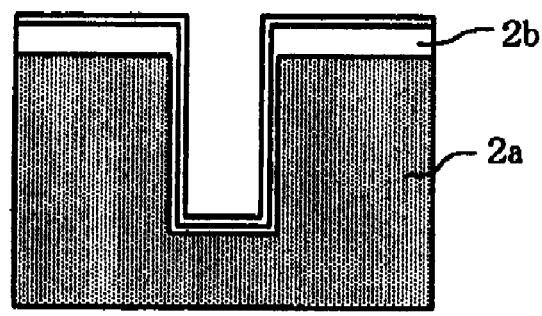
FIG. 16E is a sectional view showing the fabrication method of the interposer used in working example 1.
Figure 16F:
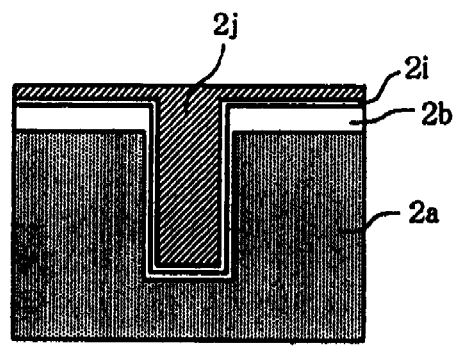
FIG. 16F is a sectional view showing the fabrication method of the interposer used in working example 1.
Figure 16G:
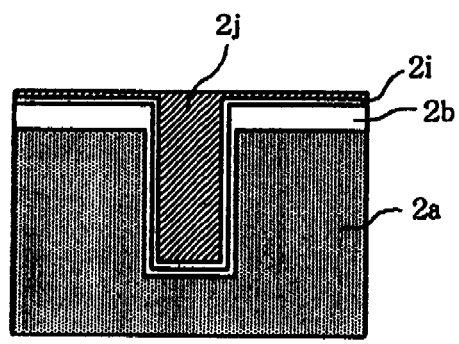
FIG. 16G is a sectional view showing the fabrication method of the interposer used in working example 1.
Figure 16H:
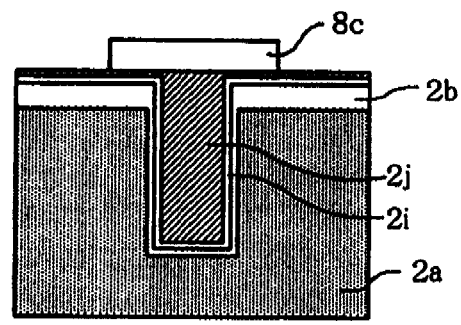
FIG. 16H is a sectional view showing the fabrication method of the interposer used in working example 1.
Figure 16I:
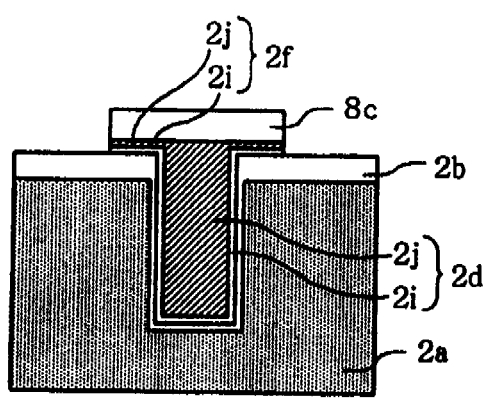
FIG. 16I is a sectional view showing the fabrication method of the interposer used in working example 1.
Figure 16J:
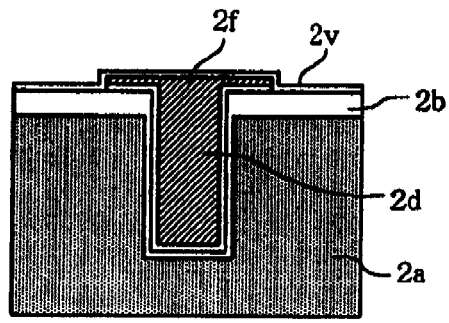
FIG. 16J is a sectional view showing the fabrication method of the interposer used in working example 1.
Figure 16K:
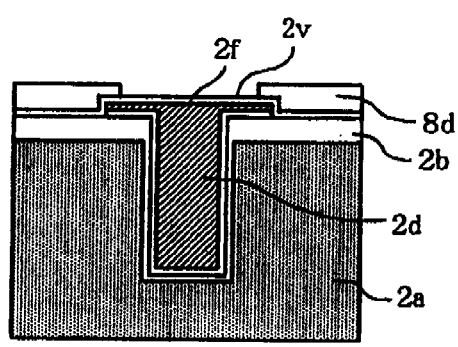
FIG. 16K is a sectional view showing the fabrication method of the interposer used in working example 1.
Figure 16L:
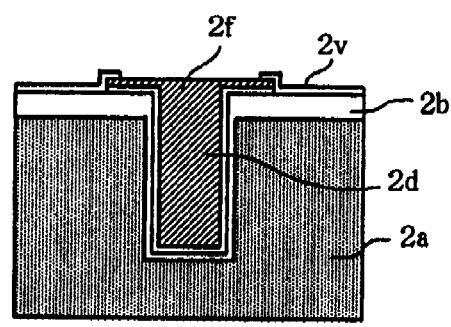
FIG. 16L is a sectional view showing the fabrication method of the interposer used in working example 1.
Figure 16M:
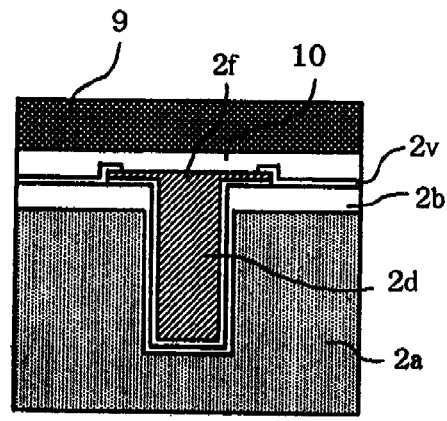
FIG. 16M is a sectional view showing the fabrication method of the interposer used in working example 1.
Figure 16N:
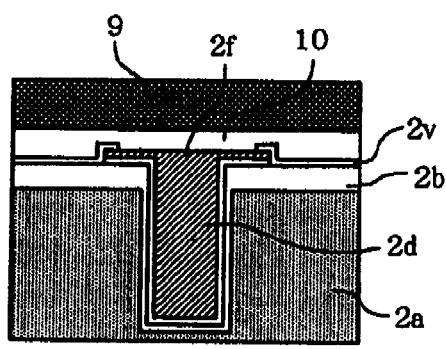
FIG. 16N is a sectional view showing the fabrication method of the interposer used in working example 1.
Figure 16O:
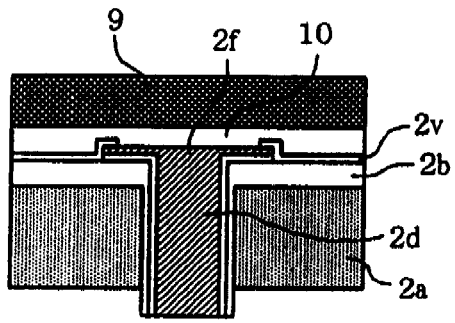
FIG. 16O is a sectional view showing the fabrication method of the interposer used in working example 1.
Figure 16P:
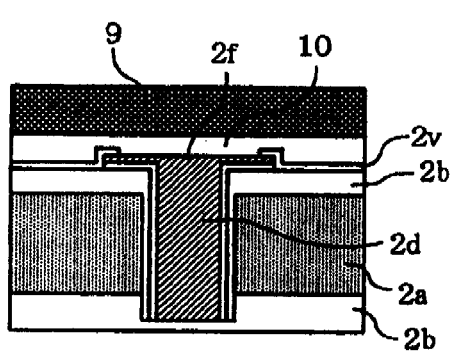
FIG. 16P is a sectional view showing the fabrication method of the interposer used in working example 1.
Figure 16Q:
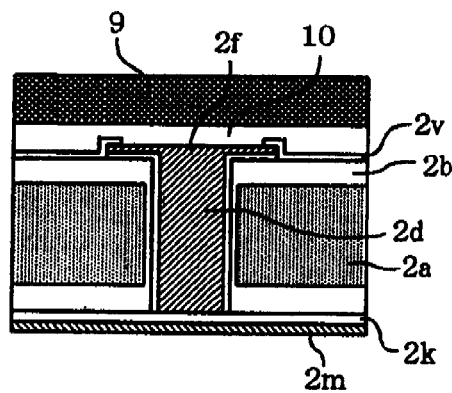
FIG. 16Q is a sectional view showing the fabrication method of the interposer used in working example 1.
Figure 16R:
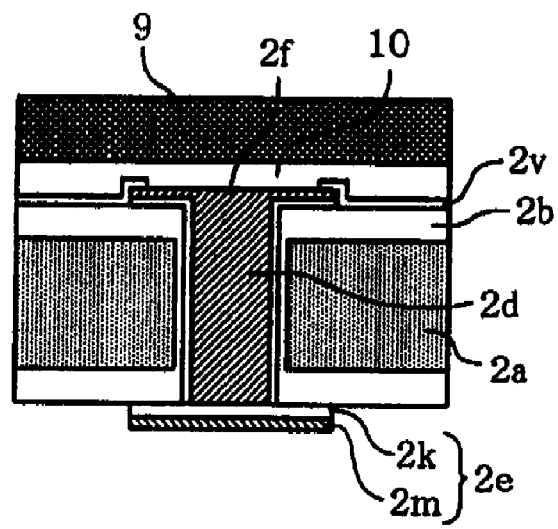
FIG. 16R is a sectional view showing the fabrication method of the interposer used in working example 1.
Figure 16S:
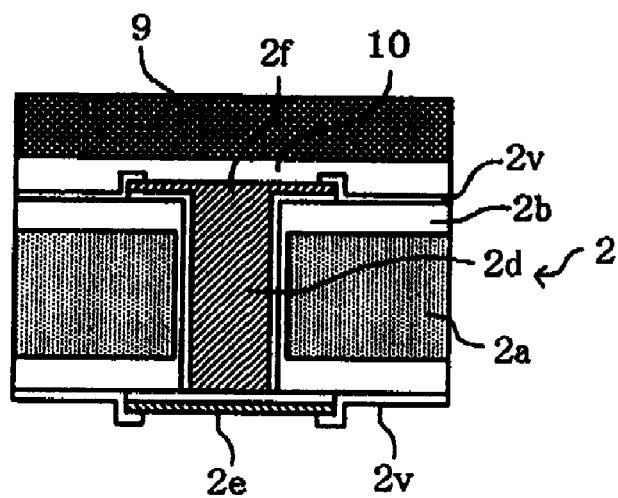
FIG. 16S is a sectional view showing the fabrication method of the interposer used in working example 1.
Figure 16T:
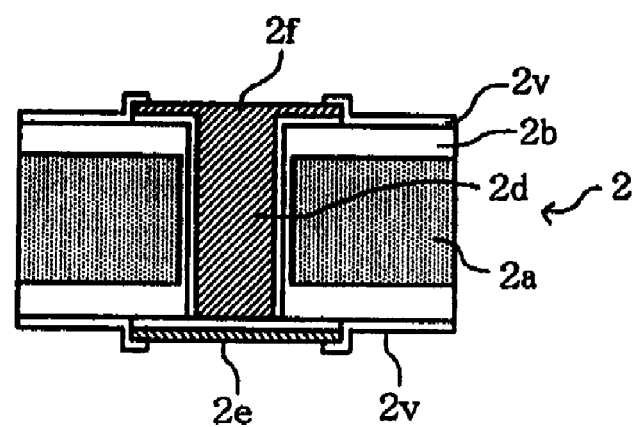
FIG. 16T is a sectional view showing the fabrication method of the interposer used in working example 1.

Explanation next regards the fabrication method of the interposer with reference to the processes shown in order in FIGS. 16A-16T. Substrate 2a made of silicon having a thickness of 525 µm-725 µm that is marketed in the industry is prepared, and insulating film 2b is then formed on the surface of substrate 2a by depositing a SiO2 film to a thickness of 5 µm-7 µm by CVD (FIG. 16A). A resist is next applied over the entire surface to form resist film 8b on insulating film 2b, following which exposure, development, and etching are carried out to remove resist film 8b and insulating film 2b of the formation areas of through-conductors. The substrate is then excavated by RIE (Reactive Ion Etching) to form holes to a depth of 100 µm (FIG. 16C).

A SiO2 film is next deposited to a thickness of 0.2 µm by CVD to form insulating film 2b on the inner wall surfaces of the holes (in the figure, the previously formed insulating film and the newly formed insulating film are shown as a combined unit) (FIG. 16D). A TiN film that is to serve as a barrier layer is next deposited to a thickness of 10 nm and a copper film that is to serve as a seed layer is deposited to a thickness of 0.15 µm to form barrier/seed layer 2i (FIG. 16E).

Electroplating is next carried out to completely bury the interiors of the holes and form copper-plate layer 2j that extends over the substrate (FIG. 16F).

Polishing and flattening processes that employ wet etching and CMP methods are carried out to make the copper-plate layer that was deposited on the surface a uniform thickness of 2 µm-5 µm (FIG. 16G). Resist film 8c for electrode pads, interconnect layer, and coil formation areas is selectively formed by photolithography (FIG. 16H), and copper is removed by etching using resist film 8c as a mask to process copper-plate layer 2j to a prescribed pattern (FIG. 16I). Following the removal of resist film 8c, SiN or SiO2 is deposited over the entire surface by CVD to form protective film 2v (FIG. 16J).

All areas other than the conductive pin contact sites are next covered by resist film 8d (FIG. 16K), unnecessary protective film 2v is removed by dry etching, and resist film 8d is detached and removed (FIG. 16L). Support structures 9 composed of, for example, glass, and a wafer are next adhered by adhesive layer 10 (FIG. 16M). A grinding process is then carried out by CMP from the reverse surface until the remaining silicon has a thickness on the order of 10 µm-30 µm from the bottom surfaces of the holes (FIG. 16N), following which dry etching is carried out to expose the ends of through-conductors 2d (FIG. 16O).

CVD is next used to deposit SiN or SiO2 to form insulating film 2b on the reverse surface (FIG. 16P). A portion of insulating film 2b on the reverse surface is next removed by CMP or dry etching to expose the surfaces of through-conductors 2d, following which, to form electrodes on the reverse surface, TiN and copper are deposited by a sputtering method to form barrier/seed layer 2k and electroplating is carried out to form copper-plate layer 2m (FIG. 16Q). Unnecessary portions are next removed by milling and power-supply pads 2e are formed (FIG. 16R). CVD is next employed to deposit SiN or SiO2 over the entire surface to form protective film 2v, and protective film 2v of the formation areas of external connection terminals then removed by dry etching (FIG. 16S). Finally, support structures 9 are detached and removed to complete the interposer of the present working example (FIG. 16T).

WORKING EXAMPLE 2

Figure 17:
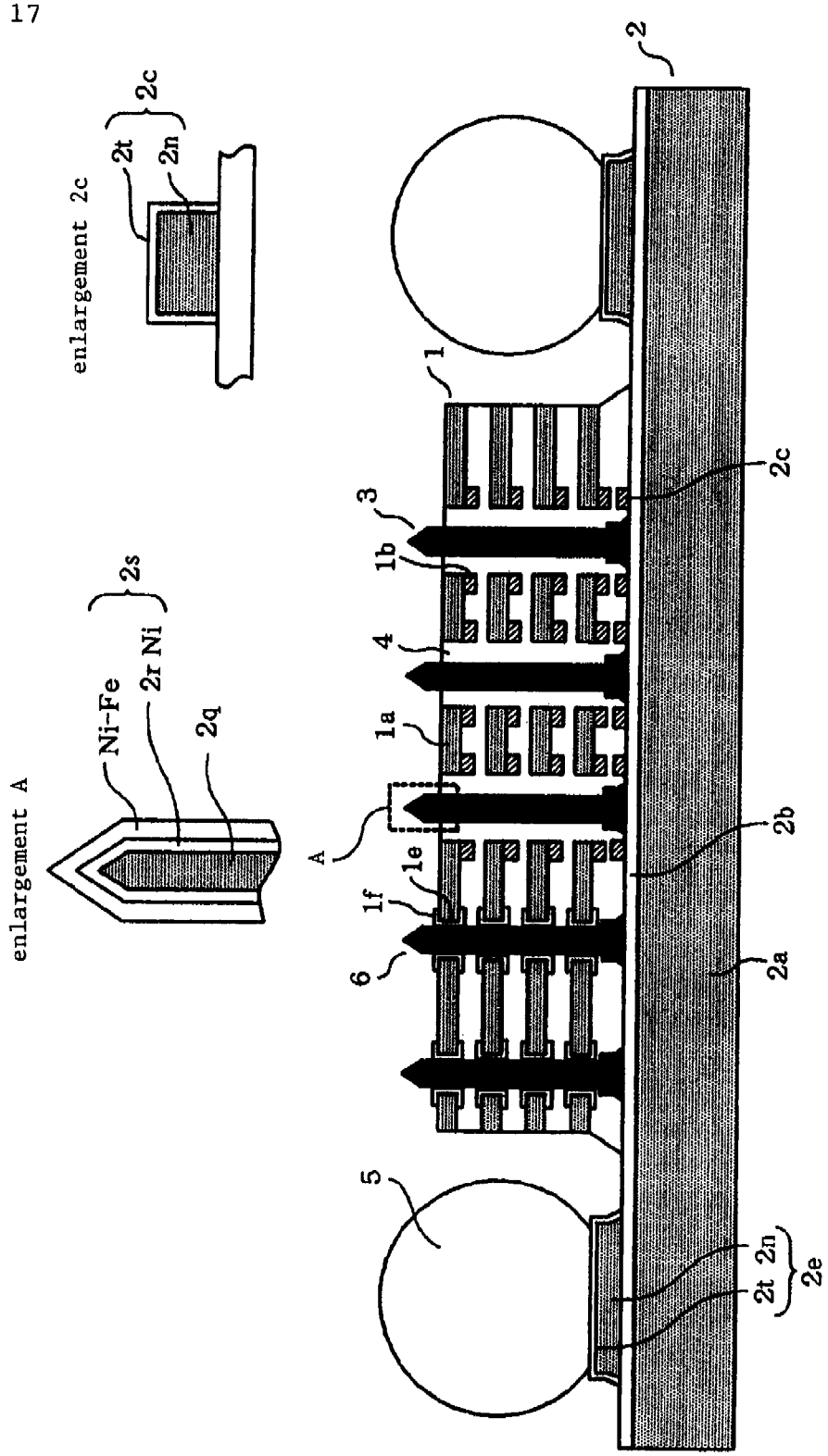
FIG. 17 is a sectional view showing working example 2.

FIG. 17 is a sectional view showing the semiconductor device of working example 2 of the present invention. In the present working example, an SOI (Silicon On Insulator) substrate is used to form the interposer. In other words, SOI layer (silicon layer) is used not only to form silicon core pins, but also to form the interconnect layer, signal coils, and electrode pads. The adoption of this construction enables the batch formation of all pins using the SOI substrate and therefore has the effect of enabling a reduction of the fabrication processes compared to working example 1. In addition, the external connection terminals (solder balls) are formed on the same surface as the interconnect layer and coils, and the present working example is therefore of a configuration suitable for a device having few pins and allows a thinner construction.

As shown in FIG. 17, in the semiconductor device of the present working example, four LSI chips 1 provided with through-holes are mounted on interposer 2 on which magnetic pins 3 and conductive pins 6 are established, these pins 3 and 6 being inserted into the through-holes of LSI chips 1. Signal coils 1b that are connected to the internal circuits of LSI chips 1 are formed on LSI chips 1 with magnetic pins 3 as centers, and signal coils 2c are formed on insulating film 2b of interposer 2. As shown in the enlarged figure, signal coils 2c are formed from silicon layer 2n and conductive plated layer 2t, the surface of which is a gold layer.

In addition, lands 1f and wall-surface conductive films 1e are formed around and on the inside wall surfaces of the through-holes of LSI chips into which conductive pins 6 are inserted. Lands 1f are connected to the power-supply lines or ground lines of LSI chips 1, and wall-surface conductive films 1e are caused to contact conductive pins 6. Gaps between interposer 2 and LSI chip 1 and between LSI chips 1 are filled by resin film 4. Electrode pads 2e composed of silicon layer 2n and conductive plated layer 2t, the surface of which is a gold layer, are formed at the circumference of interposer 2, and solder balls 5 are formed as external connection terminals on electrode pads 2e. Conductive pins 6 and signal coils 2c formed on insulating film 2b of interposer 2 are connected to electrode pads 2e by way of interconnects also formed on insulating film 2b. Magnetic pins 3 and conductive pins 6 used in the present working example are of the same configuration and are realized by covering the surface of silicon core pins 2q with Ni/Ni—Fe alloy-plated layer as shown in enlargement A.

Explanation next regards the details of the configuration of each part with reference to FIG. 17. The method of forming pins on interposer 2 utilizes a VLS (Vapor-Liquid-Solid) growth method, which is a method of forming rod-shaped single-crystals that enables the batch formation of all pins and that can comparatively easily reduce fabrication cost.

The rod-shaped single-crystals realized by the VLS method that serve as the pin material can be formed from Si, LaB6, GaAs, GaP, WO2, and SiC, but the use of silicon that has the same thermal expansion coefficient as the LSI chips that are to be stacked is preferable from the standpoint of maintaining long-term reliability. As the material of the interposer, an SOI (Silicon On Insulator) substrate is used in which a SiO2 film, which is an insulating film, is formed on the upper surface of a silicon substrate and a silicon single-crystal film then formed on the upper surface of the insulating film. A substrate is used in which the silicon substrate has a thickness of 400 μm-800 μm, the SiO2 film has a thickness of 0.5 μm-2 μm, and the silicon single-crystal film has a thickness of 3 μm-40 μm.

The shape of the magnetic (conductive) pins (the diameter of the silicon core pins and the thickness of the metal layers), the shape of the through-electrodes of LSI chips (land diameter, hole diameter, thickness of metal layers), and the diameter of the through-holes all depend on the electrode pitch and number of stacked layers of LSI chips that are used. As an example, explanation regards a case in which the electrode pitch of the LSI chip is 100 μm and four LSI chips are stacked (refer to the partial enlargement of FIG. 14A and FIG. 17).

The diameter of lands at power supply/ground through-holes of an LSI chip is set to 60 μm to prevent the occurrence of shorts, and further, to obtain reliable adhesion with the substrate material; holes are formed with a diameter of 46 μm, and the constituent materials of the hole inner walls are formed to a thickness of 0.2 μm for the insulating film (SiO2), a thickness of 10 nm for the barrier metal layer (TiN), a thickness of 0.15 μm for the seed layer (copper), a thickness of 2 μm for the copper-plated layer, and a thickness of 2 μm for the gold-plated layer. As a result, the inside diameter of through-electrodes is 37.28 μm. Regarding the conductive pins that correspond to these through-electrodes, the diameter of the silicon core pins is 34.5 μm-35 μm and a magnetic material (an Ni—Fe alloy) is plated to a thickness of 2 μm on a electroless nickel layer having a thickness 0.1 μm.

As a result, the diameter of the pins including the metal layers is 38.7 μm-39.2 μm. Adopting these dimensional relations results in an overlap of 0.5 μm-1 μm between the gold-plated layer of wall-surface conductive film 1e and the magnetic layer of the outer circumference of a conductive pin. Using this overlapping portion, the gold of wall-surface conductive film 1e rubs against the magnetic material layer and undergoes plastic deformation when a pin is inserted into the through-hole of a LSI chip, whereby a reliable conductive contact can be obtained. Various forms can be adopted for the connection structure between a conductive pin and an LSI chip, as will be explained hereinbelow.

Through-holes 1d that are formed in the centers of signal coils 1b on LSI chips 1 are formed in a square shape measuring 50 μm on a side or a round shape with an inside diameter of 50 μm. Magnetic pins 3 are formed with a diameter of 38.7 μm-39.2 μm, similar to conductive pins 6. The space between the inner walls of through-holes 1d of an LSI chip and magnetic pins is preferably made as small as possible from the standpoint of raising signal transmission efficiency.

The height of silicon core pins depends on the thicknesses of LSI chips and interlayer resin films 4. Taking an example in which one LSI chip has a thickness of 50 μm and the thickness of resin films 4 between each layer is 10 μm, silicon core pins are formed to a height of 250 μm, which is the sum of 200 μm, which is the thickness of four LSI chips, 40 μm, which is the thickness of four layers of resin films 4, and 10 μm, which is the amount of protrusion of the silicon core pins.

Solder balls of Sn—Pb or lead-free compositions such as Sn-3Ag-0.5Cu and Sn-8Zn-3Bi or metal pins are used for external connection terminals. The attached height of solder balls to the interposer substrate depends on the number of stacked layers of LSI chips but is preferably set to a dimension on the order of 0.05 mm higher than the height of the pins for the purpose of preventing contact between the tips of pins and the motherboard when mounting on a motherboard.

This type of condition is relaxed or solved when an undercut or opening for stacked LSI chips is formed in a motherboard. The pitch of the external connection terminals (such as solder balls) depends on the number and size of terminals, but considering a level no greater than external connection terminals of current CSP, the pitch is formed to 0.5 mm or less.

Explanation next regards a modification of the connection construction between conductive pins 6 (silicon core pins 2q having Ni/Ni—Fe plated layers 2s) and LSI chips with reference to FIGS. 18A-18F. Internal interconnects 1k that are connected to internal circuits are formed on insulating film 1j of the circuit formation surface of an LSI chip, and internal interconnects 1k are connected to wall-surface conductive films 1e of the inside surfaces of through-holes by way of lands 1f of the chip surface.

Figure 18A:
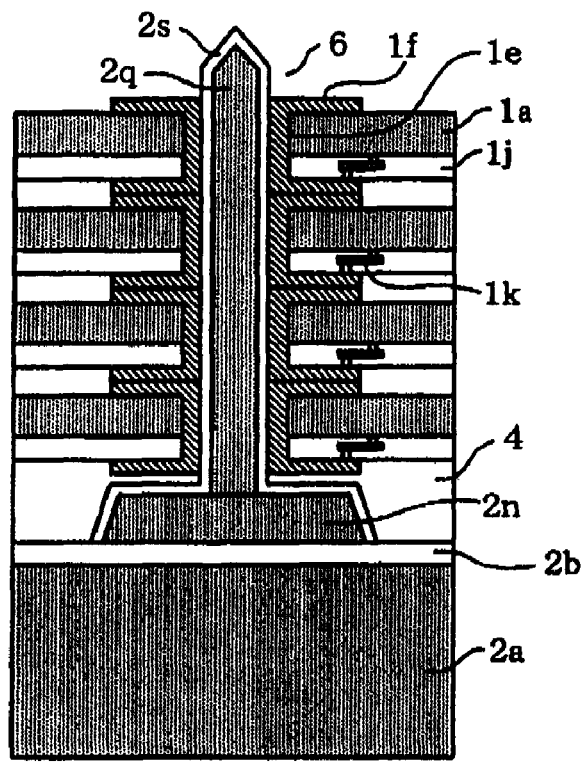
FIG. 18A is a sectional view showing an example of the connection structure realized by a conductive pin of working example 2.

FIG. 18A is an example in which through-holes are formed perpendicularly as shown in FIG. 17, and wall-surface conductive films 1e, in which the outermost surface is a gold-plated layer, are formed on the inner surfaces of these through-holes. Ni/Ni—Fe plated layers 2s that are formed on the outside circumferences of conductive pins rub against the gold-plated layer of wall-surface conductive films 1e of LSI chips and the gold-plated layer, which has superior ductility and malleability, undergoes plastic deformation to obtain conductive contacts.

Figure 18B:
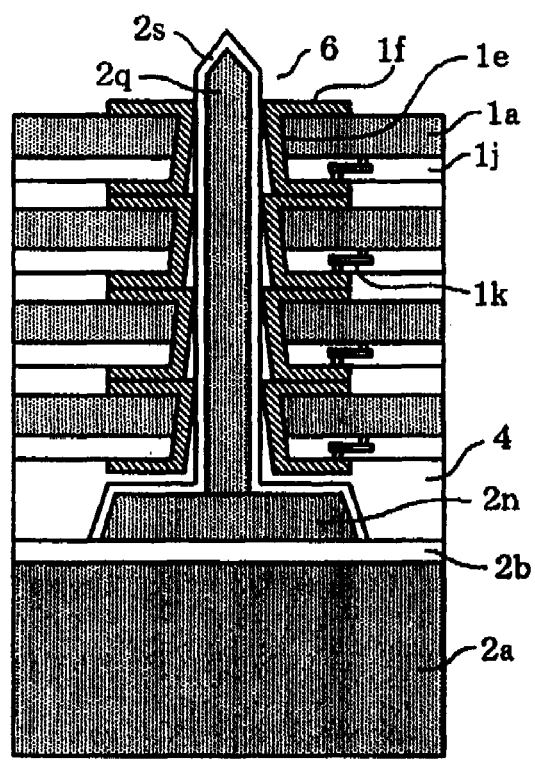
FIG. 18B is a sectional view showing an example of the connection structure realized by a conductive pin of working example 2.

The construction shown in FIG. 18B includes through-holes with tapered shapes in which the diameter of the side from which pins are inserted (the side of the circuit formation plane) is made greater than the other side. This construction enables an increase of tolerance for positional divergence between pins and through-holes, a further decrease of the surface area of rubbing between the two metal layers, and easy insertion of pins into through-holes.

Figure 18C:
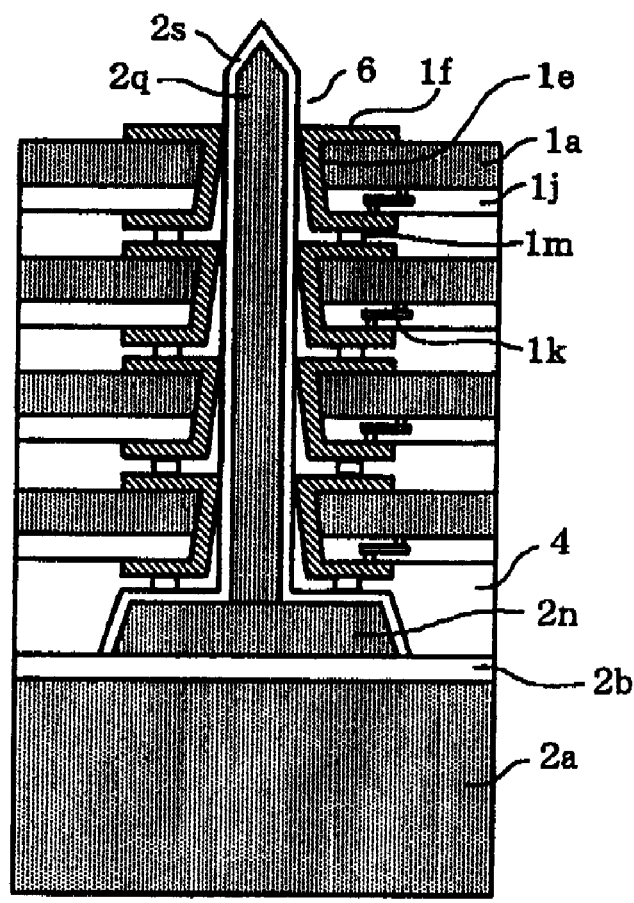
FIG. 18C is a sectional view showing an example of the connection structure realized by a conductive pin of working example 2.

The construction shown in FIG. 18C is of a configuration in which through-holes are formed in a tapered shape in which the diameter on the circuit formation surface sides of LSI chips is greater, and further, bumps 1m made of metal are formed on lands 1f on the circuit formation surface of LSI chips. Regarding the size of these bumps 1m, bumps 1m are formed as a construction with a diameter of 3 μm and a height of 3 μm with a nickel alloy as the core and a gold coating on the surface when the hole diameter is set to 46 μm and the land diameter is set to 60 μm. In the construction shown in FIG. 18C, metal bonding can be formed between bumps 1m and lands on LSI chip surfaces in the process of stacking LSI chips, whereby reliability of the electrical connections can be maintained that surpasses that of surface contacts realized by the plastic deformation of the gold-plated layer.

Figure 18D:
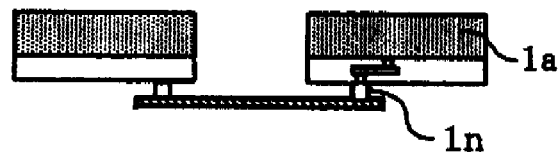
FIG. 18D is a sectional view showing an example of the connection structure realized by a conductive pin of working example 2.
Figure 18E:
FIG. 18E is a plan view showing an example of the connection structure realized by a conductive pin of working example 2.
Figure 18F:
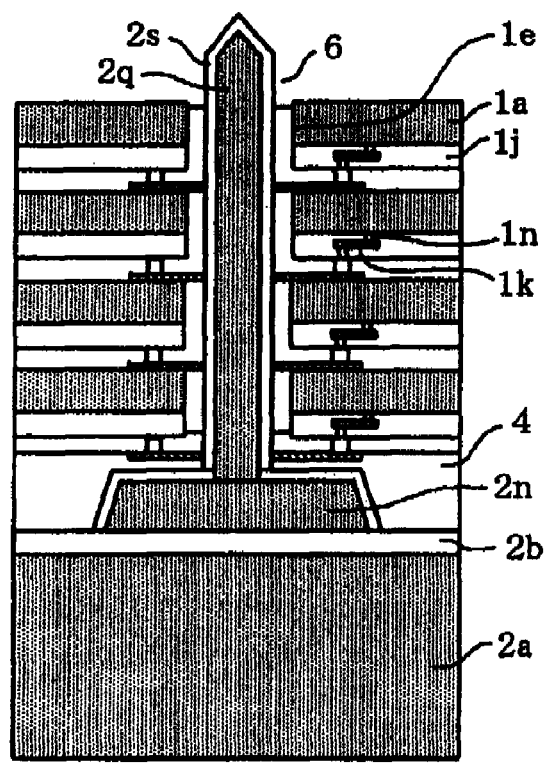
FIG. 18F is a sectional view showing an example of the connection structure realized by a conductive pin of working example 2.

The construction shown in FIGS. 18D, 18E, and 18F are of a configuration in which, instead of forming a plated through-hole in the through-hole of an LSI chip, electrodes 1n are formed that connect to internal interconnects 1k on the LSI chip surface, these electrodes 1n are connected to conductive plate 1p, and conductive pin 6 is then inserted into and placed in contact with conductive plate 1p. Conductive plate 1p is constructed by forming a round center hole that passes through the center of a square-shaped core material composed of an elastic material, cutting slits that radiate from this center hole in a cross shape, and subjecting the surface of the core material to gold plating.

The construction of this working example eliminates the need to form plated through-holes and therefore enables a reduction of fabrication costs. In addition, tapering the tip portions of conductive pins to sharp points enables easy insertion of conductive pins into the conductive plates. In this construction, inserting a conductive pin into the center hole of the center of a conductive plate causes rubbing between the plated layer of the conductive plate and the plated layer of the outer circumference of the conductive pin to obtain a conductive contact.

Method of Fabricating Interposer and Magnetic (Conductive) Pins

Figure 19A:
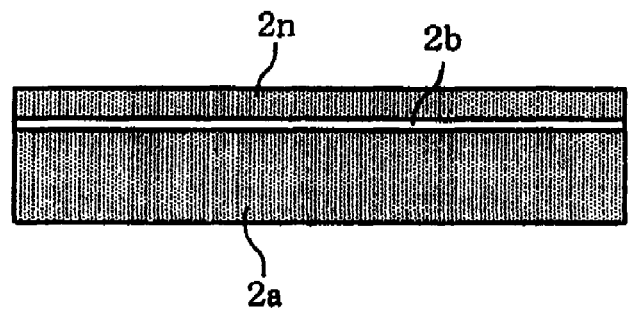
FIG. 19A is a sectional view showing the fabrication method of magnetic pins and conductive pins used in working example 2.
Figure 19B:
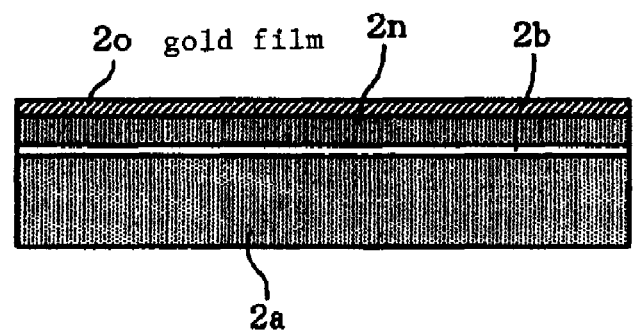
FIG. 19B is a sectional view showing the fabrication method of magnetic pins and conductive pins used in working example 2.
Figure 19C:
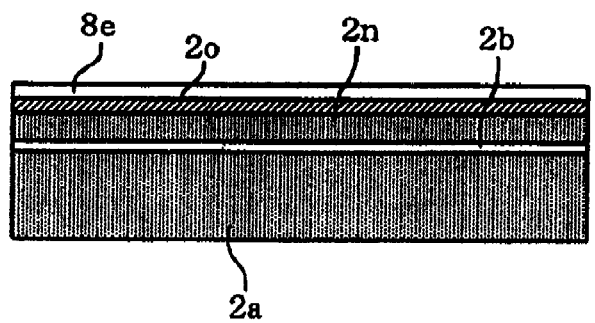
FIG. 19C is a sectional view showing the fabrication method of magnetic pins and conductive pins used in working example 2.
Figure 19D:
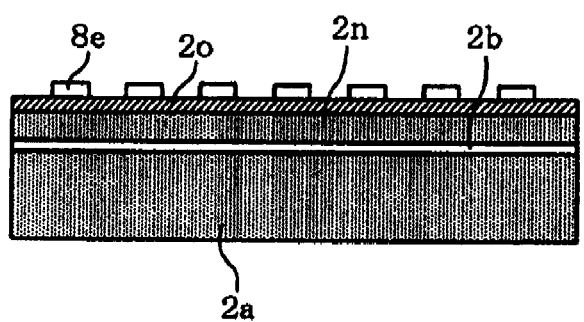
FIG. 19D is a sectional view showing the fabrication method of magnetic pins and conductive pins used in working example 2.
Figure 19E:
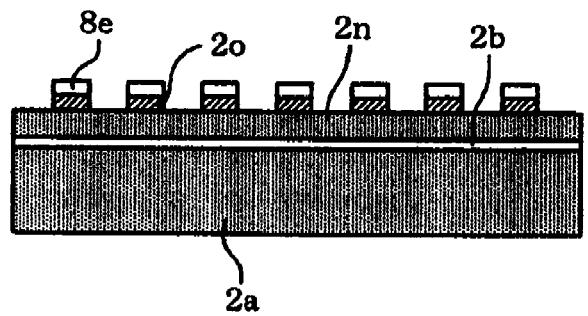
FIG. 19E is a sectional view showing the fabrication method of magnetic pins and conductive pins used in working example 2.
Figure 19F:
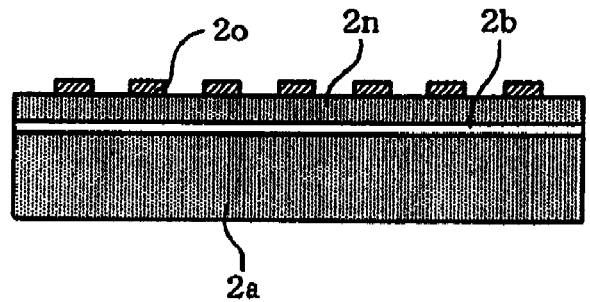
FIG. 19F is a sectional view showing the fabrication method of magnetic pins and conductive pins used in working example 2.
Figure 19G:
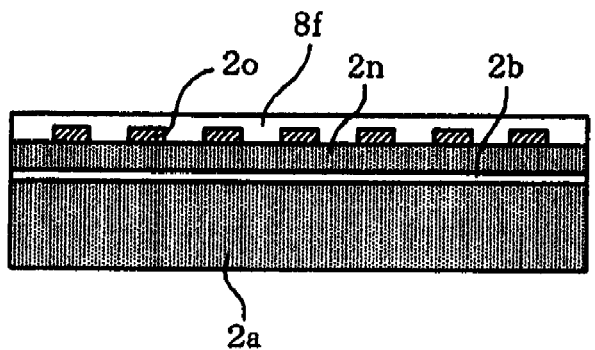
FIG. 19G is a sectional view showing the fabrication method of magnetic pins and conductive pins used in working example 2.
Figure 19H:
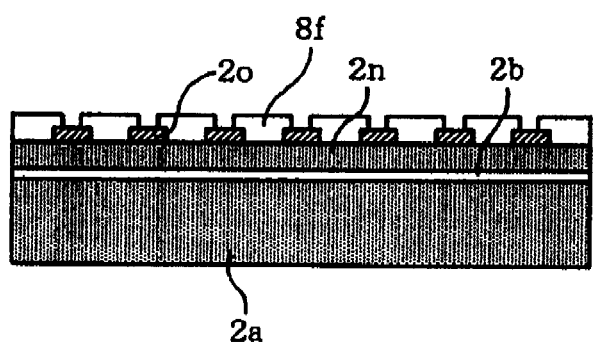
FIG. 19H is a sectional view showing the fabrication method of magnetic pins and conductive pins used in working example 2.
Figure 19I:
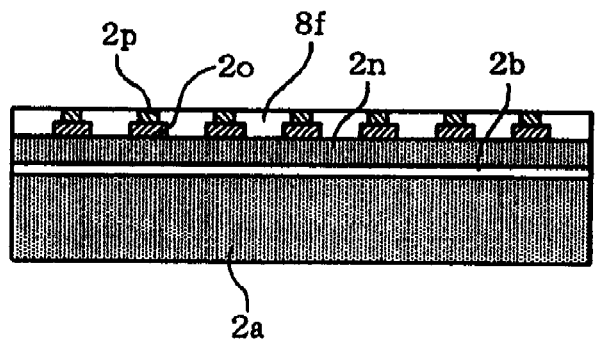
FIG. 19I is a sectional view showing the fabrication method of magnetic pins and conductive pins used in working example 2.
Figure 19J:
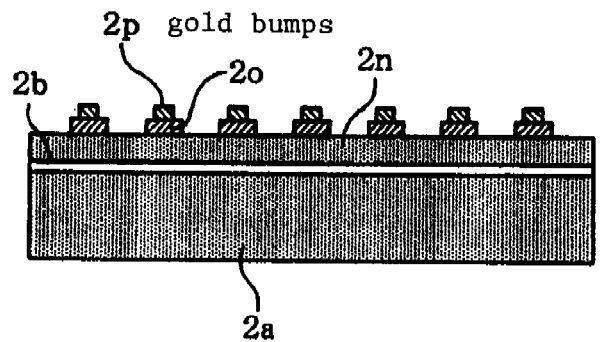
FIG. 19J is a sectional view showing the fabrication method of magnetic pins and conductive pins used in working example 2.
Figure 19K:
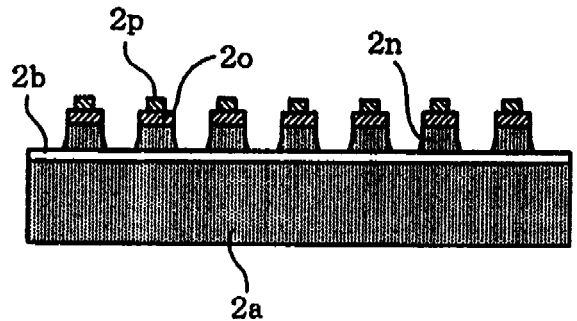
FIG. 19K is a sectional view showing the fabrication method of magnetic pins and conductive pins used in working example 2.
Figure 19L:
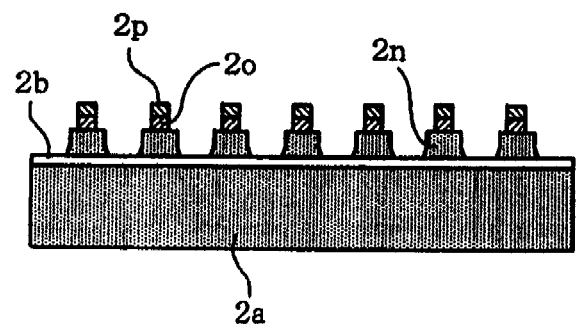
FIG. 19L is a sectional view showing the fabrication method of magnetic pins and conductive pins used in working example 2.
Figure 19M:
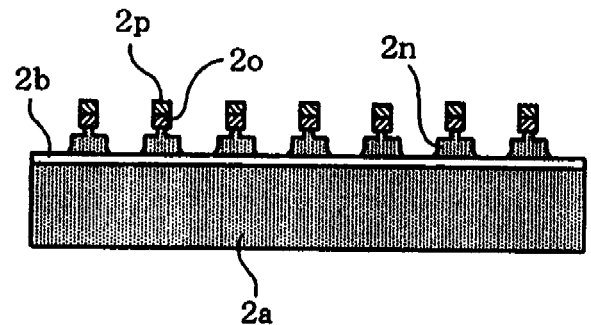
FIG. 19M is a sectional view showing the fabrication method of magnetic pins and conductive pins used in working example 2.
Figure 19N:
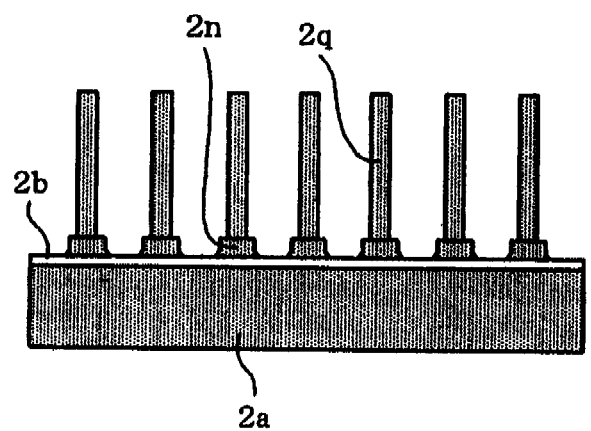
FIG. 19N is a sectional view showing the fabrication method of magnetic pins and conductive pins used in working example 2.
Figure 19O:
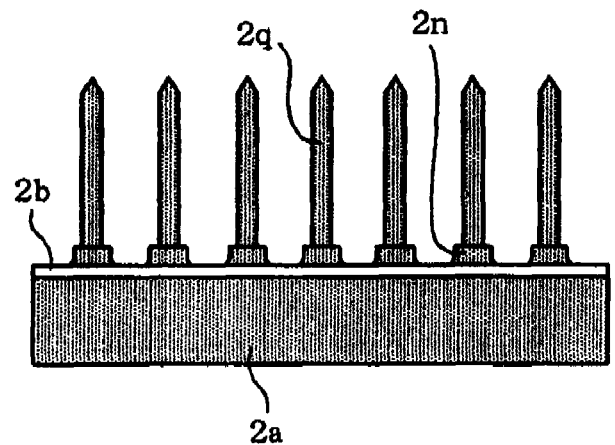
FIG. 19O is a sectional view showing the fabrication method of magnetic pins and conductive pins used in working example 2.
Figure 19P:
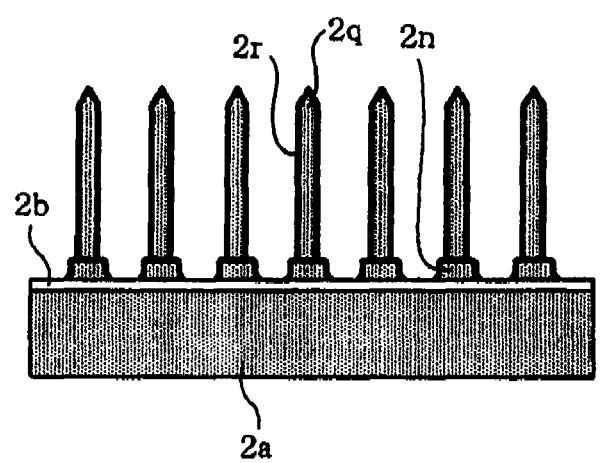
FIG. 19P is a sectional view showing the fabrication method of magnetic pins and conductive pins used in working example 2.
Figure 19Q:
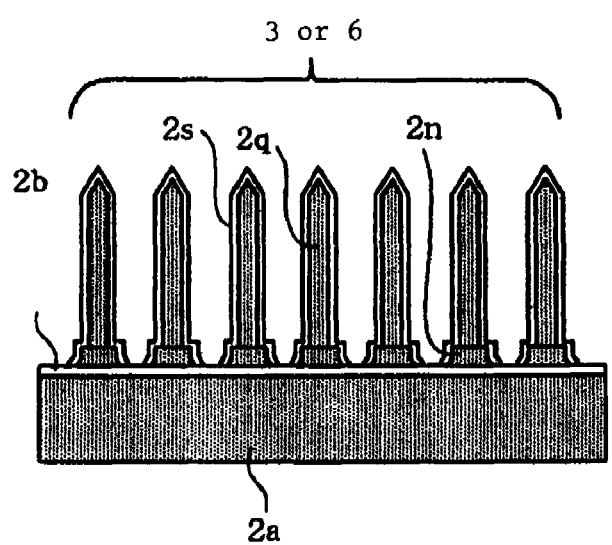
FIG. 19Q is a sectional view showing the fabrication method of magnetic pins and conductive pins used in working example 2.

Explanation next regards the method of fabricating an interposer that is used in the present working example with reference to the procedures shown in order in FIGS. 19A-19Q. First, as shown in FIG. 19A, an SOI substrate is prepared in which insulating film 2b composed of SiO2 and silicon layer 2n of single-crystal in which the principle surface is the (111) surface are formed on silicon substrate 2a.

The SOI technique may be a method in which an oxide area is formed directly below a single-crystal area by driving oxide ions into a single-crystal silicon substrate, or a method in which a heat treatment is used to adhere a single-crystal silicon substrate to the oxidized surface of a surface-oxidized single-crystal silicon support substrate. For the purpose of eliminating metal ions and organic materials of the SOI substrate, RCA washing is carried out, this being a wet washing method of a silicon substrate that takes as a basis ammonia-hydrogen peroxide washing and hydrochloric acid-hydrogen peroxide washing, following which gold film 2o is grown to a thickness of 0.03 μm on silicon layer 2n by an evaporation or sputtering method (FIG. 19B).

A resist is next applied to form resist film 8e on gold film 2o (FIG. 19C), following which rendering and development are carried out, and the resist film is then removed other than in the interconnect layer (including electrode pads and coils) and pin formation areas (FIG. 19D). Etching of gold film 2o is next carried out using resist film 8e as a mask (FIG. 19E), and after removing all of the resist film, IPA (Isopropyl Alcohol) washing is carried out (FIG. 19F).

A new resist is next applied to form resist film 8f to a height that surpasses that of gold film 2o (FIG. 19G), rendering and developing are carried out, and the resist film then removed from the pin formation areas (FIG. 19H). The depressions from which the resist film has been removed are then subjected to electroless plating to form gold bumps 2p to a thickness of 2 μm (FIG. 19I). Resist film 8f is next stripped off and IPA washing carried out (FIG. 19J). The process of forming gold bumps 2p and the process of etching gold film 2o shown in FIG. 19E may be carried out in the reverse order.

Isotropic etching using a mixture of hydrofluoric acid and nitric acid is next carried with gold film 2o as a mask to pattern silicon layer 2n, leaving the silicon layer in the interconnect layer and the pin formation areas (FIG. 19K), following which gold film 2o of portions other than directly below gold bumps 2p is removed by etching (FIG. 19L). A mixed solution of hydrofluoric acid, nitric acid, and acetic acid is next used to carry out isotropic etching using the gold bumps as masks to form mesa-shapes below the gold bumps (FIG. 19M).

In this state, heat is applied to 900° C. or more in a reactor and a mixed gas of hydrogen gas and silicon tetrachloride that are the raw materials is introduced. This process causes a gas-liquid interfacial reaction between the gold-silicon alloy melt and the gas, silicon is precipitated at the interface of the melt and the substrate, and single-crystal silicon grows in the perpendicular direction to form silicon core pins 2q. The tips of the pins following growth are in the shape in which the gold-silicon alloy layer was formed, and variation occurs in the height of the pins. A pin tip trimming process is carried out for the purpose of eliminating alloy portions and making the pin height uniform. More specifically, lapping sheet containing micro-abrasive particles is rotated, the pin tips are placed in contact perpendicularly with this sheet and thus subjected to the trimming procedure (FIG. 19N).

Further, the silicon core pins are placed in contact with the lapping sheet and force is applied in one planar direction to cause the pins to buckle and deform uniformly in one direction. In this state, the pin tips are formed in a pointed shape (FIG. 19O). Nickel base film 2r is selectively formed to a thickness of 0.5 μm by electroless plating on only portions in which silicon is exposed to give the silicon core pins and interconnect layer conductivity (FIG. 19P). Next, using electroless plating, permalloy (90% nickel and 10% iron alloy), which is a magnetic material, is formed to a thickness of 2 μm on the surface of nickel base film 2r, and Ni/Ni—Fe alloy-plated layer 2s, which is a magnetic film, is formed on the surface of the silicon core pins (FIG. 19Q).

Nickel base film 2r described above may also be a Ni—P base film, and a magnetite (Fe3O4) film or ferrite film may be formed in place of Ni/Ni—Fe alloy plated layer 2s. In addition, gold film can also be formed to a thickness of 0.5 µm-2 µm by electroless plating in appropriate locations of these films according to necessity. Interposer 2 that includes magnetic pins 3 and conductive pins 6 can thus be fabricated by the above-described steps.

Fabrication Method of Working Example 2

Explanation next regards the method of stacking LSI chips 1 on interposer 2 to fabricate the semiconductor device of working example 2 shown in FIG. 17 with reference to FIGS. 20A-20E.

Figure 20A:
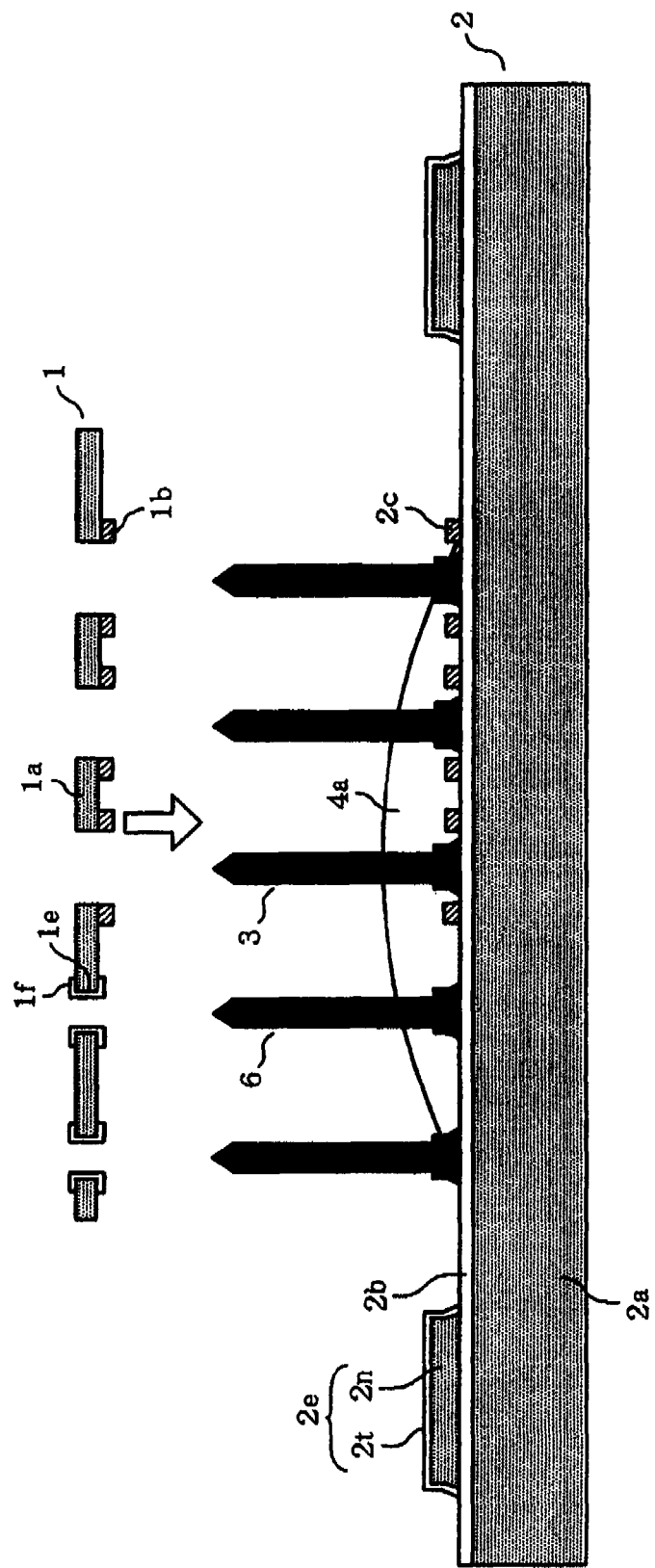
FIG. 20A is a sectional view showing the fabrication method of working example 2.
Figure 20B:
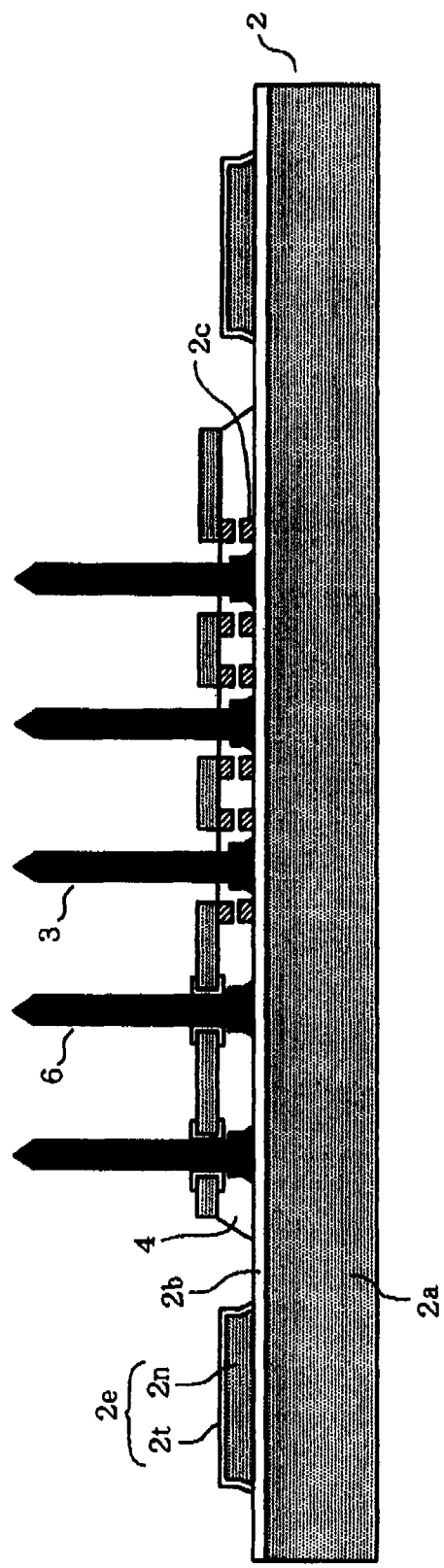
FIG. 20B is a sectional view showing the fabrication method of working example 2.

As shown in FIG. 20A, resin 4a (for example, a thermosetting epoxy resin) is applied in advance to the central portion of interposer 2 that includes magnetic pins 3 and conductive pins 6. In this state, LSI chip 1 in which signal coils 1b are formed around through-holes 1d and wall-surface conductive films 1e and lands 1f are formed at other through-holes is secured by vacuum suction by a tool of a chip mounting device, images of both through-holes in which wall-surface conductive films 1e are formed on the LSI chip and conductive pins 6 are captured by a camera, and positional adjustments are carried out (FIG. 20A). The LSI chip is next mounted and subjected to heat and pressure to seal and secure by means of resin 4 (FIG. 20B).

Figure 20C:
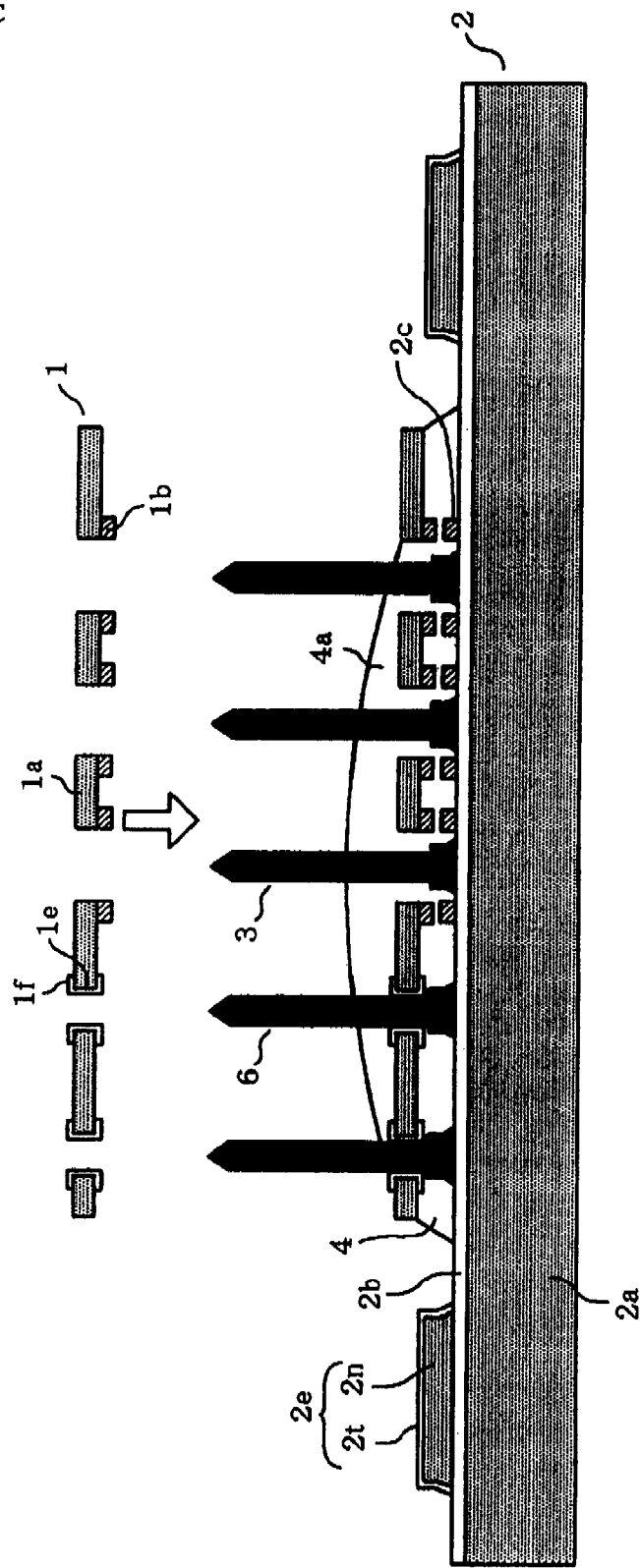
FIG. 20C is a sectional view showing the fabrication method of working example 2.
Figure 20D:
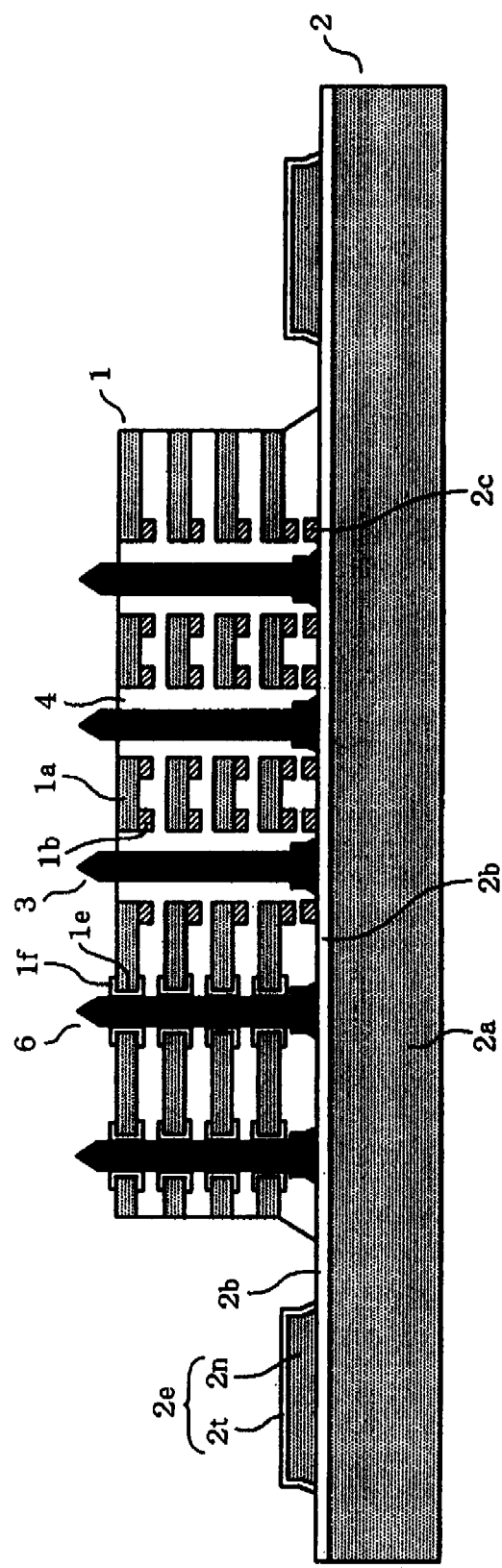
FIG. 20D is a sectional view showing the fabrication method of working example 2.

Resin 4a is next applied to the first LSI chip that has been mounted and positioning of the second LSI chip 1 carried out (FIG. 20C). Second LSI chip 1 is then mounted and subjected to heat and pressure to secure. These processes are repeated to fabricate a stacked construction of four LSI chips (FIG. 20D).

Figure 20E:
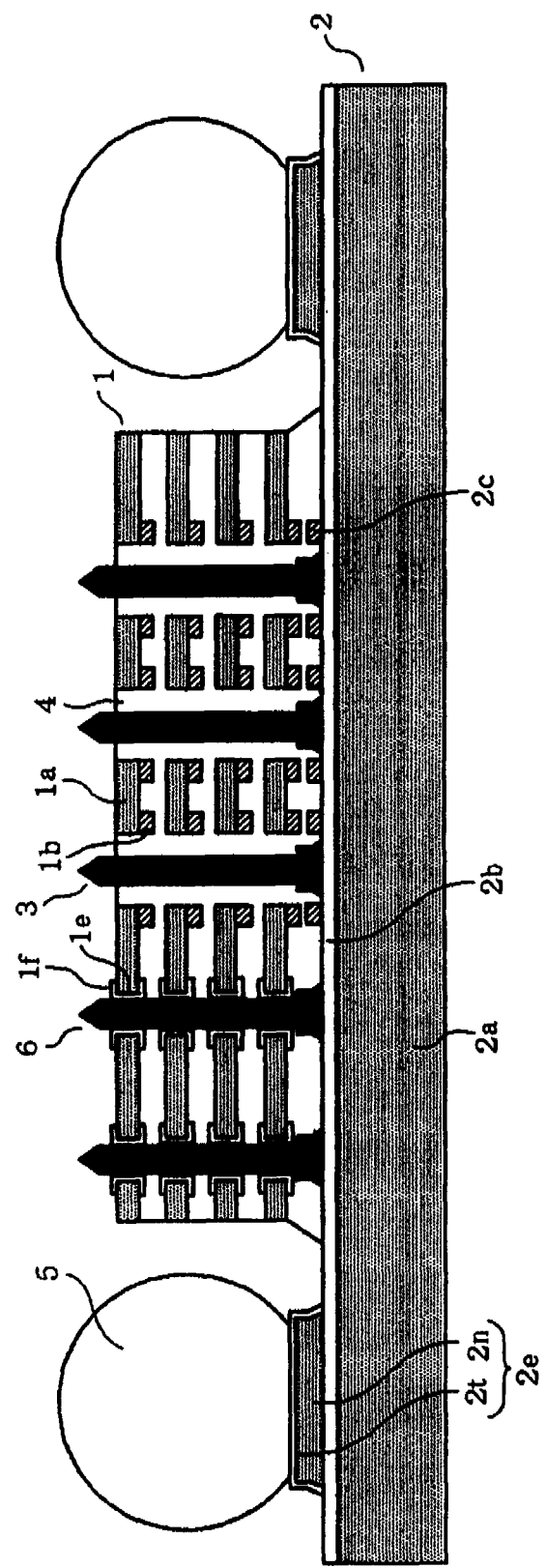
FIG. 20E is a sectional view showing the fabrication method of working example 2.

Flux is then supplied to electrode pads 2e realized by forming conductive plated layer 2t on silicon layer 2n, and solder balls 5 are then mounted and soldered onto electrode pads 2e by reflow (FIG. 20E). The semiconductor device of the present working example is fabricated by the above-described processes. In addition, when pins are arranged around the perimeter, the central portion of the LSI chip is held by the vacuum suction of a tool of a chip mounting device, and when the pins are arranged in an area array, the ends of the LSI chip are held by suction.

WORKING EXAMPLE 3

Figure 21A:
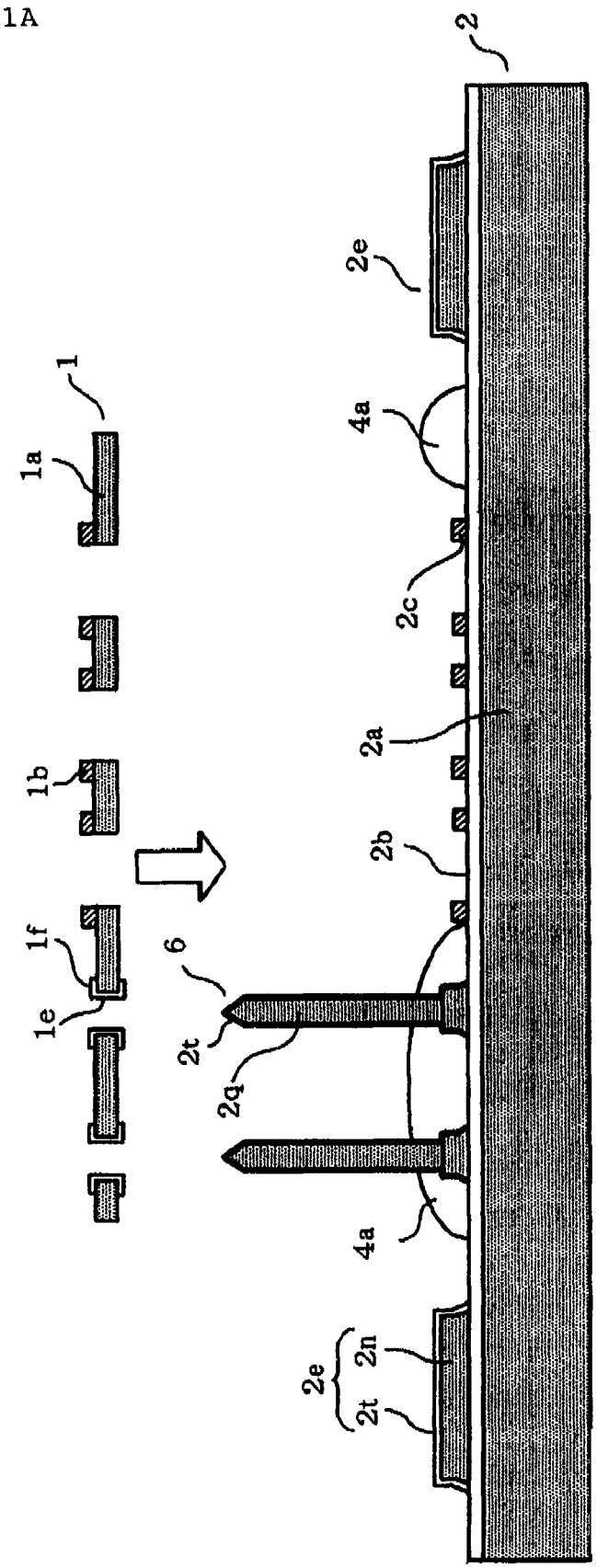
FIG. 21A is a sectional view showing the fabrication method of working example 3.
Figure 21B:
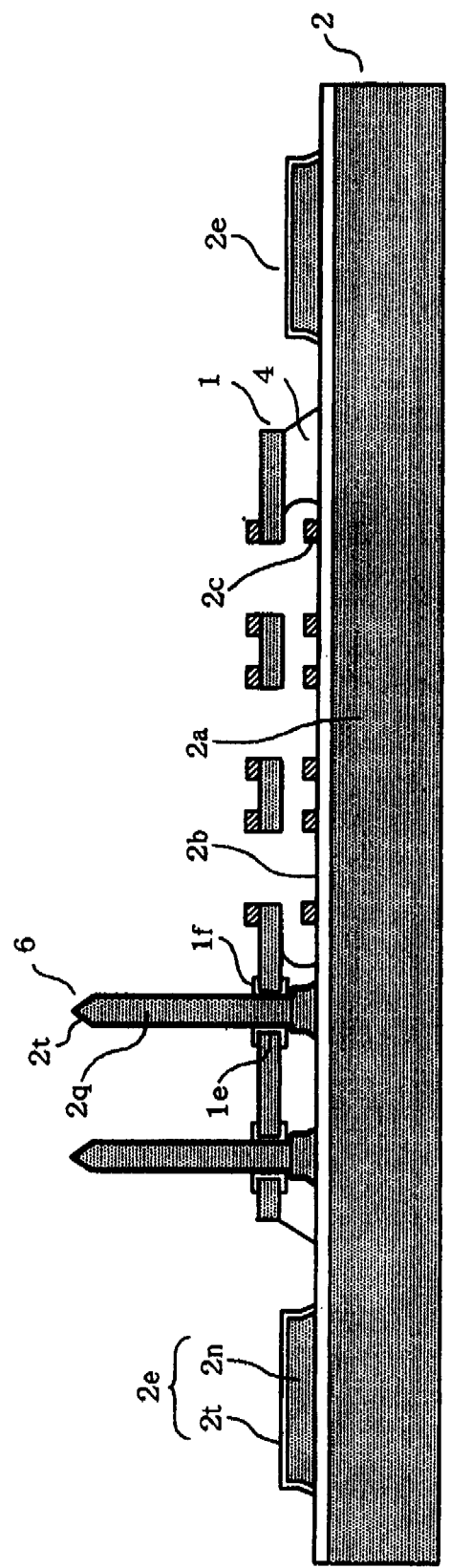
FIG. 21B is a sectional view showing the fabrication method of working example 3.
Figure 21C:
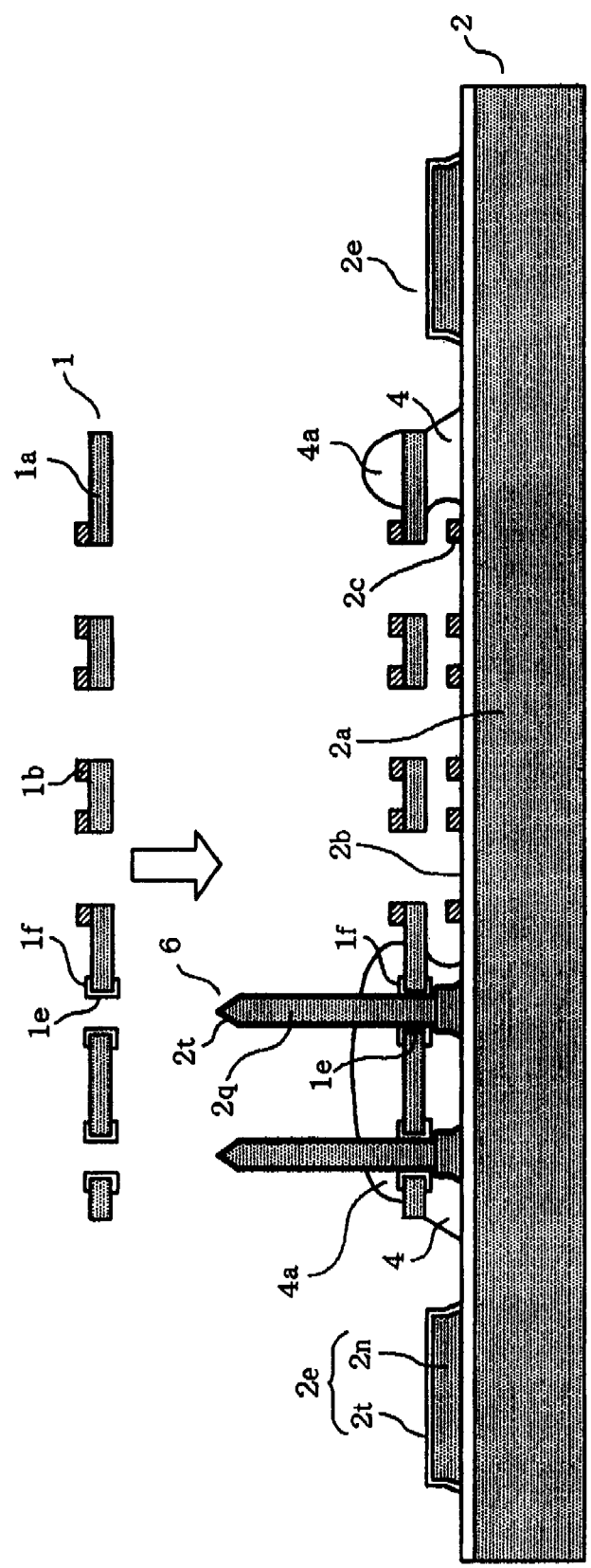
FIG. 21C is a sectional view showing the fabrication method of working example 3.
Figure 21D:
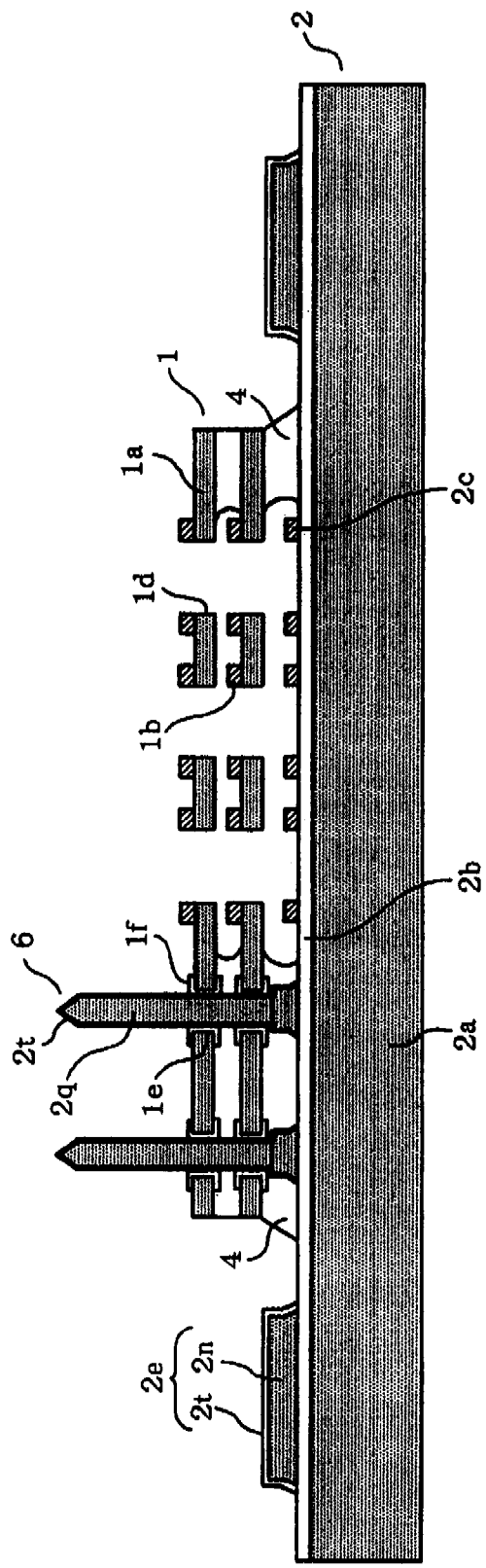
FIG. 21D is a sectional view showing the fabrication method of working example 3.
Figure 21E:
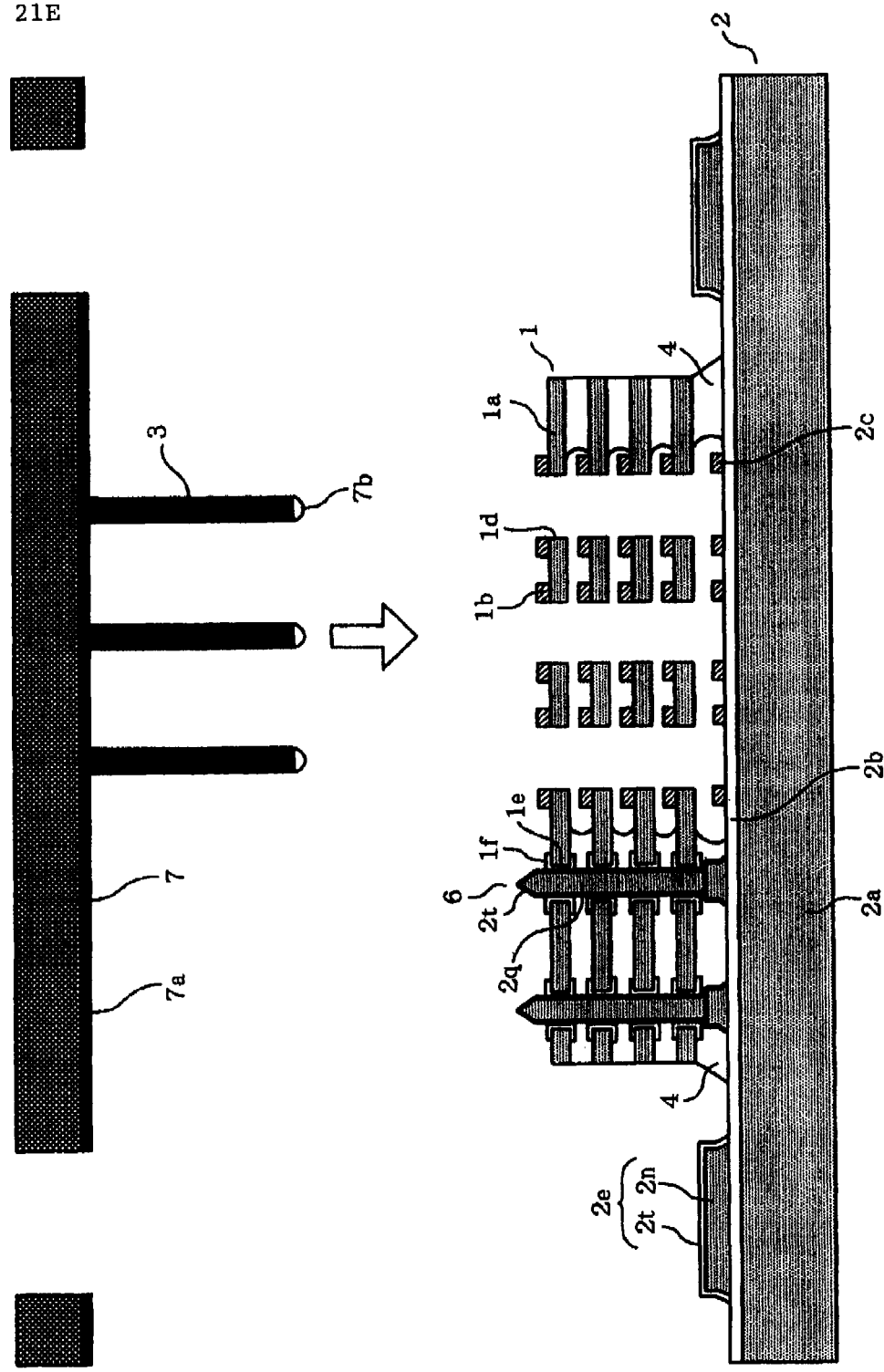
FIG. 21E is a sectional view showing the fabrication method of working example 3.
Figure 21F:
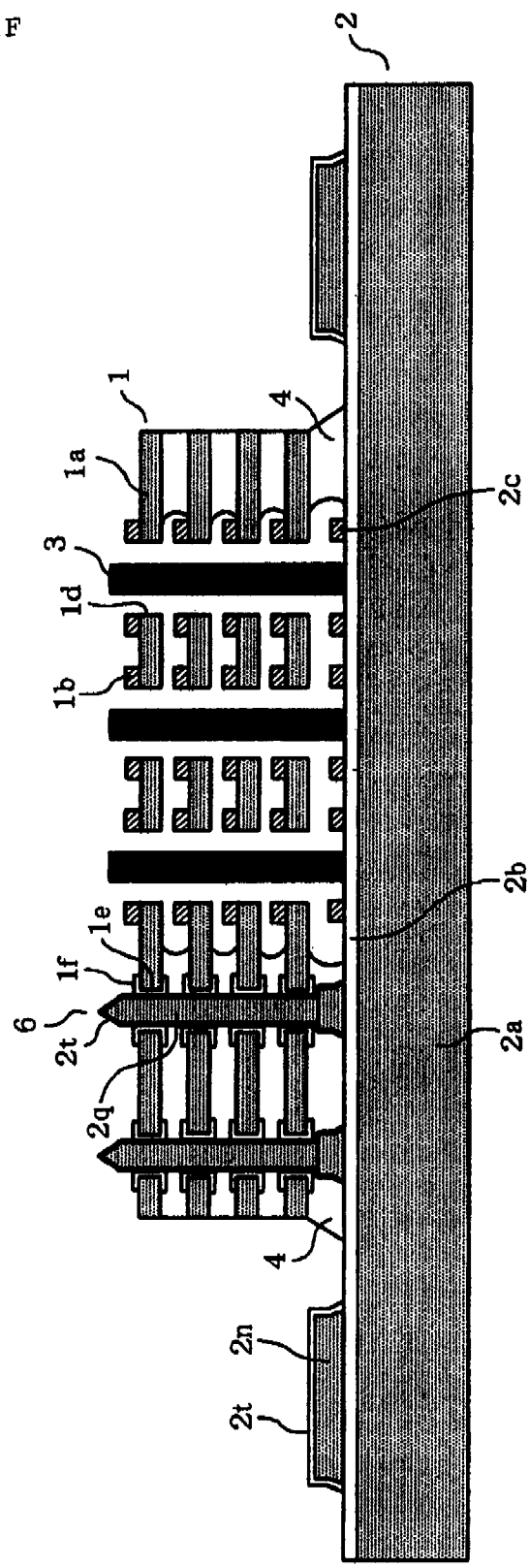
FIG. 21F is a sectional view showing the fabrication method of working example 3.
Figure 21G:
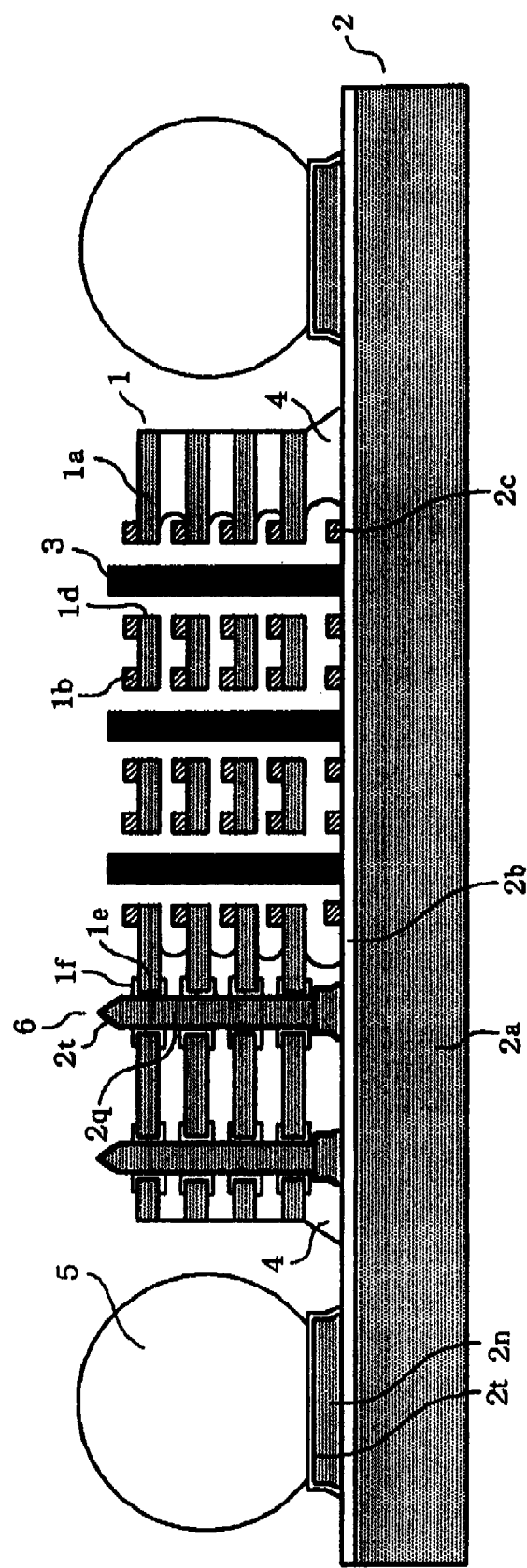
FIG. 21G is a sectional view showing the fabrication method of working example 3.

FIG. 21G is a sectional view showing the semiconductor device of working example 3, and FIGS. 21A-21F are sectional views showing states of intermediate stages of fabrication in the order of the procedure for explaining the method of fabricating working example 3.

As shown in FIG. 21G, working example 3 chiefly differs from working example 2 shown in FIG. 17 in the following three points: As the first point, in conductive pins 6 that are inserted for the purpose of power supply and grounding of the LSI chips, the outer circumference of silicon core pin 2q is covered not by a magnetic material, but rather, by conductive plated layer 2t in which the outermost surface is a gold layer having a thickness of 1 µm-5 µm. Forming the surface of conductive pin 6 by a gold plated layer can make the contact with wall-surface conductive film 1e of a through-hole of an LSI chip a gold-gold contact that has a proven record of reliability in, for example, switches of the related art, and can therefore achieve an improvement in the reliability of the contact state.

As the second point of difference, all magnetic pins 3 that are inserted in through-holes formed in the centers of signal coils 1b of an LSI chip are formed by a magnetic material, and the magnetic pins are secured in the centers of signal coils 2c of the interposer by means of an adhesive. Fabricating the pins themselves entirely from a magnetic material can bring about a stronger magnetic field and thus can achieve an improvement of the signal transmission quality.

As the third point of difference, resin is not present in areas into which magnetic pins 3 are inserted. Of course, in processing that follows the formation of the present construction, capillary flow in steps that follow stacking of LSI chips may cause resin to infiltrate the above-described areas in which resin is not present.

Fabrication Method of Working Example 3

Explanation next regards the method of stacking LSI chips with reference to FIGS. 21A-21G. As shown in FIG. 21A, interposer 2 is prepared that includes conductive pins 6 and in which interconnect layer (not shown), signal coils 2g, and electrode pads 2e have been formed. In the interposer of the present working example, conductive pins 6, the interconnect layer, signal coils 2g, and electrode pads 2e are all parts in which conductive plated layer 2t composed of Ni/Au-plated layers is formed on the surfaces of silicon core pins 2q or silicon layer 2n. Of the portions of this interposer in which the LSI chip is mounted, resin 4a (for example, a thermosetting epoxy resin) is applied to portions other than the formation sites of signal coils 2c. In this state, LSI chip 1 in which signal coils 1b are formed around through-holes 1d and wall-surface conductive films 1e and lands 1f are formed at other through-holes is secured by vacuum suction by a tool of a chip-mounting device, images of both through-holes in which wall-surface conductive films 1e have been formed on LSI chip 1 and conductive pins 6 are captured by a camera, and positional adjustments carried out, following which LSI chip 1 is mounted and subjected to heat and pressure to secure by means of resin film 4 (FIG. 21B).

Resin 4a is next applied onto first LSI chip 1 that has been mounted, and positioning of the second LSI chip 1 is carried out (FIG. 21C). Second LSI chip 1 is then mounted and subjected to heat and pressure to secure by means of resin 4 (FIG. 21D). A stacked structure of four LSI chips on interposer 3 is fabricated by repeating these processes.

Temporary substrate 7 on which magnetic pins 3 have been formed with seed layer 7a interposed is then secured by vacuum suction by a tool of a chip-mounting device, adhesive 7b is adhered to the ends of the magnetic pins by stamping, and the positions of electrode pads 2e of interposer 2 and through-holes formed in temporary substrate 7 are aligned (FIG. 21E). The end portions of the magnetic pins are then adhered and secured to the centers of signal coils 2c formed on the interposer, following which the seed layer is selectively etched to cut away upper temporary substrate 7 at the seed layer portion (FIG. 21F). Finally, flux is supplied to electrode pads 2e to mount solder balls 5 and solder balls 5 are then soldered onto electrode pads 2e by reflow (FIG. 21G).

WORKING EXAMPLE 4

Figure 22:
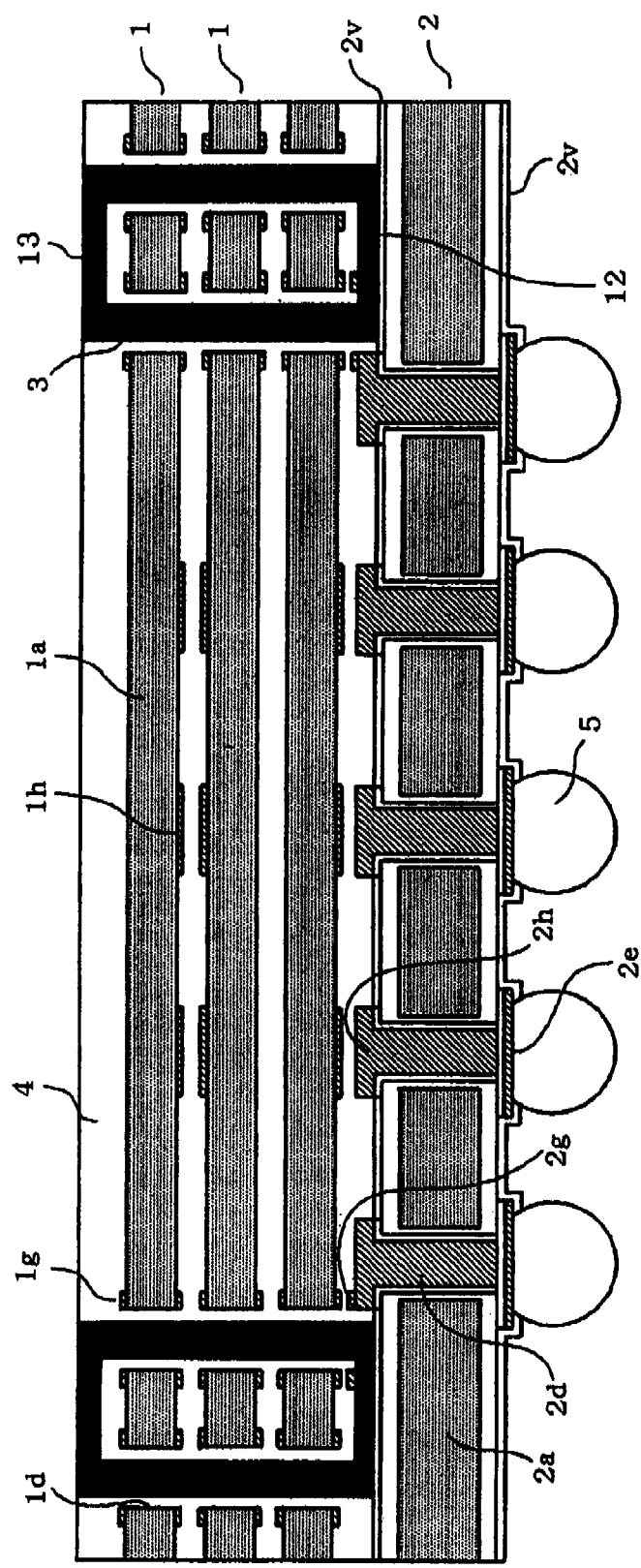
FIG. 22 is a sectional view showing working example 4.
Figure 23A:
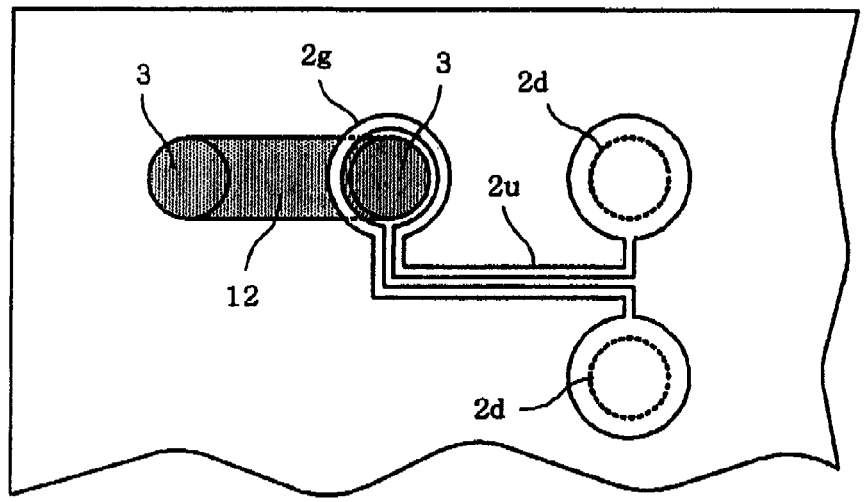
FIG. 23A is a schematic plan view showing the coil unit in the interposer in working example 4.
Figure 23B:
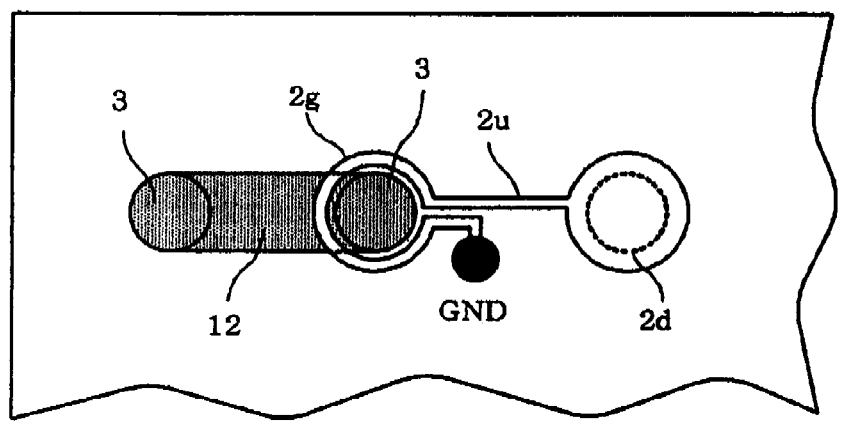
FIG. 23B is a schematic plan view showing the coil unit in the interposer in working example 4.
Figure 23C:
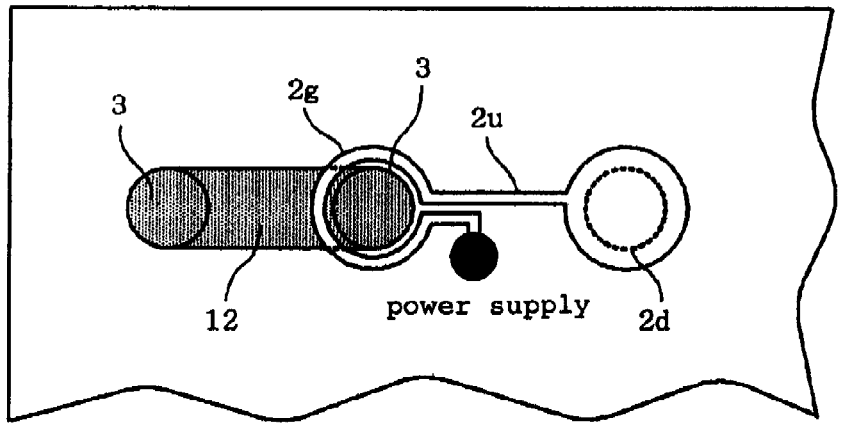
FIG. 23C is a schematic plan view showing the coil unit in the interposer in working example 4.

FIG. 22 is a sectional view showing the semiconductor device of working example 4, and FIGS. 23A-23C are schematic plan views showing the vicinity of coils of the interposer of working example 4. In the present working example, magnetic films 12 are provided on interposer 2, a pair of magnetic pins 3 is installed on each of magnetic films 12, and each pair of magnetic pins 3 is linked by magnetic film 13 at the tops of magnetic pins 3. In other words, a closed magnetic circuit is formed by a pair of magnetic pins and magnetic films 12 and 13. Signal capacitance electrodes 2h are formed on interposer 2 and signal capacitance electrodes 1h are formed on each LSI chip 1 whereby a configuration is realized in which the exchange of signals between LSI chips 1 and between interposer 2 and LSI chip 1 is carried out by way of these electrodes 1h and 2h.

In addition, power-supply coils 2g are formed around magnetic pins 3 on interposer 2, and on each LSI chip 1, power-supply coils 1g are formed on the obverse and reverse surfaces of the substrates around through-holes 1d into which magnetic pins 3 are inserted. As shown in FIG. 23A, power-supply coil 2g is connected to a pair of electrode pads (power-supply pad and ground pad) on the substrate reverse surface by way of lead interconnects 2u and through-conductors 2d. Instead of a configuration in which both ends of power-supply coils 2g are connected to electrode pads, a configuration may be adopted in which only one end of power-supply coil 2g is connected to the nearest electrode pad and the other end is connected to the ground interconnect as shown in FIG. 23B. However, this ground interconnect is connected to a ground electrode pad by way of through-conductor 2d in an area (not shown) of interposer 2.

Alternatively, opposite the configuration shown in FIG. 23B, a configuration may be adopted in which one end of power-supply coil 2g is connected to the nearest electrode pad and the other end is connected to the power-supply interconnect as shown in FIG. 23C. In this configuration as well, the power-supply interconnect is connected to a power-supply electrode pad by way of through-conductor 2d in an area (not shown) of interposer 2. In these power-supply interconnects and ground interconnects, the interconnect lengths between the coil and the through-conductor and between the pads and the through-conductors are preferably as short as possible to decrease loss that results from the length of interconnects and the interconnect widths are preferably made as thick as possible to decrease impedance.

In FIG. 22, a working example is shown in which capacitive coupling is used to exchange signals, but configurations are also possible that realize signal exchange using electromagnetic coupling by means of coils such as shown in FIG. 10 or that realize signal exchange using electromagnetic coupling by means of coils and magnetic pins such as shown in FIG. 9.

The working example shown in FIG. 22 and FIGS. 23A-23C shows a configuration in which the number of turns of power-supply coils 2g on interposer 2 and the number of turns of power-supply coils 1g on each LSI chip 1 are all one turn, but the present invention is not limited to this configuration. For example, different voltages can be supplied to each LSI chip 1 by making the number of turns of power-supply coil 2g n0 and then making the number of turns of power-supply coils 1g of each LSI chip 1 n1, n2, n3, and so on to arrange power-supply coils 1g and 2g each having a different number of turns. Similarly, a plurality of types of voltages can be supplied to one LSI chip 1 by arranging power-supply coils 1g having different numbers of turns on the same LSI chip 1. In this case, the voltage values that are supplied to LSI chips 1 are determined by the ratio between the number of turns n0 of power-supply coils 2g and the number of turns n1, n2, n3, and so on of power-supply coils 1g of each LSI chip 1.

Accordingly, adopting the above-described configuration eliminates the need for voltage converters such as DC/DC converters in a semiconductor device having circuits that require a plurality of types of power supplies and can realize a miniaturization of the device.

In the present working example, the magnetic path for power supply is formed in a loop and therefore enables a dramatic increase in power-supply efficiency compared to a case in which only magnetic pins are inserted. In addition, providing signal capacitance electrodes 1h on LSI chips to realize exchange of signals eliminates the need for the process of forming through-holes for signal transmission and the process of forming plated through-holes and can therefore achieve a reduction of fabrication costs. Further, in working example 1, electrical connections realized by contacts between conductive pins 6 and wall-surface conductive films 1e of through-holes are required for power supply and grounding, and accuracy of a fixed level is therefore necessary in the alignment of conductive pins and LSI chips, but the present working example can increase the tolerance in positional accuracy.

Fabrication Method of Working Example 4

Figure 24A:
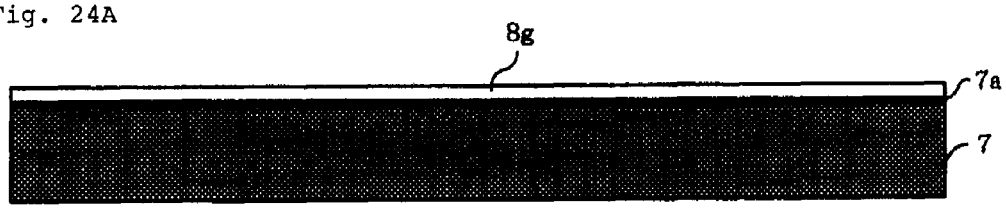
FIG. 24A is a sectional view showing the fabrication method of working example 4.
Figure 24B:
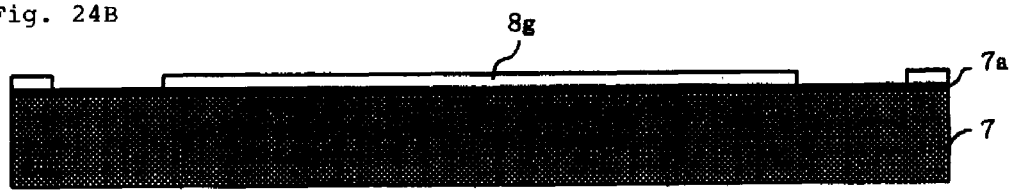
FIG. 24B is a sectional view showing the fabrication method of working example 4.
Figure 24C:
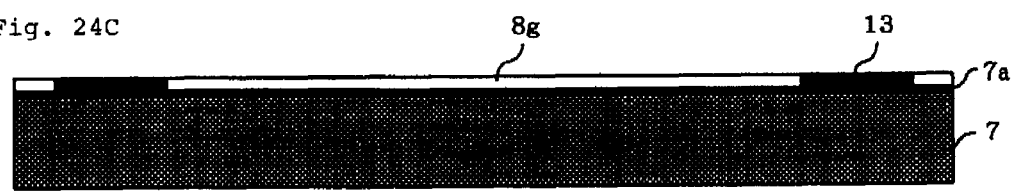
FIG. 24C is a sectional view showing the fabrication method of working example 4.
Figure 24D:
FIG. 24D is a sectional view showing the fabrication method of working example 4.
Figure 24E:
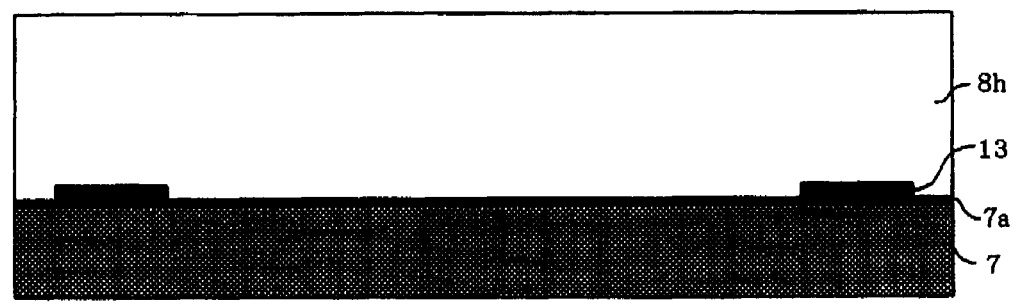
FIG. 24E is a sectional view showing the fabrication method of working example 4.
Figure 24F:
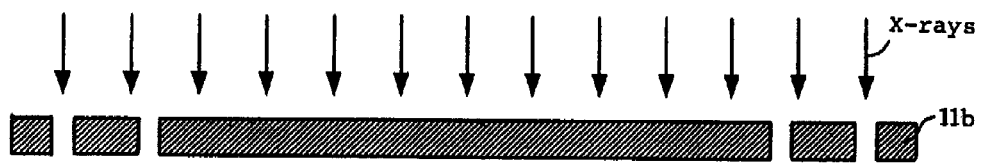
FIG. 24F is a sectional view showing the fabrication method of working example 4.
Figure 24G:
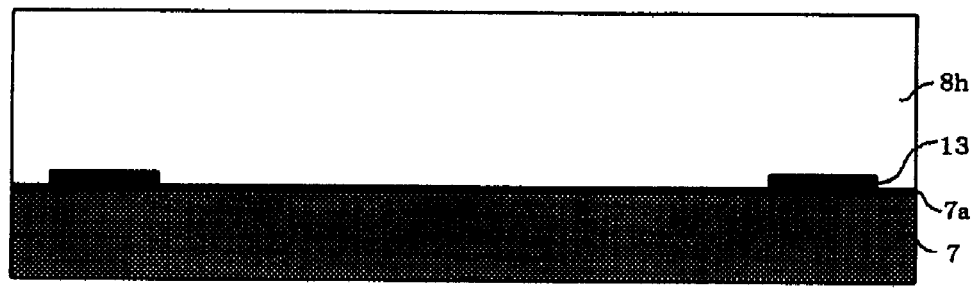
FIG. 24G is a sectional view showing the fabrication method of working example 4.
Figure 24H:
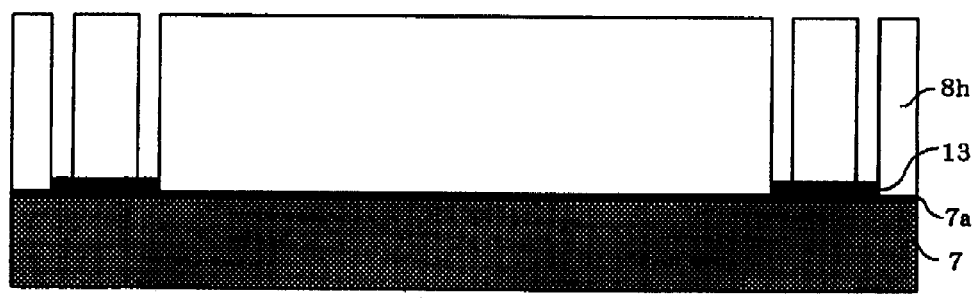
FIG. 24H is a sectional view showing the fabrication method of working example 4.
Figure 24I:
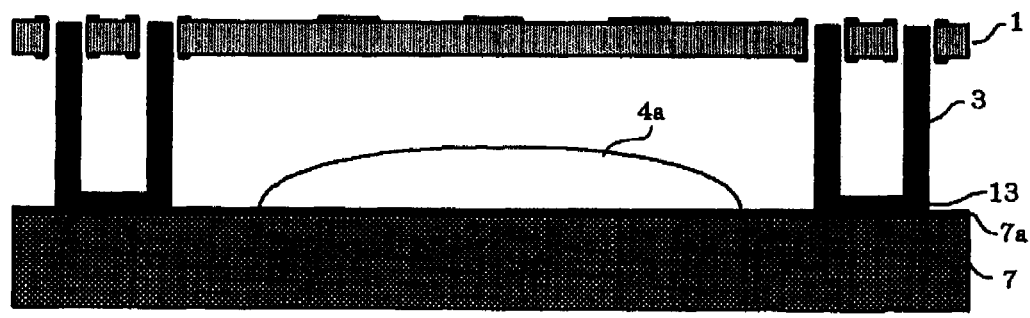
FIG. 24I is a sectional view showing the fabrication method of working example 4.
Figure 24J:
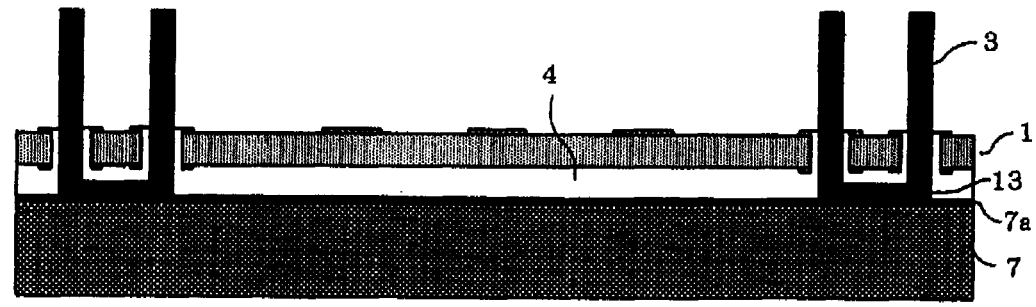
FIG. 24J is a sectional view showing the fabrication method of working example 4.
Figure 24K:
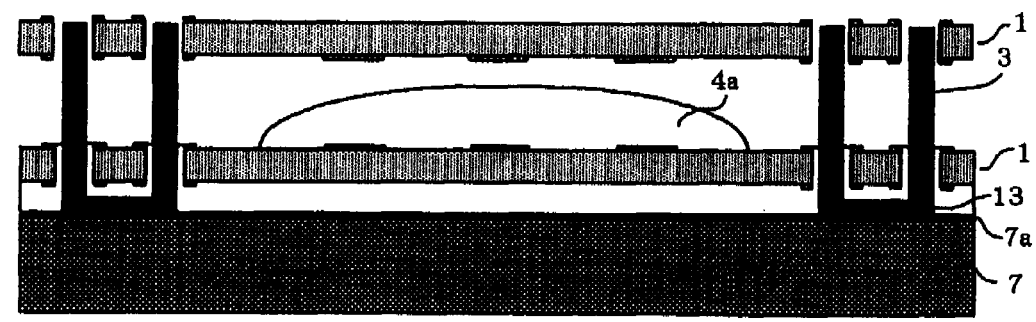
FIG. 24K is a sectional view showing the fabrication method of working example 4.
Figure 24L:
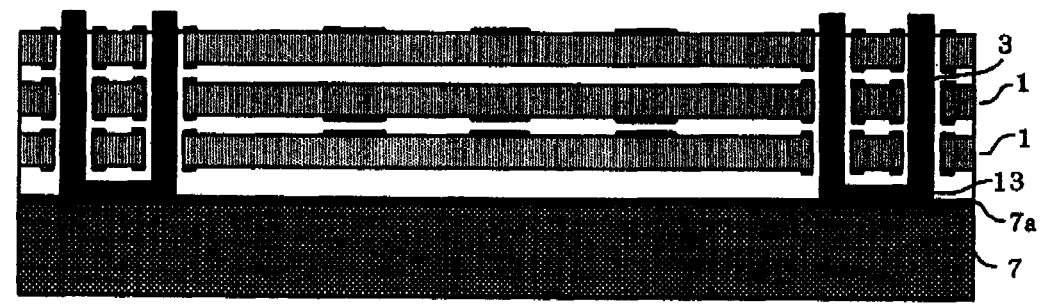
FIG. 24L is a sectional view showing the fabrication method of working example 4.
Figure 24M:
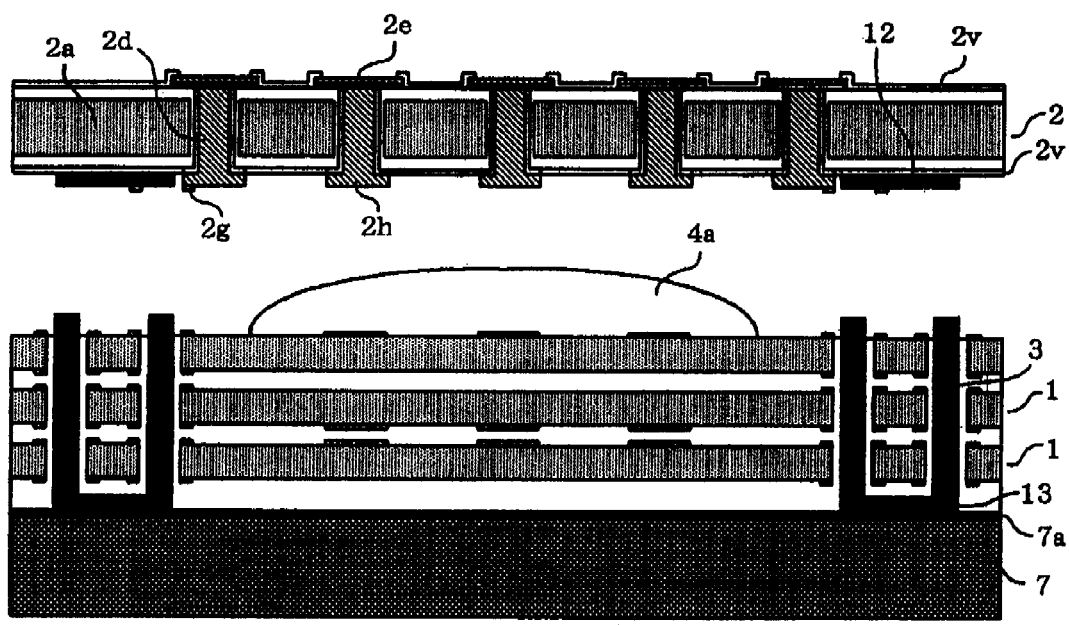
FIG. 24M is a sectional view showing the fabrication method of working example 4.
Figure 24N:
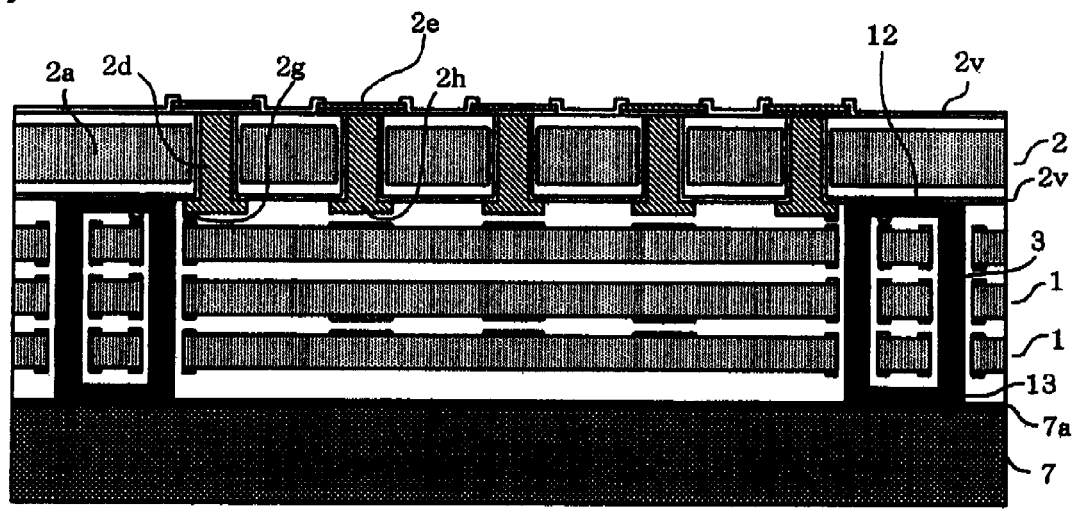
FIG. 24N is a sectional view showing the fabrication method of working example 4.
Figure 24O:
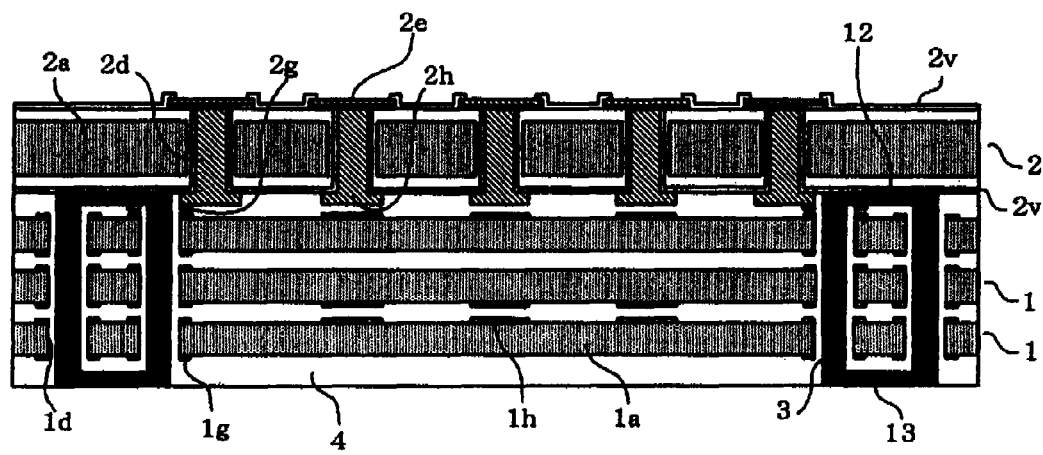
FIG. 24O is a sectional view showing the fabrication method of working example 4.
Figure 24P:
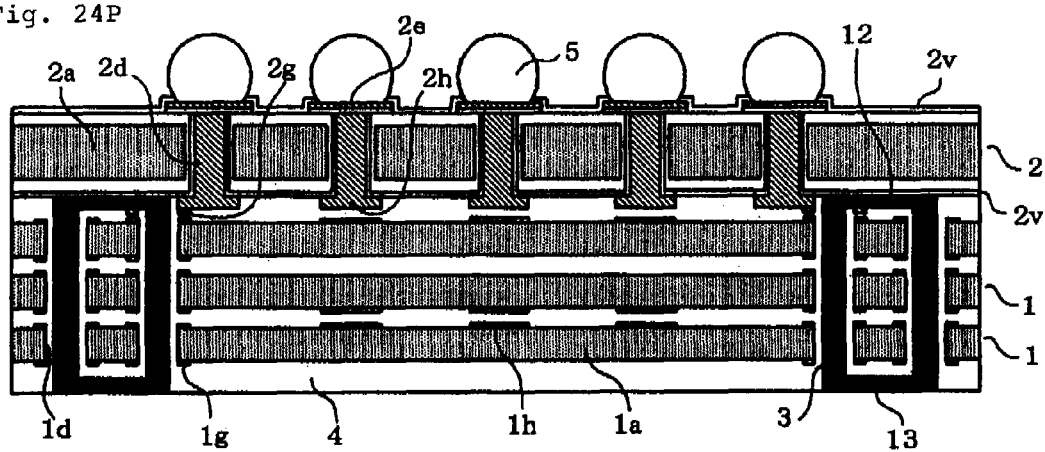
FIG. 24P is a sectional view showing the fabrication method of working example 4.

Explanation next regards the method of fabricating working example 4 with reference to FIGS. 24A-24P. Seed layer 7a is first formed on temporary substrate 7, and resist film 8g is then formed on this seed layer 7a (FIG. 24A). Resist film 8g is exposed and developed to remove the resist film of the magnetic film formation areas (24B). Magnetic film 13 is formed by electroplating (FIG. 24C). The resist film is stripped off and removed (FIG. 24D).

A new resist is applied to form resist film 8h to a film thickness greater than the desired height of magnetic pins (FIG. 24E). X-ray exposure by way of mask 11b is next carried out (FIG. 24F), following which development is carried out (FIG. 24G). Ni—Fe alloy (permalloy) is formed by electroplating to form magnetic pins 3 on seed layer 7a that was exposed by electroplating (FIG. 24H). Resist film 8h is removed by a stripping agent, and resin 4a (for example, a thermosetting epoxy resin) is applied to the central portion of temporary substrate 7. In this state, LSI chip 1 on which power-supply coils 1g are formed on the substrate obverse and reverse surfaces around through-holes and signal capacitance electrodes 1h have been formed on the circuit formation surface of the substrate is secured by vacuum suction by a tool of a chip-mounting device, images of both magnetic pins 3 and through-holes 1d on LSI chip 1 are captured by camera, positional adjustments carried out, and through-holes 1d of the LSI chip then passed over magnetic pins 3 (FIG. 24I). LSI chip 1 is then mounted on temporary substrate 7 and subjected to heat and pressure to seal and secure by means of resin 4 (FIG. 24J).

Resin 4a is next applied onto first LSI chip 1 that has been mounted, second LSI chip 1 then positioned, and through-holes 1d of the second LSI chip passed over magnetic pins 3 (FIG. 24K). Second LSI chip 1 is then mounted and secured by applying heat and pressure. A stacked construction of four LSI chips 1 on temporary substrate 7 is produced by repeating these processes (24L). Resin 4a is next applied onto uppermost LSI chip 1, and interposer 2 on which magnetic film 12 and power-supply coils 2g have been formed is positioned on the stacked LSI chip construction (FIG. 24M).

Interposer 2 is then mounted on the stacked LSI chip construction and secured by applying heat and pressure (FIG. 24N). Temporary substrate 7 is next stripped away and removed by etching seed layer 7a that is formed on temporary substrate 7 (FIG. 24O). Finally, flux is supplied to electrode pads 2e, and solder balls 5 are mounted and soldered onto electrode pads 2e by reflow (FIG. 24P). The semiconductor device of the present working example is thus fabricated by the above-described processes.

What is claimed is:

1. A semiconductor device in which a plurality of LSI chips are stacked and in which transmission of signals between said LSI chips is carried out by way of coils, wherein:
    through-holes are formed that pass through said LSI chips inside said coils of said LSI chips, and magnetic pins that contain a magnetic material are inserted into said through-holes.

2. A semiconductor device in which one or a plurality of stacked LSI chips are mounted on an interposer on which magnetic pins that contain a magnetic material are established perpendicular to the surface and on which coils are formed on the surface surrounding said magnetic pins; and on at least one of said LSI chips, coils are formed that are electromagnetically coupled with said coils that are formed on said interposer; wherein:

in the centers of said coils of said LSI chip, through-holes are formed that pass through said LSI chip; and said magnetic pins are inserted in these through-holes.

3. The semiconductor device according to claim 2, wherein said magnetic pins are established to pass through a plurality of said LSI chips.

4. The semiconductor device according to claim 2, wherein a portion of the plurality of said magnetic pins is established to pass through a portion of the plurality of said LSI chips that are stacked, and another portion of the plurality of said magnetic pins is established to pass through all of the plurality of said LSI chips.

5. The semiconductor device according to any one of claims 2 to 4, wherein said magnetic pins are used to carry out exchange of signals between said coils formed on said interposer and said coils formed on said LSI chips, or between said coils formed on said interposer and said coils formed on said LSI chips and between said coils formed on said LSI chips.

6. The semiconductor device according to any one of claims 2 to 4, wherein:

on said interposer, conductive pins in which at least the surface portions are formed by a conductive material and that are connected to power-supply lines are established perpendicular to the surface of said interposer; and said conductive pins are inserted into said through-holes formed in said LSI chips, and said conductive pins are electrically connected to power-supply lines formed on said LSI chips.

7. The semiconductor device according to claim 6, wherein:

wall-surface conductive films are formed on the inner wall surfaces of said through-holes of said LSI chips into which said conductive pins are inserted; and said wall-surface conductive films contact said conductive pins.

8. The semiconductor device according to claim 6, wherein:

conductive plates are established that cover said through-holes of said LSI chips into which said conductive pins are inserted, that have slits formed in a radiating form, and that connect to said power-supply lines formed on said LSI chips; wherein said conductive plates contact said conductive pins.

9. The semiconductor device according to claim 2, wherein power is supplied from said coils formed on said interposer to circuits formed on said LSI chips by way of said coils formed on said LSI chips.

10. The semiconductor device according to claim 2, wherein:

said magnetic pins are used to carry out exchange of signals between said coils formed on said interposer and said coils formed on said LSI chips, or between said coils formed on said interposer and said coils formed on said LSI chips and between said coils formed on said LSI chips; and said magnetic pins are used to supply power from said coils formed on said interposer to circuits formed on said LSI chips by way of said coils formed on said LSI chips.

11. The semiconductor device according to claim 9 or claim 10, wherein said coils for power supply are formed on obverse and reverse surfaces of said LSI chips.

12. The semiconductor device according to claim 9 or claim 10, wherein said coils for power supply are formed around two said magnetic pins established in proximity, and the two magnetic pins are magnetically coupled with magnetic films that are formed on each of said LSI chip that is stacked uppermost and said interposer.

13. The semiconductor device according to claim 9, wherein exchange of signals between circuits formed on said interposer and circuits formed on said LSI chips, or between circuits formed on said interposer and circuits formed on said LSI chips and between circuits formed on said LSI chips is carried out electromagnetically by way of coils for signal transmission formed on each of said interposer and said LSI chips.

14. The semiconductor device according to claim 9, wherein exchange of signals between circuits formed on said interposer and circuits formed on said LSI chips, or between circuits formed on said interposer and circuits formed on said LSI chips and between circuits formed on said LSI chips is carried out by capacitive coupling by way of electrodes for signal transmission formed on each of said interposer and said LSI chips.

15. The semiconductor device according to claim 2, wherein:

through-holes within which through-conductors are formed are formed on said interposer; and said coils formed on said interposer are connected to external connection terminals formed on the reverse surface by way of said through-conductors.

16. The semiconductor device according to claim 2, wherein: on the surface of said interposer on which said coils are formed, external connection terminals are formed that are connected to said coils.

17. The semiconductor device according to claim 2, wherein said magnetic pins are formed entirely from a magnetic material, or are realized by covering the surface of a semiconductor material with a magnetic material.

18. The semiconductor device according to claim 6, wherein said conductive pins are formed entirely from a magnetic material, or are of a construction by covering the surface of a semiconductor material with a magnetic material.

19. The semiconductor device according to claim 6, wherein said conductive pins are formed entirely from a magnetic material, or are realized by forming a conductive film on the surfaces of said magnetic pins that are realized by covering the surface of a semiconductor material with a magnetic material.

* * * * *